US009177999B2

(12) United States Patent
Sasago et al.

(10) Patent No.: US 9,177,999 B2
(45) Date of Patent: Nov. 3, 2015

(54) NON-VOLATILE MEMORY DEVICE AND PRODUCTION METHOD THEREOF

(71) Applicant: Hitachi, Ltd., Chiyoda-ku, Tokyo (JP)

(72) Inventors: Yoshitaka Sasago, Tachikawa (JP); Masaharu Kinoshita, Tsukuba (JP); Takahiro Morikawa, Tsukuba (JP); Akio Shima, Hino (JP); Takashi Kobayashi, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/506,661

(22) Filed: Oct. 5, 2014

(65) Prior Publication Data

US 2015/0118804 A1 Apr. 30, 2015

Related U.S. Application Data

(62) Division of application No. 13/884,331, filed as application No. PCT/JP2010/070769 on Nov. 22, 2010, now Pat. No. 8,866,123.

(51) Int. Cl.
*H01L 21/00* (2006.01)
*H01L 27/24* (2006.01)
(Continued)

(52) U.S. Cl.
CPC .......... *H01L 27/2436* (2013.01); *H01L 27/249* (2013.01); *H01L 27/2454* (2013.01); *H01L 29/66833* (2013.01); *H01L 29/7926* (2013.01); *H01L 45/06* (2013.01); *H01L 45/1233* (2013.01); *H01L 45/144* (2013.01); *H01L 45/1608* (2013.01); *H01L 45/1616* (2013.01); *H01L 45/1683* (2013.01); *H01L 27/1157* (2013.01); *H01L 27/11582* (2013.01)

(58) Field of Classification Search
USPC ......................................................... 438/155
See application file for complete search history.

(56) References Cited

U.S. PATENT DOCUMENTS 6,650,567 B1 11/2003 Cho et al.
2007/0158736 A1 7/2007 Arai et al.
(Continued)

FOREIGN PATENT DOCUMENTS

JP 02-074069 A 3/1990
JP 06-325580 A 11/1994
(Continued)

OTHER PUBLICATIONS

Katsumata, Ryota, et al., "Pipe-shaped BiCS Flash Memory with 16 Stacked Layers and Multi-Level-Cell Operation for Ultra High Density Storage Devices", 2009 Symposium on VLSI Technology Digest of Technical Papers (2009), pp. 136-137, Japan.
(Continued)

*Primary Examiner* — Timor Karimy
(74) *Attorney, Agent, or Firm* — Miles & Stockbridge P.C.

(57) ABSTRACT

A vertical chain memory includes two-layer select transistors having first select transistors which are vertical transistors arranged in a matrix, and second select transistors which are vertical transistors formed on the respective first select transistors, and a plurality of memory cells connected in series on the two-layer select transistors. With this configuration, the adjacent select transistors are prevented from being selected by respective shared gates, the plurality of two-layer select transistors can be selected, independently, and a storage capacity of a non-volatile storage device is prevented from being reduced.

8 Claims, 36 Drawing Sheets

(51) Int. Cl.
*H01L 45/00* (2006.01)
*H01L 29/66* (2006.01)
*H01L 29/792* (2006.01)
*H01L 27/115* (2006.01)

(56) References Cited

U.S. PATENT DOCUMENTS

2008/0149913 A1 6/2008 Tanaka et al.
2008/0175032 A1 7/2008 Tanaka et al.
2008/0315296 A1 12/2008 Tanaka et al.
2010/0182828 A1 7/2010 Shima et al.

FOREIGN PATENT DOCUMENTS

| JP | 2007-180389 A | 7/2007 |
| JP | 2008-160004 A | 7/2008 |
| JP | 2008-181978 A | 8/2008 |
| JP | 2009-004517 A | 1/2009 |
| JP | 2010-165982 A | 7/2010 |

OTHER PUBLICATIONS

Office Action dated Sep. 17, 2013, in Japanese Patent Application No. 2012-545542.

NON-VOLATILE MEMORY DEVICE AND PRODUCTION METHOD THEREOF

TECHNICAL FIELD

This invention relates to a non-volatile memory device and a production method thereof, and more particularly to a technique effectively applied to an electrically rewritable non-volatile memory and a manufacture thereof.

BACKGROUND ART

Up to now, a memory cell array of a flash memory is two-dimensionally formed on a surface of a semiconductor substrate to perform miniaturization and multi-levelization, thereby advancing an increase in capacity and a reduction in costs. However, in recent years, because flash memories approach the limit of the miniaturization, a memory with a novel structure is required for the purpose of further promoting the increase in the capacity and the reduction in the costs in the future. A three-dimensional memory cell array is expected to continue the increase in the capacity and the reduction in the costs even after having reached the miniaturization, and is actively being researched at present. For example, NPL 1 discloses a technique of three-dimensionally integrating NAND flash memories together, that is, a technique in which a plurality of through-holes that penetrates through all layers of a stacked structure in which gate electrode material and insulator films are alternately stacked in plural number together is formed by batch processing, and a charge trap film and a channel layer are formed and processed inside of the through-holes to form memory cells.

PTL 1 (JP-2008-160004) discloses a technique in which resistance random access memories are three-dimensionally integrated together, that is, a plurality of through-holes that penetrates through all layers of a stacked structure in which gate electrode material and insulator films are alternately stacked in plural number together is formed by batch processing, and a gate insulator film, a channel layer, and a variable resistance material layer are formed and processed inside of the through-holes to form the memory cells.

Also, PTL 2 (JP-A-2008-181978) discloses a technique in which a stacked film in which electrode material and insulator films are alternately stacked in plural number together is formed between lines orthogonal to each other in a cross point memory, a plurality of through-holes that penetrates through all layers of the stacked film is formed by batch processing, and thereafter a selective device material, a memory material and vertical lines are formed inside of the through-holes to form the memory cells.

In the memory cell arrays of NPL 1, and PTL 1 and PTL 2, since an increase in the number of processes is small even if the number of stacks is increased to provide the larger capacity, those memory cell arrays are suitable for the cost reduction. On the other hand, a memory cell size of a silicon substrate projection plane is $6 \times F^2$ (F is a minimum feature size), which is larger than $4 \times F^2$ of the two-dimensional flash memory formed on the silicon substrate. This is because select transistors necessary to select the individual memory cells from the three-dimensionally integrated memory cell array for operation need to be of a structure including a channel layer formed in a hole opened in a sidewall of a stripe-shaped gate electrode, and for that reason, an area of $6 \times F^2$ is necessary. PTL 3 (JP-A-2009-4517) discloses a technique in which the number of processes is increased to bring the select transistors into a double layer structure, and the memory cell size of the silicon substrate projection plane is set to $4 \times F^2$.

PTL 4 (JP-A-2007-180389) discloses a technique in which, in the flash memory, as a way of processing the stacked film in which the gate electrode material and the insulator films are alternately stacked in plural number together, not the through-holes are opened, but stripe-shaped grooves are formed in the stacked film, and the charge trap film and the channel film are formed and processed inside of the grooves to form the memory cells.

The variable resistance memory of the above PTL 1 is researched as a memory more suitable for miniaturization than the flash memory, and as one example of the variable resistance memory, a phase change memory using a chalcogenide material for a recording material is actively researched. A memory structure of the phase change memory is that the recording material is sandwiched between metal electrodes. The phase change memory represents a variable resistance memory that stores information with the use of a fact that the recording material between the electrodes has a different resistance state.

The phase change memory stores information with the use of a fact that a resistivity of the phase change material such as $Ge_2$, $Sb_2$, or $Te_5$ is different between an amorphous state and a crystal state. The phase change material is high in resistance in the amorphous state, and low in the resistance in the crystal state. Accordingly, read is conducted by giving a voltage difference to both ends of an element, measuring a current flowing in the element, and discriminating a high resistance state and a low resistance state of the element.

In the phase change memory, an electric resistance of the phase change film is changed into a different state by a Joule heat generated by a current to program. Reset operation, that is, the operation of changing the phase change material into the amorphous state of the high resistance is conducted by rapidly decreasing the current and rapidly cooling the phase change material after a large current has been allowed to flow in a short time to fuse the phase change material. On the other hand, set operation, that is, the operation of changing the phase change material into the crystal state of the low resistance is conducted by allowing a sufficient current to keep a crystallization temperature of the phase change material to flow for a long time. The phase change memory suits for miniaturization in principle because a current necessary to change the state of the phase change film becomes small as the miniaturization is advanced, and actively researched at present.

CITATION LIST

Patent Literature

PTL 1: JP-A-2008-160004
PTL 2: JP-A-2008-181978
PTL 3: JP-A-2009-4517
PTL 4: JP-A-2007-180389

Non-Patent Literature

NPL 1: "2009 Symposium on VLSI Technology", (Japan), 2009, p. 136 to 137

SUMMARY OF INVENTION

Technical Problem

However, the select transistor and the memory cells discloses in NPL 1 and PTL 1 to PTL 4 suffer from the following problems.

A first problem resides in that in a memory portion and a select transistor portion, after the through-holes have been formed in advance, a memory layer (a phase change film), the channel layer, and so on are formed. With the through-holes thus formed in advance, the memory layer and the channel layer are formed toward centers of the through-holes in the memory portion, and the gate insulator film, the channel layer, and so on are formed toward the centers of the through-holes in the select transistor portion. When the miniaturization is advanced, the through-holes become small, and the thickness of the memory layer, the channel layer, and the gate insulator film becomes thick relative to the size of the through-holes. As a result, it is conceivable that the through-holes clog, and the memory layer, the channel layer, and so on cannot be formed therein. In this event, the through-holes need to be enlarged. However, in this case, there is a need to enlarge the through-holes in both of two directions (longitudinal direction and lateral direction) orthogonal to each other in direction along a main surface of the semiconductor substrate, and the minimum feature size cannot be maintained in both of those directions. As a result, the memory cells cannot be downsized.

A second problem resides in that when the charge trap film and the channel layer are formed and processed inside of the stripe-shaped grooves formed in the stacked film in which the gate electrode material and the insulator films are alternately stacked in plural number together to form the memory cells as in PTL 4, the channel layers on both sides of the gate in each layer, which is processed into the stripe shape, are selected or unselected at the same time. For that reason, the elements formed on both sides of the gate cannot operate, independently, and the capacity is reduced.

An object of this invention is to increase a storage capacity of a non-volatile storage device.

The above object and novel features of this invention will become apparent from the description of the present specification and the attached drawings.

Solution to Problem

An outline of typical features in the invention disclosed in the present application will be described in brief as follows.

According to this invention, there is provided a non-volatile storage device, including:
a first conductive layer formed on a semiconductor substrate;
a first semiconductor layer formed on the first conductive layer;
a first line formed on a sidewall of the first semiconductor layer through a first insulator film, and extended in a first direction along a main surface of the semiconductor substrate;
a second semiconductor layer formed on the first semiconductor layer;
a second line formed on a sidewall of the second semiconductor layer through a second insulator film, and extended in the first direction;
a plurality of stacked films having a plurality of third insulator films and a plurality of third lines alternately stacked together, aligned in a second direction orthogonal to the first direction, and extended in the first direction;
a first memory material layer and a third semiconductor layer stacked on one of facing sidewalls of the plurality of adjacent stacked films, and a second memory material layer and a fourth semiconductor layer stacked on the other of the facing sidewalls of the plurality of stacked films; and
a plurality of second conductive layers formed on the stacked films and extended in the second direction,
wherein the first conductive layer and the second conductive layers are connected in series through the first semiconductor layer, the second semiconductor layer, and the third semiconductor layer, and
wherein the first conductive layer and the second conductive layers are connected in series through the first semiconductor layer, the second semiconductor layer, and the fourth semiconductor layer.

Also, according to this invention, there is provided a method of producing a non-volatile storage device, including the steps of:
(a) forming, on the first conductive layer formed on a semiconductor substrate, a first select transistor including a first channel layer electrically connected to the first conductive layer, and a first gate line formed on a sidewall of the first channel layer through a first insulator film, and extended in a first direction along a main surface of the semiconductor substrate;
(b) forming, on the first channel layer, a second select transistor including a second channel layer electrically connected to the first channel layer, and a second gate line formed on a sidewall of the second channel layer through a second insulator film, and extended in the first direction;
(c) forming a first stacked film on the second select transistor by alternately stacking (N+1) (N is an integer of N≥1) third insulator films and the N first semiconductor layers;
(d) forming a plurality of first patterns aligned in a second direction orthogonal to the first direction and extended in the first direction by processing the first stacked film;
(e) forming a third channel layer and a memory material layer which are electrically connected to the second channel layer through a fourth insulting film on the respective sidewalls of the plurality of first patterns;
(f) exposing an upper surface of the third channel layer after a fifth insulator film is embedded between the plurality of adjacent first patterns; and
(g) after the (f) step, forming, on the third channel layer, a plurality of lines electrically connected to the third channel layer, aligned in the first direction, and extending in the second direction, and then removing the third channel layer immediately below a region between the plurality of adjacent lines.

Advantageous Effects

Advantageous effects obtained by the typical features of the invention disclosed in the present application will be described in brief below.

According to this invention, the storage capacity of the non-volatile storage device can be increased.

BRIEF DESCRIPTION OF DRAWINGS

FIG. 5($b$) is a broken top view illustrating the vertical chain memory illustrated in FIG. 4.

DESCRIPTION OF EMBODIMENTS

Figure 1:
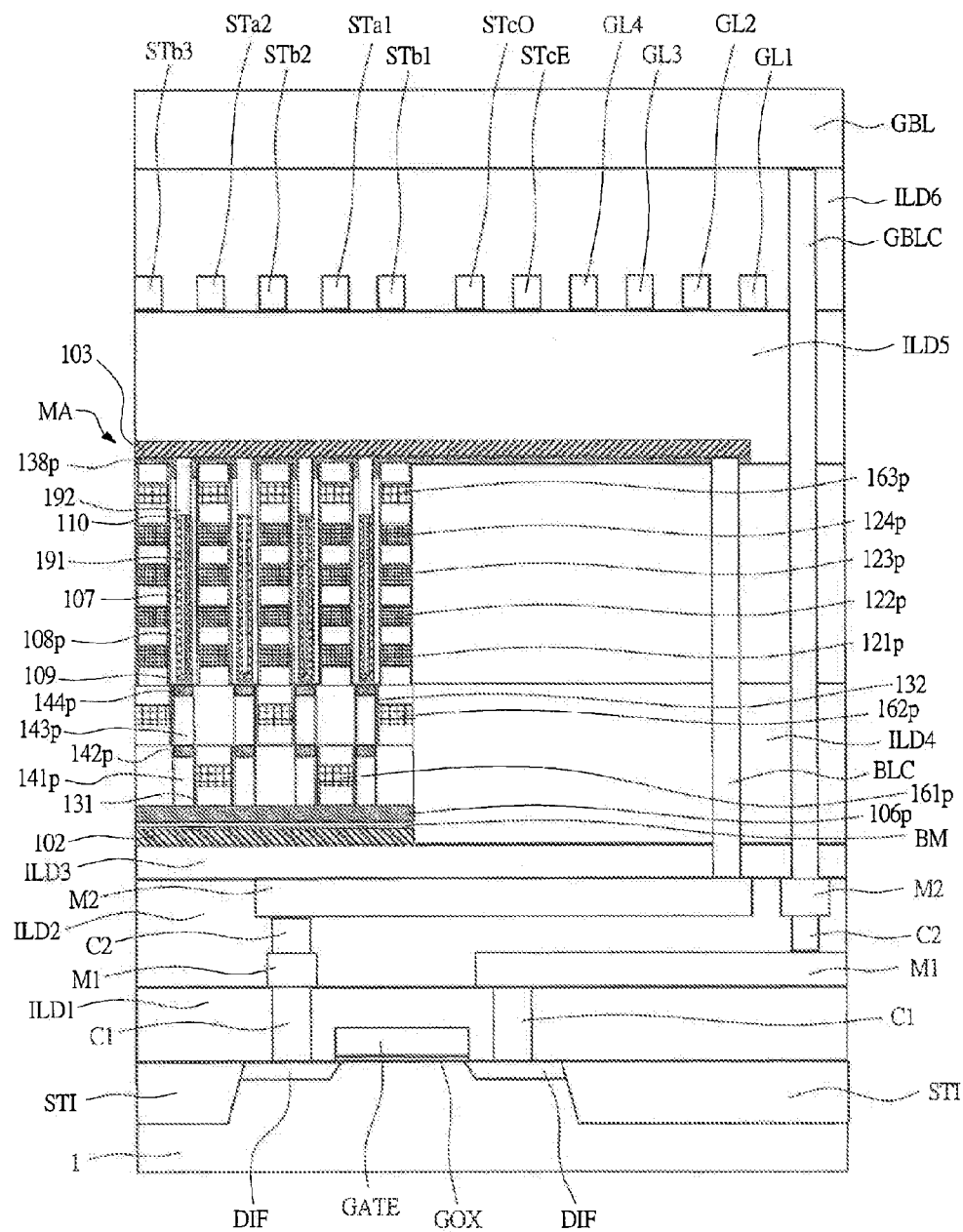
FIG. 1 is a cross-sectional view of a vertical chain memory according to a first embodiment of this invention.

Hereinafter, embodiments of this invention will be described in detail with reference to the drawings. In all of the drawings for describing the embodiments, members having the same function are denoted by identical symbols, and the repetitive description will be omitted. Also, in the following embodiments, the description of the identical or similar parts is not repeated in principle unless necessary.

Also, in the drawings used in the following embodiments, hatching may be partially omitted even in cross-sectional views for facilitating visualization of the drawings.

Also, in the drawings used in the following embodiments, hatching may be partially omitted even in plan views and bird's eye views for facilitating visualization of the drawings.

First Embodiment

A part of a cross-sectional view of a vertical chain memory according to this embodiment is illustrated in FIG. 1. FIG. 1 is a cross-sectional view of a non-volatile storage device according to this embodiment, which partially illustrates a memory cell array, lines, and a contact plug. A gate electrode GATE is formed on a semiconductor substrate 1 through a gate insulator film GOX, and diffusion layers DIF are formed on a main surface of the semiconductor substrate 1 so as to sandwich the semiconductor substrate 1 at the bottom of the gate electrode GATE therebetween. The diffusion layers DIF and the gate electrode GATE configure a field effect transistor that selects a source electrode 102 which is a word line, or a bit line 103. Element isolation layers STI are formed on an upper surface of the semiconductor substrate 1 in contact with the respective diffusion layers DIF. An interpoly dielectric film ILD1 is formed on the semiconductor substrate 1 so as to cover the gate electrode GATE and the element isolation layers STI. Interpoly dielectric films ILD2, ILD3, ILD4, ILD5, ILD6, and a global bit line GBL are formed on the interpoly dielectric film ILD1 in order from the semiconductor substrate 1 side.

Line layers M1 and M2 are formed in a lower portion and an upper portion within the interpoly dielectric film ILD2, respectively, and the line layer M2 is electrically connected to the diffusion layers DIF through a contact plug C2 formed between the line layer M2 and the line layer M1, the line layer M1, and a contact plug C1 that penetrates through the interpoly dielectric film ILD1. A barrier metal layer BM and a polysilicon layer 106p doped with n-type impurities are formed in the stated order on the plate-shaped (planar) source electrode 102 formed of a metal film on the interpoly dielectric film ILD3, into a plate shape as with the source electrode 102.

A plurality of polysilicon layers 161p formed in stripes extending in a first direction (direction perpendicular to a paper plane of FIG. 1) along a main surface of the semiconductor substrate 1 is formed on the polysilicon layer 106p through an insulator film. A plurality of polysilicon layers 141p is formed on one sidewall of each of the polysilicon layers 161p through an insulator film 131. The polysilicon layers 161p are aligned in plural number in a second direction orthogonal to the first direction, along the main surface of the semiconductor substrate 1. The polysilicon layers 141p each have a columnar shape extending in a direction perpendicular to the main surface of the semiconductor substrate 1, and are aligned in plural number intermittently in the first direction on the sidewall of each polysilicon layer 161p in the second direction. The plurality of polysilicon layers 161p is formed in a strip, and the plurality of polysilicon layers 141p is formed on one sidewall of each polysilicon layers 161p. Accordingly, the plurality of polysilicon layers 141p is arranged in a matrix on a plan view. In the present specification, the stripe pattern means that patterns extending in the same direction along the main surface of the semiconductor substrate are aligned in plural number at given intervals in the other direction orthogonal to the pattern extending direction and along the main surface of the semiconductor substrate.

A polysilicon layer 142p doped with n-type impurities (for example, As (arsenic)) is formed in a part of an upper portion of each of the polysilicon layer 141p including an upper surface of the polysilicon layer 141p. Each of the polysilicon layers 161p is a first gate of a first select transistor, and each polysilicon layer 141p is a first channel semiconductor layer of the first select transistor. Stripe patterns configured by a plurality of polysilicon layers 162p extending in the first direction are formed through an insulator film above a layer including the polysilicon layers 141p and the polysilicon layers 161p. A polysilicon layer 143p is formed on a sidewall of each polysilicon layer 162p through an insulator film 132. That is, the polysilicon layers 161p and 162p are each aligned in plural number in the second direction. Also, each of the polysilicon layers 161p is a conductive layer that functions as a gate electrode and a gate line of the first select transistor, and each of the polysilicon layers 162p is a conductive layer that functions as a gate electrode and a gate line of a second select transistor.

A polysilicon layer 144p doped with n-type impurities (for example, As (arsenic)) is formed in a part of an upper portion of each of the polysilicon layer 143p including an upper surface of the polysilicon layer 143p. Each of the polysilicon layers 162p is a second gate of the second select transistor, and each channel polysilicon layer 143p is a second channel semiconductor layer of the second select transistor. In the first select transistor and the second select transistor, the respective channel layers, that is, the polysilicon layer 141p and the polysilicon layer 143p are connected in series with each other through the polysilicon layer 142p. That is, there are formed two-layer select transistors having a structure in which the second select transistor which is the vertical transistor is formed on the first select transistor which is the vertical transistor.

That is, the polysilicon layer 143p is formed immediately above the polysilicon layers 141p through the polysilicon layer 142p. Also, the polysilicon layer 162p is not arranged immediately above the polysilicon layer 161p, and the insulator film 132 is not arranged immediately above the insulator film 131. Accordingly, the plurality of polysilicon layers 161p and the plurality of polysilicon layers 162p each extending in the same direction do not overlap with each other two-dimensionally. Each of the polysilicon layers 162p is arranged immediately above a region between the polysilicon layers 161p adjacent to each other in the second direction. As will be described later, the polysilicon layers 141p, 143p, and the polysilicon layers 142p, 144p are each isolated from each other in the first direction, and formed in plural number. Also, the polysilicon layers 141p, 143p, and the polysilicon layers 142p, 144p are each stacked at positions to overlap with each other two-dimensionally, and arranged in a matrix on the semiconductor substrate 1.

That is, the columnar stacked films including the polysilicon layers 141p to 144p are arranged in a matrix. One sidewall of each stacked film in the second direction in the stacked films aligned in the first direction comes in contact with the polysilicon layer 161p through the insulator film 131, and the other sidewall of the stacked film in the second direction comes in contact with the polysilicon layer 162p through the insulator film 132.

The patterns in which the insulator films and the conductive layers are alternately stacked together in plural number in order from below, which are formed in the stripes in the first direction, are arranged on the above-mentioned two-layer select transistors. That is, on the two-layer select transistors are formed an insulator film 111 (refer to FIG. 2), a polysilicon layer 121p, an insulator film 112 (refer to FIG. 2), a polysilicon layer 122p, an insulator film 113 (refer to FIG. 2), a polysilicon layer 123p, an insulator film 114 (refer to FIG. 2), a polysilicon layer 124p, an insulator film 115 (refer to FIG. 2), a polysilicon layer 163p, and an insulator film 175 (refer to FIG. 2). The polysilicon layers 121p to 124p function as the gates of cell transistors (select transistors) each selecting a plurality of phase change memories connected in series in a direction perpendicular to the main surface of the silicon substrate. The polysilicon layers 121p to 124p are formed in the stripes each extending in the first direction.

Also, the polysilicon layer 163p which is a gate line, functions as a gate of selecting the vertical chain memories formed on the sidewall of the stacked film including the polysilicon layers 121p to 124p in the second direction. The stacked film including the polysilicon layers 121p to 124p, and 163p which are gate line are formed immediately above the respective polysilicon layers 161p and the polysilicon layers 162p, respectively, but not formed immediately above the polysilicon layers 141p and the polysilicon layer 142p, respectively.

Also, in the stacked film including the polysilicon layers 121p, 122p, 123p, 124p, 163p, and the insulator films therebetween, a plurality of grooves reaching 144p, that is, spaces between the stacked films formed in the stripes are formed immediately above the polysilicon layer 141p and the polysilicon layer 142p which are channel semiconductors of the two-layer select transistors. Insulator films 109 are formed on both sidewalls of the stacked film which are inner walls of the respective grooves.

A polysilicon layer 108p that covers an inner wall and a bottom portion of the groove is formed within each of the grooves. On the polysilicon layer 108p, an insulator film 110, a phase change material layer 107, and an insulator film 191 are formed in order. The insulator film 110, the phase change material layer 107, and the insulator film 191 are embedded in the groove from a bottom of the groove up to the height of the same layer as the insulator film immediately below the polysilicon layer 163p. That is, in each of the grooves, the insulator films 109, the polysilicon layer 108p, the insulator film 110, the phase change material layer 107, and the insulator film 191 are formed in order from each of the facing inner walls within the groove. The polysilicon layer 108p, the insulator film 110, the phase change material layer 107, and the insulator film 191 are also formed on the bottom of the groove. Therefore, each of the polysilicon layer 108p, the insulator film 110, the phase change material layer 107, and the insulator film 191 are U-shaped in a cross-section along the second direction.

An insulator film 192 is formed on an upper portion of the respective uppermost surfaces of the insulator film 110, the phase change material layer 107, and the insulator film 191. A polysilicon layer 138p doped (introduced) with n-type impurities with a concentration higher than the polysilicon layer 108p is formed on an upper portion of the polysilicon layer 108p in a region higher than an upper surface of the polysilicon layer 163p. The polysilicon layer 138p is electrically connected to the polysilicon layer 108p and the bit lines 103 on the polysilicon layer 138p. The bit lines 103 are stripe lines extending in the second direction, and formed immediately above the polysilicon layer 141p configuring the first select transistor. That is, in the first select transistor, the second select transistor, and the vertical chain memory cell above those transistors, the space portions between the stacked film including the polysilicon layers 121p, 122p, 123p, 124p, 163p, and the insulator films therebetween, which are formed in the stripes, and the bit line 103 are arranged at positions to overlap with each other two-dimensionally, respectively. The bit lines 103 and the diffusion layers DIF are electrically connected to each other through a contact plug BLC, the line layers M2, M1, and the contact plugs C1, C2. The bit lines 103 are connected to the other circuits. The bit lines 103 are metal wires for selecting the phase change memories.

On the interpoly dielectric film ILD5, lines STa1, STa2, STb1, STb2, STb3, STcO, STcE, GL1, GL2, GL3, and GL4 for feeding a current to the gates of the cell transistors and the two-layer select transistors are aligned in stripes in the first direction. The global bit line GBL which is a line formed on the interpoly dielectric film ILD6 and the line layer M1 are electrically connected to each other through a contact plug GBLC that penetrates through the interpoly dielectric films ILD3 to ILD6, the line layer M2, and the contact plug C2.

In the present specification, a region including the two-layer selector transistors, the polysilicon layers 121p to 124p, the polysilicon layer 161p, the phase change material layer 107, the polysilicon layer 108p, the polysilicon layer 138p, the insulator films 109, the bit line 103, and the source electrode 102 is called "memory cell array MA".

In a region not shown, the polysilicon layers 121p to 124p are electrically connected to the lines GL1 to GL4 through the contact plug, respectively. Also, the plurality of polysilicon layers 161p is connected to the respective lines STa1 to STan (n is a natural number), and the plurality of polysilicon layers 162p is connected to the respective lines STb1 to STbn (n is a natural number). In FIG. 1, among the lines STa1 to STan and the lines STb1 to STbn, only the lines STa1, STa2, STb1, STb2, and the STb3 are illustrated.

The polysilicon layers 161p formed in the same layer in the stripes are electrically connected to the respective lines STa1 to Stan through contact plugs (not shown), and electrically isolated from each other. That is, one of the two adjacent polysilicon layers 161p among the plurality of polysilicon layers 161p is connected to the line STa1, and the other polysilicon layer is connected to the line STa2. With this configuration, voltages independent from each other can be applied to the adjacent polysilicon layers 161p.

Likewise, the polysilicon layers 162p formed in the same layer in the stripes are electrically connected to the respective lines STb1 to STbn through contact plugs (not shown), and electrically isolated from each other. That is, three polysilicon layers 162p aligned in the second direction among the plurality of polysilicon layers 162p are connected to the respective lines STb1 to STb3. With this configuration, voltages independent from each other can be applied to the adjacent polysilicon layers 162p.

Also, on a lower portion of the source electrode 102 in a region not illustrated in FIG. 1, a contact plug that connects the source electrode 102 and the field effect transistor formed on the semiconductor substrate 1 is formed. The lines STa1, STa2, STb1, STb2, STb3, STcO, STcE, GL1, GL2, GL3, and GL4 are electrically connected to peripheral circuits (not shown) formed on the semiconductor substrate 1 through contact plugs.

Also, in the regions not shown, in each of the polysilicon layers 121p to 124p, and 163p, the stripe patterns arranged alternately are integrally joined together in the respective layers. That is, for example, the adjacent polysilicon layers 121p are not electrically connected to each other, but two other polysilicon layers 121p between which one polysilicon layer 121p is interposed are electrically connected to each other. One polysilicon layer 121p arranged between the two polysilicon layers 121p electrically connected to each other, and isolated from those two polysilicon layers 121p is electrically connected to the polysilicon layers 121p arrange at opposite sides of those respective two polysilicon layers 121p.

Also, as described above, the polysilicon layers 121p to 124p are electrically connected to the lines GL1 to GL4 through the contact plugs. For example, when one polysilicon layer 121p is connected to the line GL1, the polysilicon layers 121p adjacent to the one polysilicon layer 121p are connected to the other lines, the adjacent polysilicon layers 121p are electrically isolated from each other.

The polysilicon layers 122p to 124p and 163p have the same structure. That is, in the polysilicon layers 121p to 124p, the adjacent polysilicon layers are insulated from each other, and connected to the respective different lines GL1 to GL4. Also, the adjacent polysilicon layers 163p are connected to the respective lines STcO and STcE. Accordingly, the polysilicon layers adjacent to each other in the second direction of the polysilicon layers 122p to 124p and 163p are not electrically connected to each other, applied with voltages, independently, and can be controlled, separately.

Figure 2:
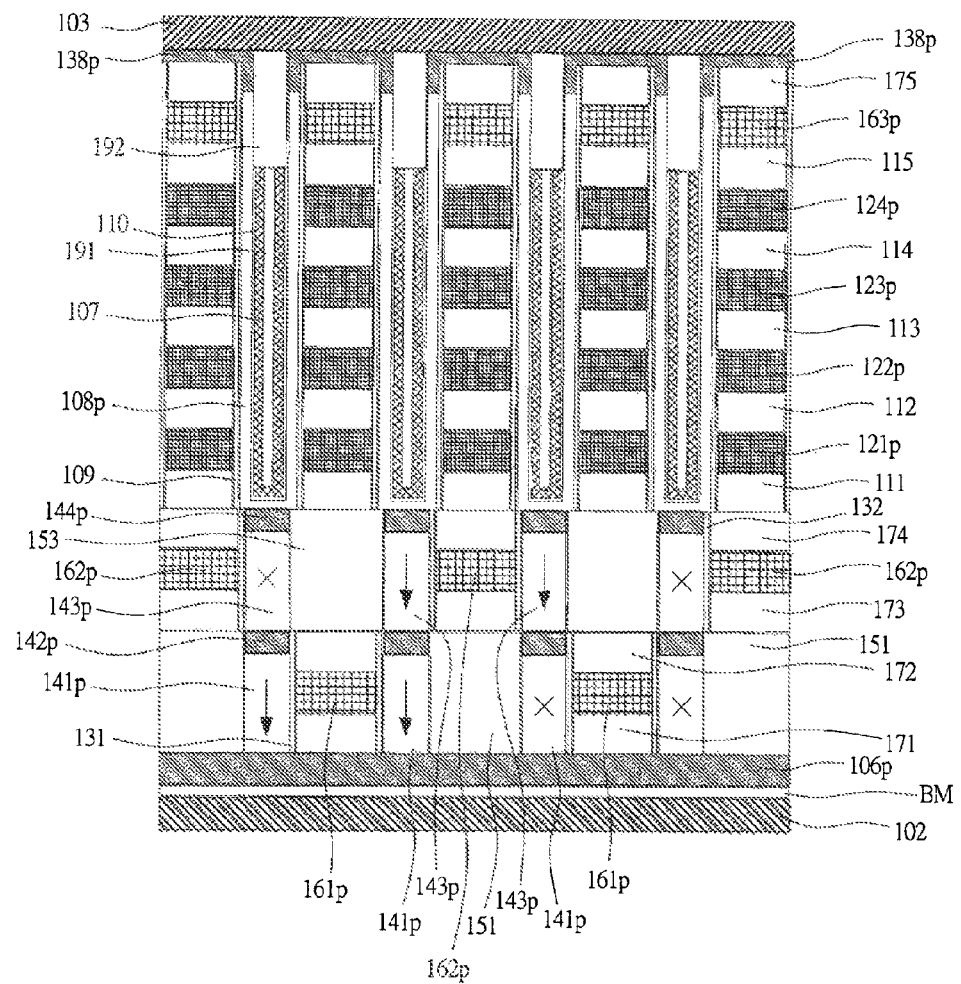
FIG. 2 is a cross-sectional view of the vertical chain memory according to the first embodiment of this invention.
Figure 3:
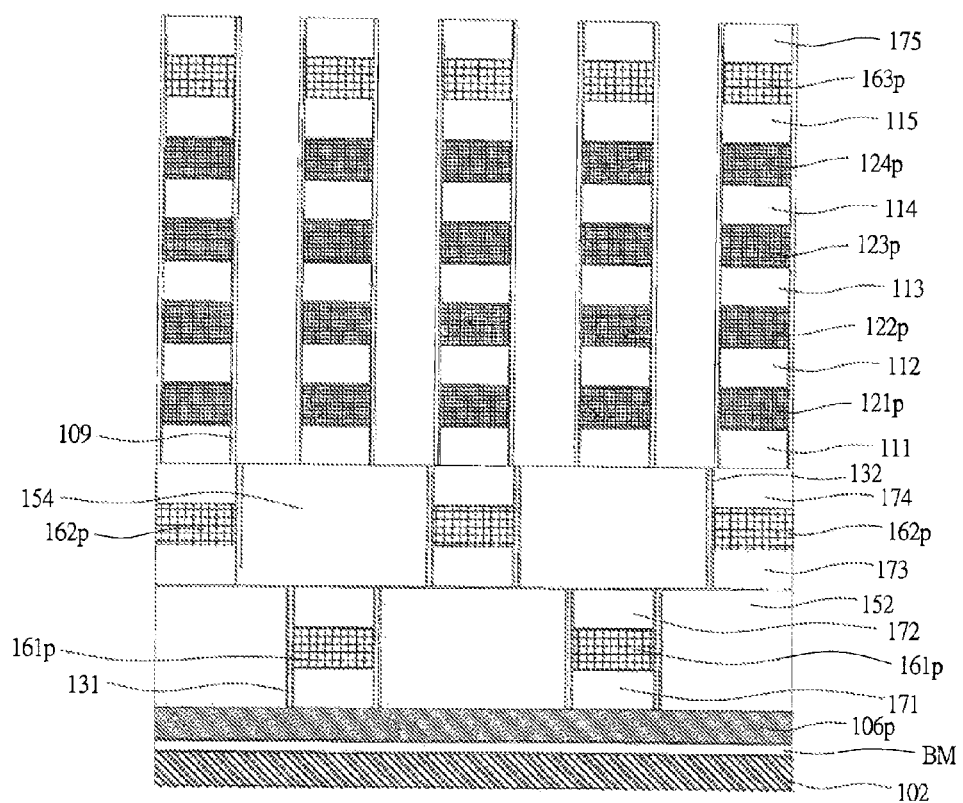
FIG. 3 is a cross-sectional view of the vertical chain memory according to the first embodiment of this invention.

FIGS. 2 and 3 are cross-sectional views illustrating a portion of the memory cell array MA in FIG. 1. FIG. 2 is a cross-sectional view along the second direction including the bit line 103, and FIG. 3 is a cross-sectional view along the second direction including a space portion of the bit line 103.

As illustrated in FIG. 2, the source electrode 102, the barrier metal layer BM, and the polysilicon layer 106p are formed on the semiconductor substrate 1 (refer to FIG. 1) along the main surface of the semiconductor substrate 1. One sidewall of the columnar polysilicon layer 141p formed on the polysilicon layer 106a in the second direction is formed with an insulator film 171, the polysilicon layer 161p, and an insulator film 172, which are stacked in order from the semiconductor substrate 1 side through the insulator film 131. That is, the respective polysilicon layers 141p are formed through the insulator films 131 on both sidewalls of the stacked film including the insulator film 171, the polysilicon layer 161p, and the insulator film 172 in which the conductive films and the insulator films are alternately stacked together. Therefore, the polysilicon layer 161p is isolated from the polysilicon layer 106p by the insulator film 171.

Likewise, one sidewall of the polysilicon layer 143p formed immediately above the polysilicon layer 141p in the second direction is formed with an insulator film 173, the polysilicon layer 162p, and an insulator film 174 stacked in order from the semiconductor substrate 1 (refer to FIG. 1) side through the insulator film 132. That is, the respective polysilicon layers 143p are formed through the insulator films 132 on both sidewalls of the stacked film including the insulator film 173, the polysilicon layers 162p, and the insulator film 174.

The polysilicon layer 141p and the polysilicon layers 161p configure the first select transistor, and the polysilicon layer 143p and the polysilicon layers 162p configure the second select transistor. The first select transistor and the second select transistor configure the two-layer select transistors.

As illustrated in FIGS. 2 and 3, the stacked film including the polysilicon layer 161p, and the insulator films 171, 172, and the stacked film including the polysilicon layers 162p, and the insulator films 173, 174 are patterned in stripes in the first direction. The pattern of the polysilicon layers 162p is present not immediately above the polysilicon layer 161p, but immediately above a region in which the polysilicon layer 161p is patterned and removed. As illustrated in FIG. 2, a bottom of the polysilicon layer 141p is electrically connected to the polysilicon layer 106p, and an upper portion thereof is electrically connected with the polysilicon layer 142p doped with n-type impurities (for example, As (arsenic). The bottom of the polysilicon layer 143p is electrically connected to the n-type polysilicon layer 142p, and an upper portion thereof is electrically connected with the polysilicon layer 144p doped with the n-type impurities (for example, As (arsenic)). Unlike the polysilicon layers 161p and 162p, the polysilicon layers 141p, 143p, and the polysilicon layers 142p, 144p are formed only immediately below the bit line 103. As is understood from FIG. 3 that is the cross-sectional view including the region between the adjacent bit lines 103, the polysilicon layers 141p, 143p, and the polysilicon layers 142p, 144p are not illustrated, and the polysilicon layers 141p to 144p are not formed immediately below the region between the adjacent bit lines 103. That is, the polysilicon layers 141p, 143p, and the polysilicon layers 142p, 144p are isolated by the region between the adjacent bit lines 103, and intermittently formed in plural number in the first direction.

As illustrated in FIG. 2, an insulator film 151 is formed in a region in which the polysilicon layer 161p is not formed, between the adjacent stacked films including the polysilicon layers 141p and 142p. Likewise, an insulator film 153 is formed in a region in which the polysilicon layer 162p is not formed, between the adjacent stacked films including the polysilicon layers 143p and 144p.

Also, as illustrated in FIG. 3, an insulator film 152 is formed through the insulator films 131 between the adjacent stacked films including the insulator film 171, the polysilicon layer 161p, and the insulator film 172. Likewise, an insulator film 154 is formed through the insulator films 132 between the adjacent stacked films including the insulator film 173, the polysilicon layer 162p, and the insulator film 174. FIG. 3 illustrates no insulator film 133 (refer to FIG. 5(b)) formed between the respective stacked films each including the polysilicon layers 121p, 122p, 123p, 124p, 163p, and the insulator films 111, 112, 113, 114, 115, and 175.

As illustrated in FIGS. 2 and 3, the stacked film including the insulator film 111, the polysilicon layer 121p, the insulator film 112, the polysilicon layer 122p, the insulator film 113, the polysilicon layer 123p, the insulator film 114, the polysilicon layer 124p, the insulator film 115, the polysilicon layer 163p, and the insulator film 175 is patterned in stripes in the first direction. That is, a stacked film in which (N+1) (N is an integer of N≥1) insulator films extending in the first direction and N conductive films extending in the first direction are alternately stacked together are aligned in the second direction in plural number.

The stripe pattern portion (line portion) of the stacked films each including the polysilicon layers 121p, 122p, 123p, 124p, 163p, and the insulator films 111, 112, 113, 114, 115, 175 are arranged immediately above the polysilicon layers 161p and 162p. The space portion between the stripe patterns of the stacked films each including the polysilicon layers 121p, 122p, 123p, 124p, 163p, and the insulator films 111, 112, 113, 114, 115, 175 are arranged immediately above the polysilicon layers 141p and 143p. The bit line 103 is arranged on the insulator film 175 through the n-type polysilicon layer 138p.

The insulator films 109, the polysilicon layer 108p, the insulator film 110, and the phase change material layer 107 are stacked in order from the sidewall of the stacked film in the area immediately below the bit line 103 in the space portion between the stacked films each including the polysilicon layers 121p, 122p, 123p, 124p, 163p, and the insulator films 111, 112, 113, 114, 115, 175. The insulator film 110 is a layer for preventing impurities from diffusing between the phase change material layer 107 and the polysilicon layer 108p. The insulator film 191 is embedded between the phase change material layers 107 formed on the respective facing sidewalls of the stacked films.

The height of the uppermost surface of the insulator film 110, the phase change material layer 107, and the insulator film 191 is lower than the height of the upper surface of the insulator film 115, and higher than the height of the bottom surface of the insulator film 115. The insulator films 109 and the polysilicon layer 108p are stacked on the upper sidewall of the insulator film 115, and the sidewalls of the polysilicon layer 163p and the insulator film 175 in order. The insulator film 192 is embedded between the polysilicon layers 108p formed on the respective sidewalls of the facing insulator films 115, polysilicon layers 163p, and insulator films 175.

In the bottom of the space portion between the adjacent stacked films each including the polysilicon layers 121p, 122p, 123p, 124p, 163p, and the insulator films 111, 112, 113, 114, 115, 175, in the region immediately below the bit line 103, the upper surface of the polysilicon layer 144p and the bottom surface of the polysilicon layer 108p come in contact with each other, and are electrically connected to each other. Accordingly, the bit line 103 and the polysilicon layer 144p configuring the two-layer select transistors are electrically connected to each other through both side surfaces of the stacked film via the polysilicon layer 138p and the polysilicon layer 108p.

Each of the polysilicon layers 121p, 122p, 123p, and 124p which extend in the first direction and function as the gate electrode and the gate line, and the polysilicon layer 108p and the phase change material layer 107 formed through the insulator film 109 on the sidewall of each of the polysilicon layers 121p, 122p, 123p, and 124p in the second direction configure each memory cell. That is, in the memory array illustrated in FIG. 3, fourth memory cells with each of the polysilicon layers 121p, 122p, 123p, and 124p as the gate are connected in series with each other in the direction perpendicular to the main surface of the semiconductor substrate 1 along the sidewall of the stacked film in the second direction.

The plurality of memory cells connected in series along the sidewalls of the stacked films are formed on the respective facing sidewalls of the adjacent stacked films in the second direction. Therefore, the plurality of memory cells connected in series is formed in two lines between the adjacent stacked films. The memory cells in two lines are electrically connected to the two-layer select transistors immediately below between the respective adjacent stacked films, and also electrically connected to the same bit line 103 immediately above between the adjacent stacked films.

That is, the memory cells in two lines are connected in parallel to each other between the two-layer select transistors and bit line 103. The source electrode 102 and the bit line 103 are electrically connected to each other through the first select transistor and the second select transistor which are connected in series, and the two-line memory cells which are connected in parallel to each other.

As illustrated in FIG. 2, one of the two-line memory cells has the semiconductor layer (polysilicon layer 108p) formed on one of the facing sidewalls of the adjacent stacked films as a channel region, and the other of the two-line memory cells has the semiconductor layer (polysilicon layer 108p) formed on the other of the facing sidewalls of the adjacent stacked films as the channel region.

The polysilicon layer 108p is a semiconductor layer continuously formed on the inner walls and the bottom surface of the groove between the adjacent stacked films, and is U-shaped in a cross-section along the extending direction (the second direction) of the bit line 103. Therefore, the polysilicon layer 108p includes the respective semiconductor layers formed on the facing sidewalls of the adjacent stacked films, and the respective semiconductor layers are connected in parallel to each other between the polysilicon layer 141p and the bit line 103.

That is, the second select transistor and the bit line 103 are electrically connected to each other by parallel connection layers (polysilicon layer 108p) including the above respective semiconductor layers formed on the facing sidewalls of the adjacent stacked films. In this way, the source electrode 102 and the bit line 103 are electrically connected to each other by the polysilicon layers 141p and 143 connected in series with each other, and the parallel connection layers.

That is, the source electrode 102 and the bit line 103 are electrically connected to each other through the polysilicon layers 141p and 143p connected in series with each other and the semiconductor layer formed on one of the facing sidewalls of the adjacent stacked films, and also electrically connected to each other through the polysilicon layers 141p and 143p connected in series with each other and the semiconductor layer formed on the other of the facing sidewalls of the adjacent stacked films.

The non-volatile storage device according to this invention stores information by the aid of a fact that the phase change material such as $Ge_2Sb_2Te_5$ contained in the phase change material layer 107 is different in resistivity between an amorphous state and a crystal state. The phase change material layer 107 is high in resistance in the amorphous state, and low in resistance in the crystal state. Accordingly, read is conducted by giving a voltage difference to both ends of a variable resistance element, and measuring a current flowing in the element to discriminate a high resistance state or a low resistance state of the element.

The operation of changing the phase change material from the amorphous state which is the high resistance state to the crystal state which is the low resistance state, that is, set operation, and conversely the operation of changing the phase change material from the crystal state which is the low resistance state to the amorphous state which is the high resistance state, that is, reset operation, are conducted by subjecting the phase change material to temperature change. In more detail, the phase change material of the amorphous state is heated to a crystallization temperature or higher, and maintained at that temperature for about $10^{-6}$ seconds or longer, to thereby obtain the crystal state. Also, the phase change material of the crystal state is heated to a temperature of a melting point or higher into a liquid state, and thereafter rapidly cooled to obtain the amorphous state.

Figure 4:
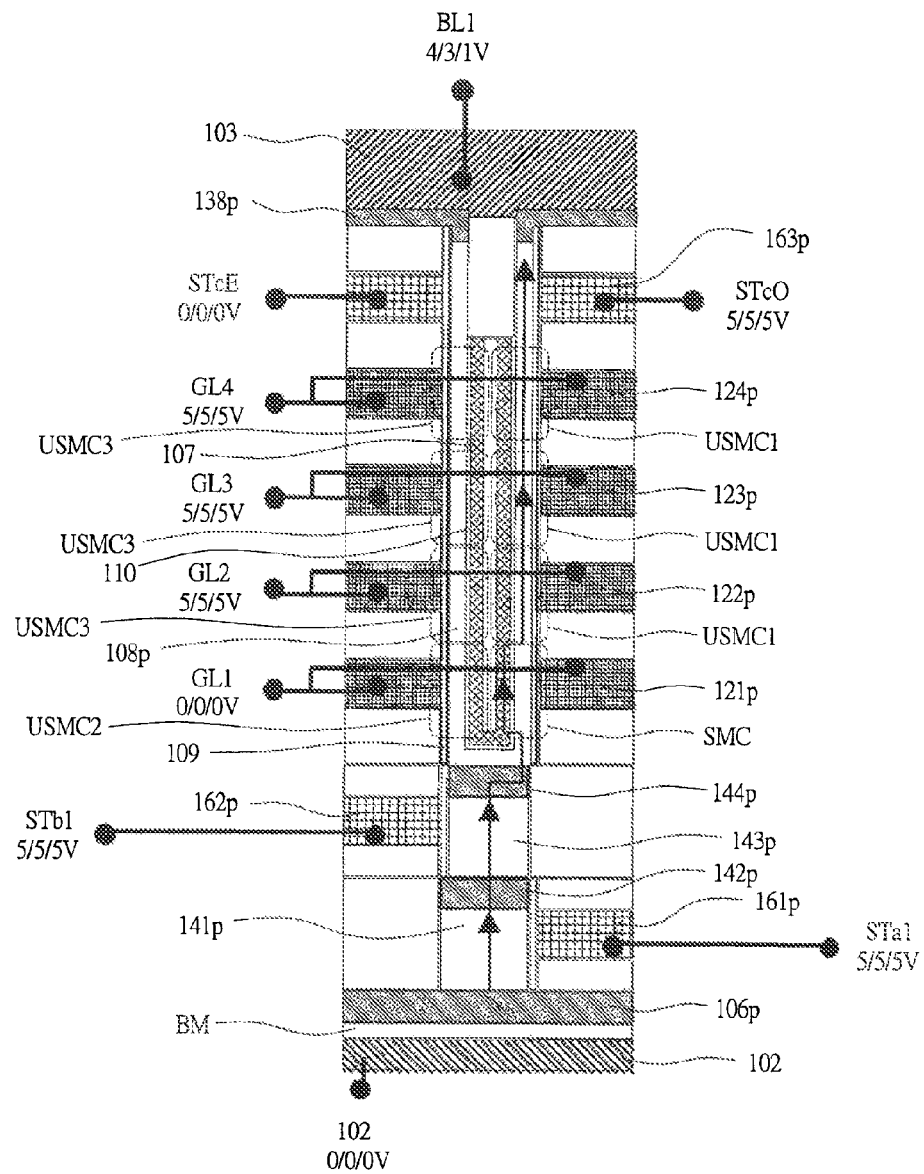
FIG. 4 is a cross-sectional view illustrating the operation of the vertical chain memory according to the first embodiment of this invention.
Figure 5A:
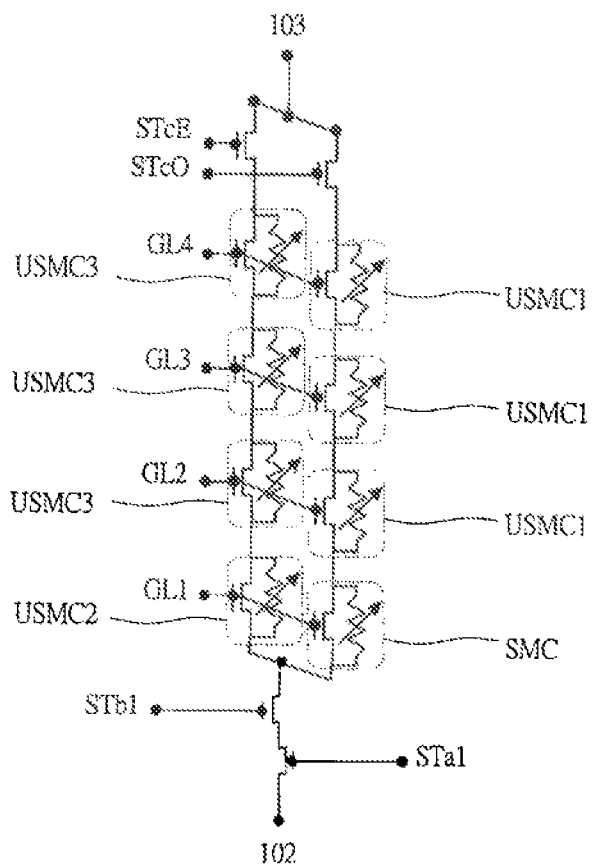
FIG. 5($a$) is an equivalent circuit diagram illustrating the operation of the vertical chain memory illustrated in FIG. 4.
Figure 5B:
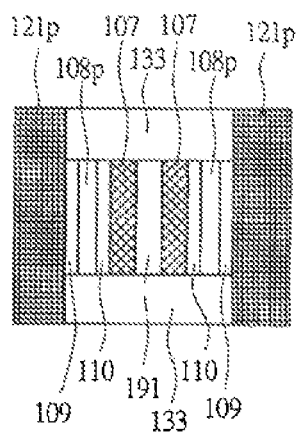

FIG. 4 illustrates a part of the memory cell array MA according to this embodiment. Also, FIG. 5(a) illustrates an equivalent circuit diagram of the memory cell illustrated in FIG. 4, and FIG. 5(b) is a top view illustrating a part of the vertical chain memory which is a cross-section including the polysilicon layer 121p of the memory cell illustrated in FIG. 4. A structure illustrated in FIG. 4 represents one of the plurality of memory cells formed in a matrix within the memory cell array MA (refer to FIG. 1). The plurality of memory cells includes the stacked films each including the adjacent polysilicon layers 121p, 122p, 123p, 124p, 163p, and the insulator films 111, 112, 113, 114, 115, 175, the phase change material layer 107, the polysilicon layer 138p, and the polysilicon layer 108p which are formed between the adjacent stacked films, and the two-layer select transistors formed below those layers.

As illustrated in FIG. 4, the polysilicon layer 106p and the source electrode 102, and a bit line BL1, that is, the bit line 103 are electrically connected to each other through the polysilicon layers 141p and 142p, and each of the polysilicon layers 108p formed on the facing sidewalls of the adjacent stacked films. Also, as illustrated in FIG. 5(a), the source electrode 102 and the bit line 103 are electrically connected to each other by the first select transistor and the second select transistor connected in series, and the plurality of memory cells. Two current paths configured by the polysilicon layers 108p which are the semiconductor layers are formed in parallel between the second select transistor and the bit line 103. Each of the two current paths has the plurality of memory cells connected in series with each other.

As illustrated in FIG. 4, in the plurality of memory cells each having the transistor and the phase change element connected in parallel are connected in series with each other, that is, the vertical chain memory, for example, the following operation is conducted. In the following description, when "0V" is merely said, it is meant that 0 V is applied in any cases of reset operation, set operation, and read operation. Also, when a number below reference symbol, for example, "5/5/5V" is indicated in FIG. 4, voltages to be applied in the respective operation of the reset (erase) operation, the set (program) operation, and read operation of the memory cell starting from the left are indicated with separators of "/".

0V is applied to the line GL1 which is the gate line connected with a select cell SMC illustrated in FIGS. 4 and 5A to turn off the transistor with the polysilicon layer 108p illustrated in FIG. 4 as a channel. 5V is applied to the lines GL2, GL3, and GL4 which are the gate lines which are not connected with the select cell SMC to turn on the transistor. 0V is applied to the source electrode 102, and 4V, 3V, and 1V are applied to the bit line BL1 in the reset operation, the set operation, and the read operation, respectively. In the reset operation, the set operation, and the read operation, 5V is applied to the polysilicon layer 161p and the polysilicon layers 162p of the memory cell having the select SMC to turn on the channel.

Also, 5V is applied to a gate of the polysilicon layer 163p on a side connected with the select cell SMC, that is, the line STcO to turn on the transistor. 0V is applied to a gate thereof on a side not connected with the select cell SMC, that is, the line STcE to turn off the transistor. In this situation, in an unselected cell USMC1, the transistor turns on, and the resistance of the channel becomes low, and the polysilicon layer 108p adjacent to the line STcO which is on also becomes low in resistance. Accordingly, not depending on a state of the phase change material layer 107 in the unselected cell USMC1, substantially the same current can flow even in the polysilicon layer 108p of any unselected cell USMC1 connected in series with the select cell. Further, because the transistor is off in the select cell SMC, the current flows in the phase change material layer 107. A path in which the current flows is indicated by arrows in FIG. 4.

In the resent operation and the set operation, a resistivity of the phase change material layer 107 is changed according to the current flowing in the phase change material layer 107 of the select cell SMC. In the read operation, the current value flowing in the phase change material layer 107 of the select cell SMC is determined to conduct the operation. The transistors of an unselected cell USMC2 and an unselected cell USMC3 share respective common gate voltages with the transistors of the select cell SMC and the unselected cell USMC1. Therefore, in the reset operation, the set operation, and the read operation of the select cell, the transistor of the unselected cell USMC2 is off, and the transistor of the unselected cell USMC3 is on. Since the select transistor including the polysilicon layer 163p connected with the line STcE is off, no current flows through the unselected cell USMC2 and the unselected cell USMC3. Accordingly, the current flowing in the phase change material layer 107 flows in only the phase change material layer 107 of the select cell SMC, and selective operation is enabled.

FIG. 5(b) illustrates a cross-sectional view of the vertical chain memory on a horizontal plane for illustrating the configuration viewed from an upper surface of the phase change element. As illustrated in FIG. 5(b), between the respective polysilicon layers 121p extending in the first direction, there are a region in which the insulator films 109, the polysilicon layer 108p, the insulator film 110, the phase change material layer 107, and the insulator film 191 are formed in order from the sidewall of one polysilicon layer 121p, and regions in which only each insulator film 133 is formed.

Figure 6:
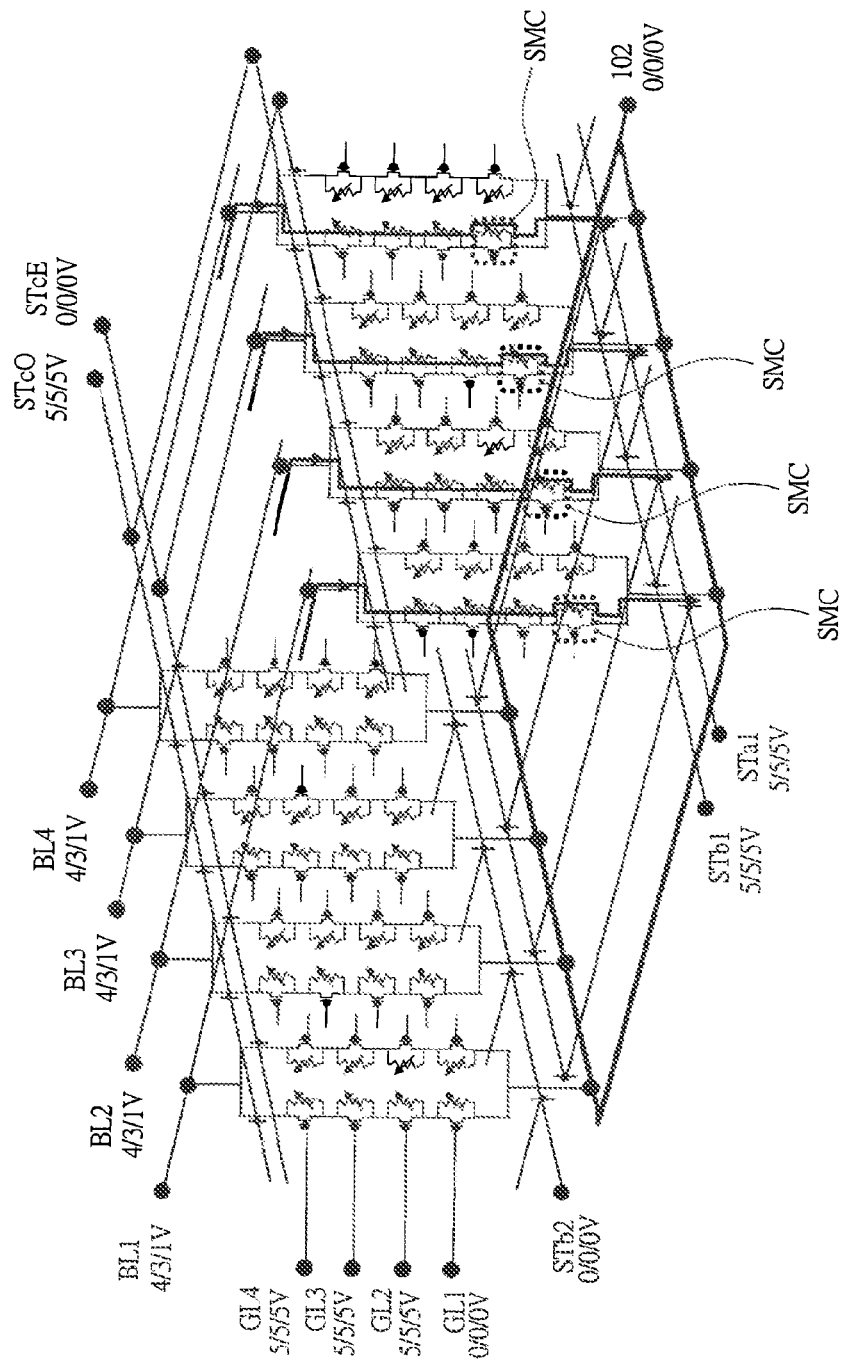
FIG. 6 is an equivalent circuit diagram illustrating the operation of the vertical chain memory according to the first embodiment of this invention.

FIG. 6 illustrates a relationship of voltages to be applied to the bit lines BL1, BL2, BL3, BL4, the source electrode 102, and the lines GL1, GL2, GL3, GL4, STcO, STcE, STa1, STa2, STb1, STb2 when conducting the reset operation, the set operation, and the read operation. The polysilicon layers 161p and 162p (refer to FIG. 2) of the first select transistor and the second select transistor can be respectively applied with an independent voltage for each line.

Like FIG. 4, in FIG. 6, a number indicated close to reference symbol of the bit line BL1, that is, 4/3/1V represent voltages to be applied to the bit line BL1 in the reset operation, the set operation, and the read operation, respectively. Likewise, the notation of the voltage of the other terminals in FIG. 6 also represents the voltages in the reset operation, the reset operation, and the read operation in order. In FIG. 6, 5V is applied to the line ST1 in the gate of the first select transistor, 0V is applied in the other first select transistor gates, 5V is applied to the line STb1 in the gate of the second select transistor, and 0V is applied in the other second select transistor gates. When the voltage is thus applied, the two-layer select transistors can be turned on in only one portion in the direction along the bit line.

In FIG. 6, one select cell SMC is selected from each of the plurality of vertical chain memories connected to the bit lines BL1 to BL4 at the same time. All of those four select cells SMC do not always need to operate. For example, when the cells connected to the bit line BL1 is not to operate, an applied voltage of the bit line BL1 has only to be set to 0V which is identical with that of the source electrode 102. Since the source electrode 102 is of a plate shape and low in resistance, even if one cell is selected from each of N (N is a natural number) bit lines and operated, and a current of the amount corresponding to the N cells flows in the source electrode 102, a trouble caused by a voltage drop in the source electrode 102 can be prevented from occurring.

A voltage is applied to both ends of only the vertical chain memory in which a voltage necessary for the reset/set/read operation is applied to the bit line to turn on two-layer select transistors so that a current can flow therein. The select cell SMC within the vertical chain memory can be selected and operated by the method described in FIG. 4, as a result of which the select cell SMC within the memory cell array can be selected and operated.

Subsequently, a method of producing the non-volatile storage device according to this embodiment with reference to FIGS. 7 to 20.

Figure 7:
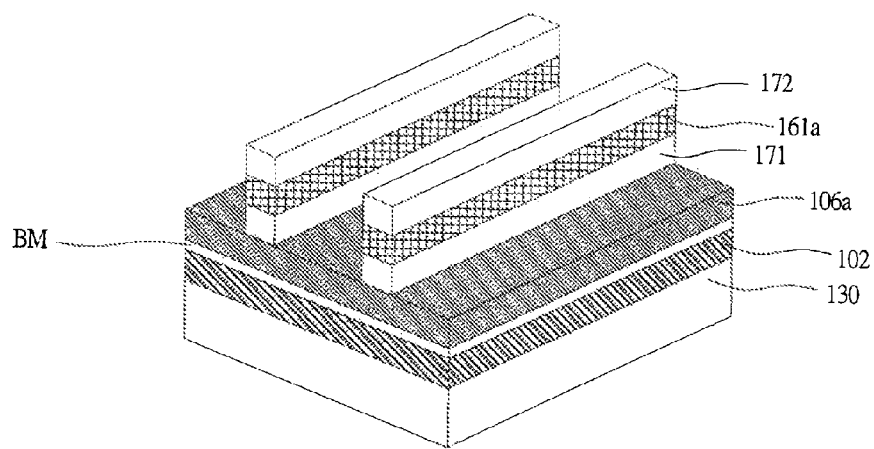
FIG. 7 is a bird's eye view illustrating a method of producing the vertical chain memory according to the first embodiment of this invention.

First, as illustrated in FIG. 7, an interpoly dielectric film 130, the source electrode 102 formed of a tungsten film, the barrier metal layer BM made of TiN (titanium nitride), the amorphous silicon layer 106a doped with n-type impurities (for example, As (arsenic)), the insulator film 171, an amorphous silicon layer 161a, and the insulator film 172 are formed in turn on the semiconductor substrate 1 (not shown) in which the peripheral circuits (not shown) and the contact plug (not shown) of the source electrode 102 are formed. The barrier metal layer BM is used to prevent the source electrode 102 and the amorphous silicon layer 106a from reacting with each other, and form a contact with a low contact resistance.

Thereafter, the stacked film including the insulator film 171, the amorphous silicon layer 161a, and the insulator film 172 is patterned into a stripe extending in the first direction which is a direction along the main surface of the semiconductor substrate 1 (not shown) through a photolithography or an etching technique.

Figure 8:
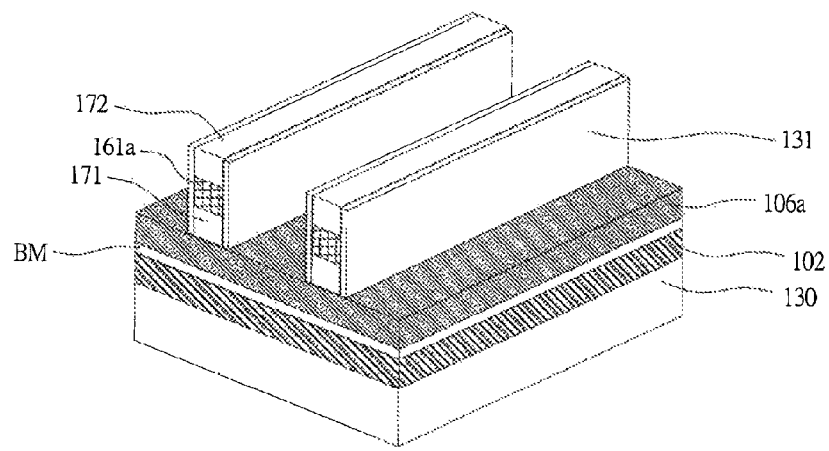
FIG. 8 is a bird's eye view illustrating a method of producing the vertical chain memory subsequent to FIG. 7.

Then, as illustrated in FIG. 8, the insulator film 131 is so formed as not to completely be embedded in the grooves between the stripe patterns formed in a process described with reference to FIG. 7. The insulator film 131 forms the gate insulator film of the first select transistor. Thereafter, the insulator film 131 formed on the upper surface of the insulator film 172 and the insulator film 131 on the upper surface of the amorphous silicon layer 106a is removed by etch-back. As a result, the insulator films 131 remain on only the respective sidewalls of the stripe pattern of the stacked film including the insulator film 171, the amorphous silicon layer 161a, and the insulator film 172.

Figure 9:
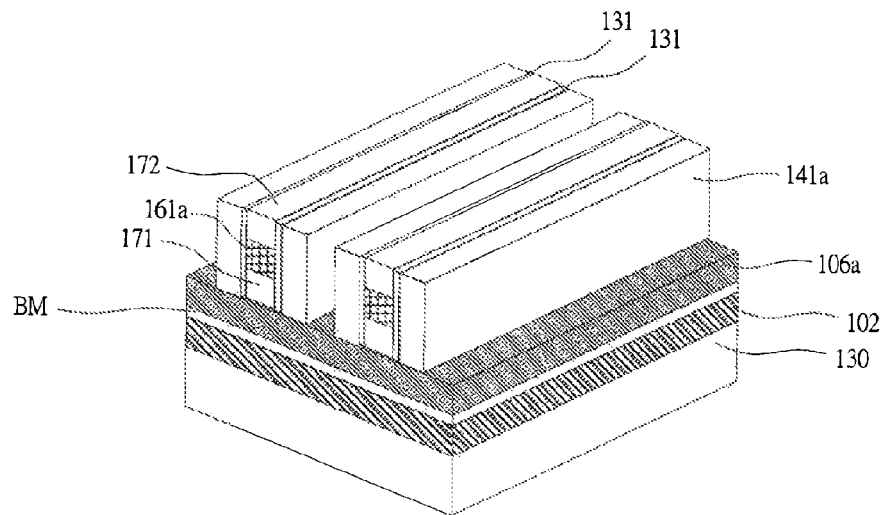
FIG. 9 is a bird's eye view illustrating the method of producing the vertical chain memory subsequent to FIG. 8.

Then, as illustrated in FIG. 9, an amorphous silicon layer 141a forming the polysilicon layer 141p (refer to FIG. 2) of the first select transistor is formed through, for example, a CVD (chemical vapor deposition) technique. In this situation, the amorphous silicon layer 141a is so formed as not to completely be embedded in the grooves. Then, the amorphous silicon layer 141a on an upper surface of the insulator film 172 and an upper surface of the amorphous silicon layer 106a is removed by etch-back. As a result, the amorphous silicon layer 141a remains on only the respective sidewalls of the stripe pattern.

Figure 10:
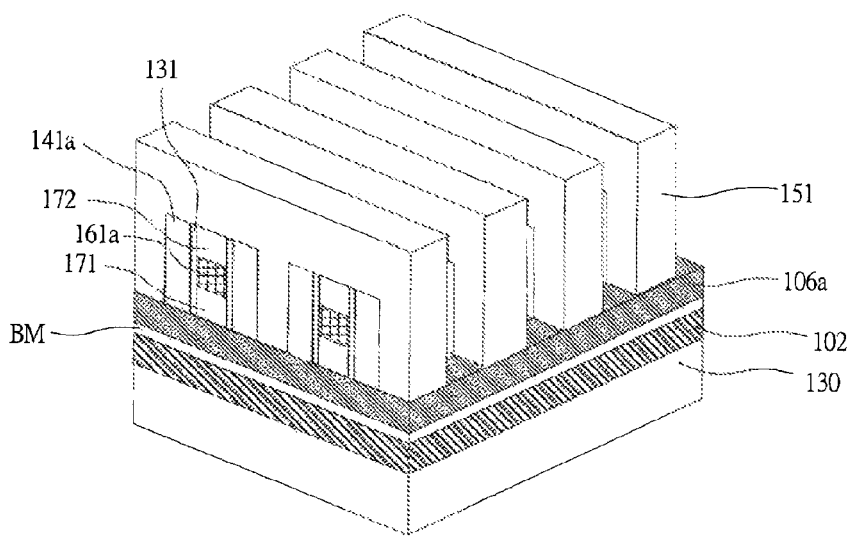
FIG. 10 is a bird's eye view illustrating the method of producing the vertical chain memory subsequent to FIG. 9.

Then, as illustrated in FIG. 10, after the insulator film 151 has been embedded in the grooves, the insulator film 151 is processed into stripes extending in the second direction orthogonal to the first direction which is the extending direction of the amorphous silicon layer 161a. Also, the amorphous silicon layer 141a on a lower portion between the respective insulator films 151 processed into the stripes is removed. In this situation, the amorphous silicon layer 141a is completely removed and isolated in the space portions between the respective stripe insulator films 151. Also, the amorphous silicon layer 161a is not processed. That is, the amorphous silicon layer 141a is divided, and intermittently aligned in the first direction in plural number. The amorphous silicon layer 106a may be etched by over-etching without any problem.

Figure 11:
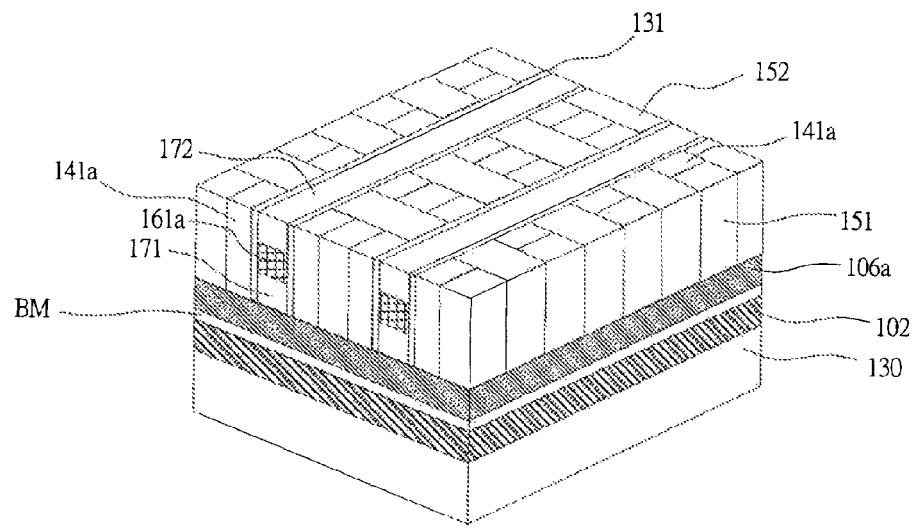
FIG. 11 is a bird's eye view illustrating the method of producing the vertical chain memory subsequent to FIG. 10.

Then, as illustrated in FIG. 11, each space between the respective stripe insulator films 151 is filled with the insulator film 152. Thereafter, an upper surface of the insulator film 152 is flattened through a chemical mechanical polishing) technique (CMP) to expose an upper surface of the amorphous silicon layer 141a.

Figure 12:
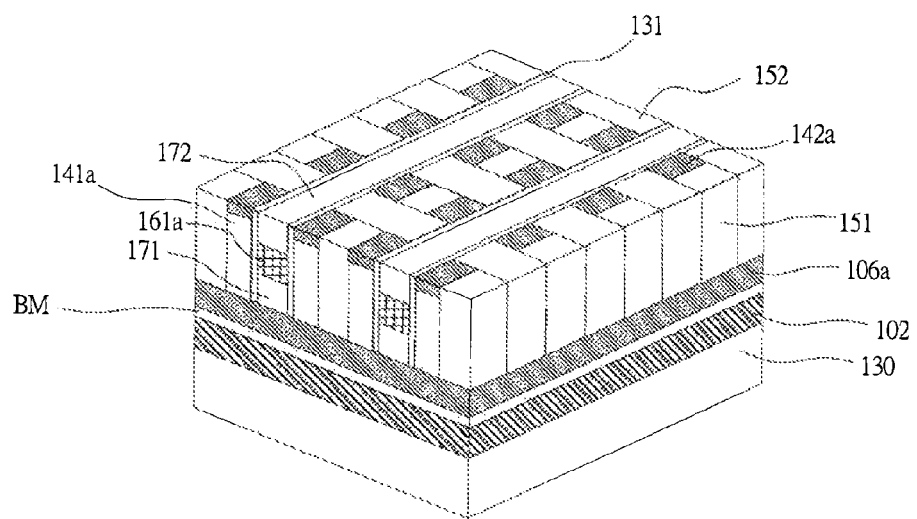
FIG. 12 is a bird's eye view illustrating the method of producing the vertical chain memory subsequent to FIG. 11.

Then, as illustrated in FIG. 12, arsenic (As) which is n-type impurities is introduced (doping) onto the upper surface of the amorphous silicon layer 141a through an ion implanting technique, as a result of which an amorphous silicon layer 142a higher in impurity concentration than the amorphous silicon layer 141a is formed on an upper surface of the amorphous silicon layer 141a.

Then, the same structure as the structure having the amorphous silicon layers 141a, 142a, 161a, and the insulator film 131 formed on the amorphous silicon layer 106a in the previous processes including the process in FIG. 12 is formed on the respective upper surfaces of the insulator films 131, 151, 152, 172, and the amorphous silicon layer 142a.

Figure 13:
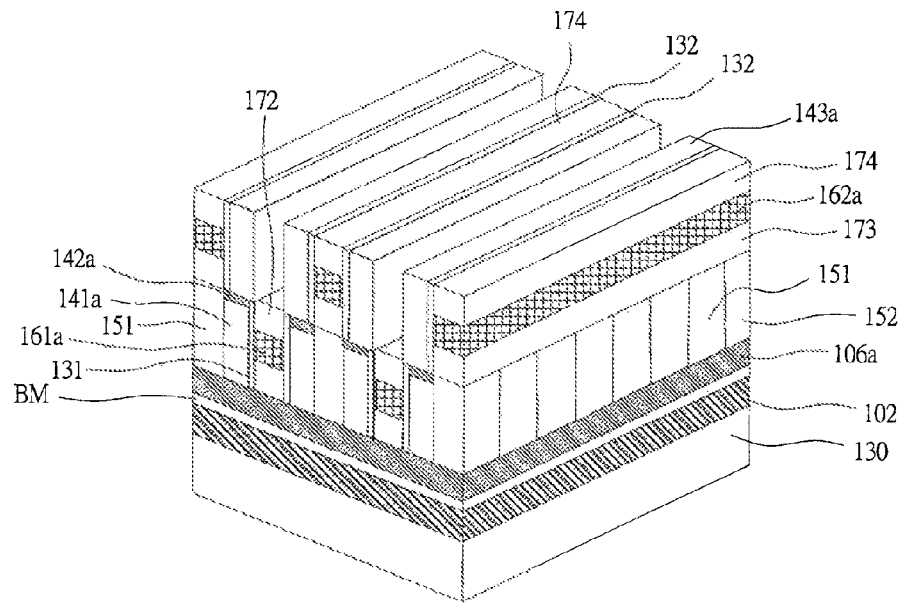
FIG. 13 is a bird's eye view illustrating the method of producing the vertical chain memory subsequent to FIG. 12.

That is, as illustrated in FIG. 13, the insulator film 173, an amorphous silicon layer 162a, and the insulator film 174 are first formed on the overall main surface of the semiconductor substrate 1 (not shown) in turn through, for example, the CVD technique. Thereafter, the stacked film of the insulator film 173, the amorphous silicon layer 162a, and the insulator film 174 is processed into stripes extending in the first direction through the photolithography and the etching technique.

In this situation, each stripe pattern of the stacked film of the insulator film 173, the amorphous silicon layer 162a, and the insulator film 174 is formed immediately above a center region between the amorphous silicon layers 161a adjacent to each other in the second direction. That is, the stacked film of the insulator film 173, the amorphous silicon layer 162a, and the insulator film 174 is formed immediately above the insulator film 151 that contacts with the sidewall opposite to a side at which the insulator film 131 and the amorphous silicon layer 161a are formed, on the sidewall of the amorphous silicon layer 141a in the second direction. Also, the respective widths of the stripe patterns in the second direction are set to be substantially identical with that width of the insulator film 151 existing between the adjacent amorphous silicon layers 141a in the same direction. With this configuration, the upper surfaces of the amorphous silicon layer 142a doped with the n-type impurities (for example, As (arsenic)) and the insulator film 172 are exposed. Accordingly, the amorphous silicon layer 142a is formed immediately above the region between the respective amorphous silicon layers 141a adjacent to each other in the second direction.

Thereafter, the insulator film 132 is formed (deposited) on the overall main surface of the semiconductor substrate 1 (not shown) through, for example, the CVD technique, so as not to be completely embedded in the grooves of the stripe pattern including the insulator film 173, the amorphous silicon layer 162a, and the insulator film 174. The insulator film 132 forms the gate insulator film of the second select transistor. Then, the insulator film 132 on the upper surface of the insulator film 174, and the insulator film 132 on the respective upper surfaces of the amorphous silicon layer 142a and the insulator film 172 are removed by etch-back.

Thereafter, an amorphous silicon layer 143a forming the polysilicon layer 143p (refer to FIG. 2) of the second select transistor is formed. The amorphous silicon layer 143a is formed on the overall main surface of the semiconductor substrate 1 (not shown) through, for example, the CVD technique so as not be completely embedded in the grooves of the stripe pattern including the insulator film 173, the amorphous silicon layer 162a, and the insulator film 174. Then, the amorphous silicon layer 143a on the insulator film 174 and the amorphous silicon layer 143a on the upper surface of the insulator film 172 are removed by etch-back.

Figure 14:
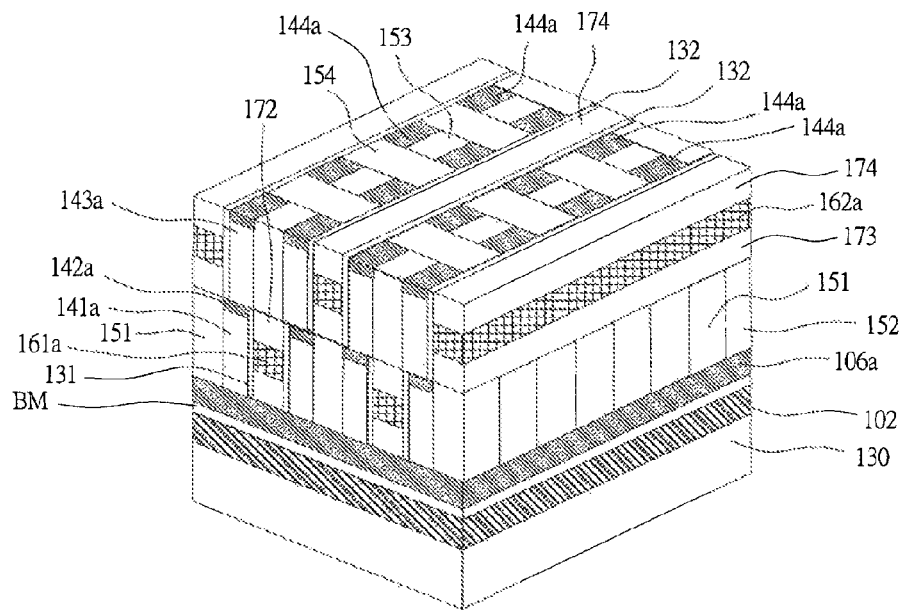
FIG. 14 is a bird's eye view illustrating the method of producing the vertical chain memory subsequent to FIG. 13.

Then, as illustrated in FIG. 14, after the insulator film 153 has been completely embedded in the grooves of the stripe pattern including the insulator film 173, the amorphous silicon layer 162a, and the insulator film 174, the insulator film 153 is processes in the stripes extending in the second direction. Also, each amorphous silicon layer 143a on the lower portion between the respective insulator films 153 processed into the stripes is removed. In this situation, the amorphous silicon layer 143a is not completely removed and divided in the space between the insulator films 153 adjacent to each other in the first direction, and the amorphous silicon layer 162a is not processed. The strip shape of the insulator film 153 is determined so that the pattern of the amorphous silicon layer 143a remains immediately above the amorphous silicon layer 142a.

Then, after the insulator film 154 has been embedded in the spaces between the insulator films 153, the upper portion of the insulator film 154 is removed through a CMP technique to expose an upper surface of the amorphous silicon layer 143a. Then, arsenic (As) which is n-type impurities is introduced onto the upper surface of the amorphous silicon layer 143a through the ion implanting technique to form an amorphous silicon layer 144a on an upper surface of the amorphous silicon layer 143a.

Thus, the same structure as the structure having the amorphous silicon layers 141a, 142a, 161a, and the insulator film 131 formed on the amorphous silicon layer 106a in the previous processes including the process in FIG. 12 is formed on the respective upper surfaces of the insulator films 131, 151, 152, 172, and the amorphous silicon layer 142a through the processes described with reference to FIGS. 13 and 14.

Figure 15:
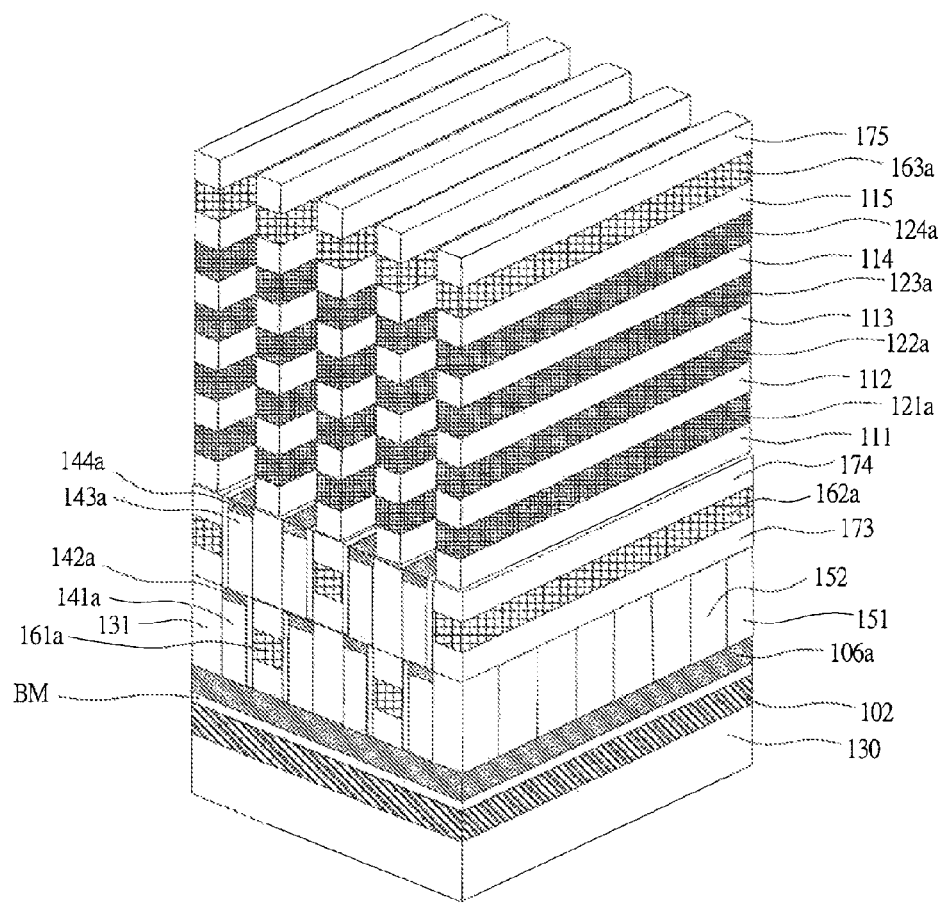
FIG. 15 is a bird's eye view illustrating the method of producing the vertical chain memory subsequent to FIG. 14.

Then, as illustrated in FIG. 15, the stacked film in which the insulator film 111, an amorphous silicon layer 121a, the insulator film 112, an amorphous silicon layer 122a, the insulator film 113, an amorphous silicon layer 123a, the insulator film 114, an amorphous silicon layer 124a, the insulator film 115, an amorphous silicon layer 163a, and the insulator film 175 are formed in order is formed on the overall main surface of the semiconductor substrate 1 (not shown). Thereafter, the stacked film is processed into stripes extending in the first direction to form a plurality of grooves extending from an upper surface of the insulator film 175 to an upper surface of the amorphous silicon layer 144*a*.

Figure 16:
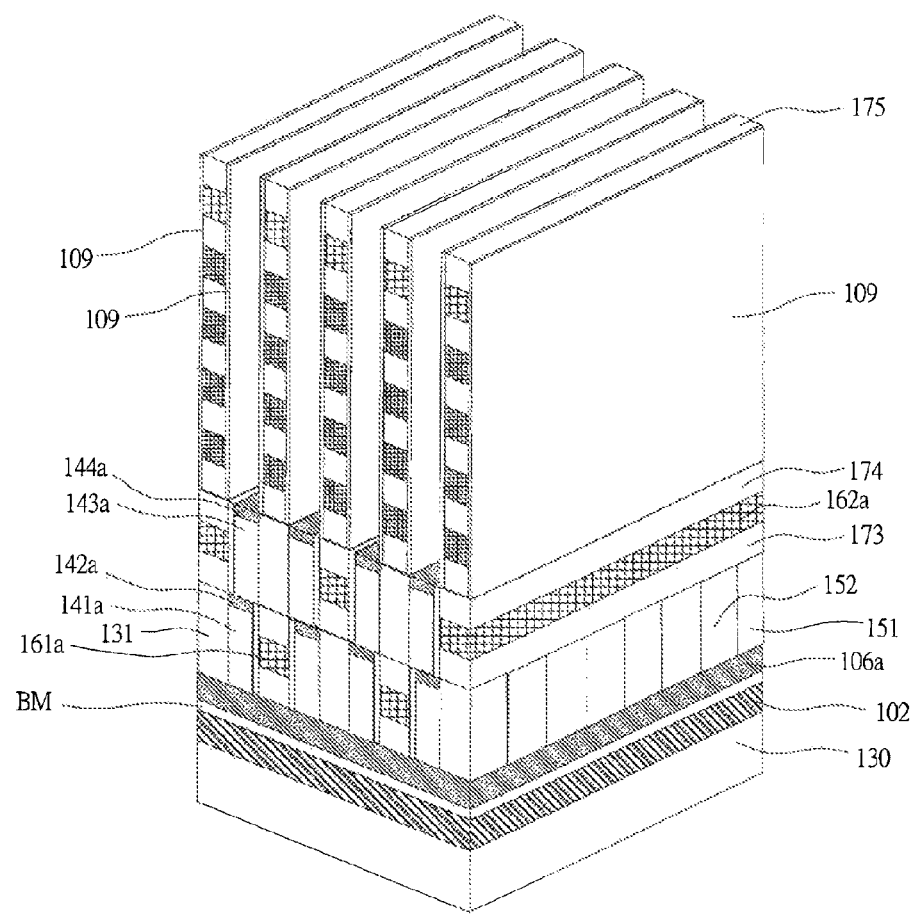
FIG. 16 is a bird's eye view illustrating the method of producing the vertical chain memory subsequent to FIG. 15.

Then, as illustrated in FIG. 16, the insulator film 109 is so formed as not to be completely embedded in the grooves. The insulator film 109 forms the gate insulator film of the memory cell portion. Thereafter, the insulator film 109 on the upper super of the insulator film 175, and the bottom of the grooves, that is, the insulator film 109 on the upper surface of the amorphous silicon layer 144*a* are removed by etch-back, and the insulator film 109 remains on only the sidewalls of the stacked film.

Figure 17:
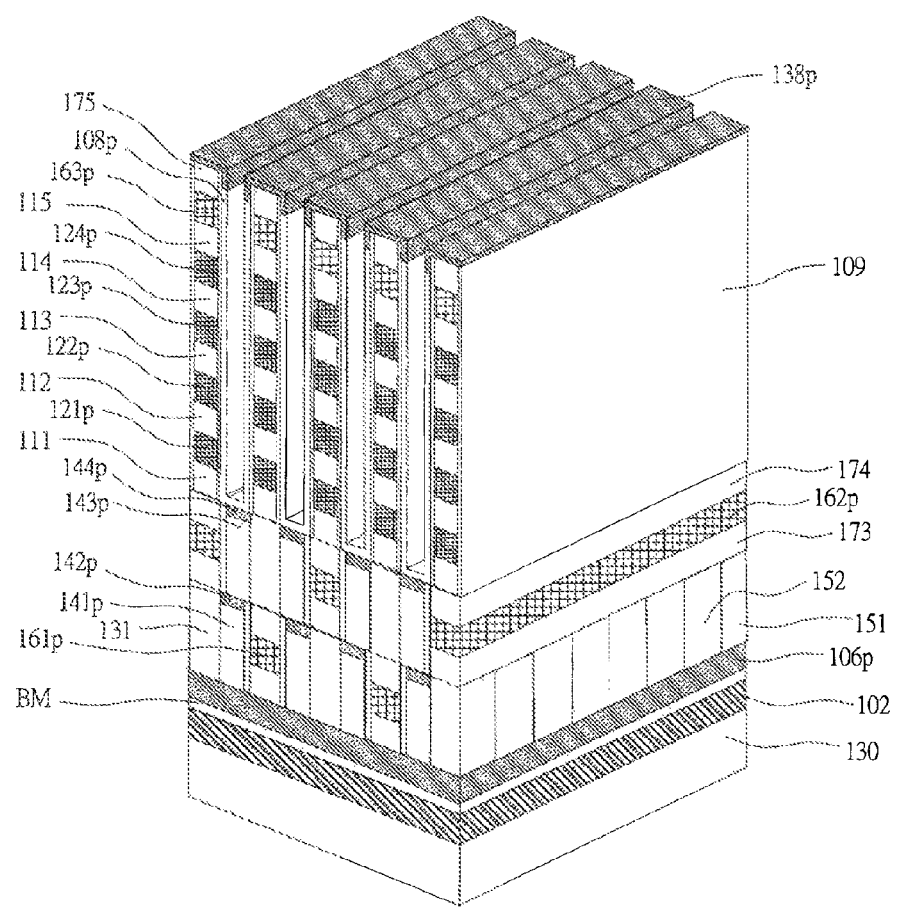
FIG. 17 is a bird's eye view illustrating the method of producing the vertical chain memory subsequent to FIG. 16.

Then, as illustrated in FIG. 17, a first amorphous silicon layer forming the polysilicon layer 108*p* (refer to FIG. 2) and a protection insulator film are formed in order. The first amorphous silicon layer is so formed as not to completely be embedded in the groove, and the protection insulting film is so formed as not to be completely embedded in the grooves. Thereafter, arsenic (As) or phosphorus (P) which is n-type impurities is implanted by ion implantation, and introduced onto the upper surface of the first amorphous silicon layer. In the first amorphous silicon layer, the ion-doped portion functions as the second amorphous silicon layer.

In this case, As or P doped (introduced) depth reaches not only the upper surface of the insulator film 175 but also apart of the first amorphous silicon layer on the side surfaces of the insulator film 175. Thus, why the second amorphous silicon layer is formed is to suppress an increase of the contact resistance with the bit line 103 (refer to FIG. 2) to be described later. However, the first amorphous silicon layer formed on the side surface portions of the amorphous silicon layer 163*a* (refer to FIG. 16) is not doped, and the gate operation of the amorphous silicon layer 163*a* is not prevented. With the formation of the protection insulator film, the impurities are not introduced in the first amorphous silicon layer on the bottom of the grooves.

Thereafter, the amorphous silicon layers 106*a*, 161*a*, 162*a*, 141*a*, 142*a*, 143*a*, 144*a*, 121*a*, 122*a*, 123*a*, 124*a*, 163*a*, the first amorphous silicon layer, and the second amorphous silicon layer are crystallized, and the impurities included in those layers are activated due to annealing. Thereafter, the protection insulator film is removed. As a result, the amorphous silicon layers 106*a*, 142*a*, 144*a*, 161*a*, 162*a*, 121*a*, 122*a*, 123*a*, 124*a*, 163*a*, 141*a*, and 143*a* become the polysilicon layers 106*p*, 142*p*, 144*p*, 161*p*, 162*p*, 121*p*, 122*p*, 123*p*, 124*p*, 163*p*, 141*p*, and 143*p*, respectively. Due to this annealing, the above-mentioned first amorphous silicon layer becomes the polysilicon layer 108*p*, and the second amorphous silicon layer becomes the polysilicon layer 138*p*.

Figure 18:
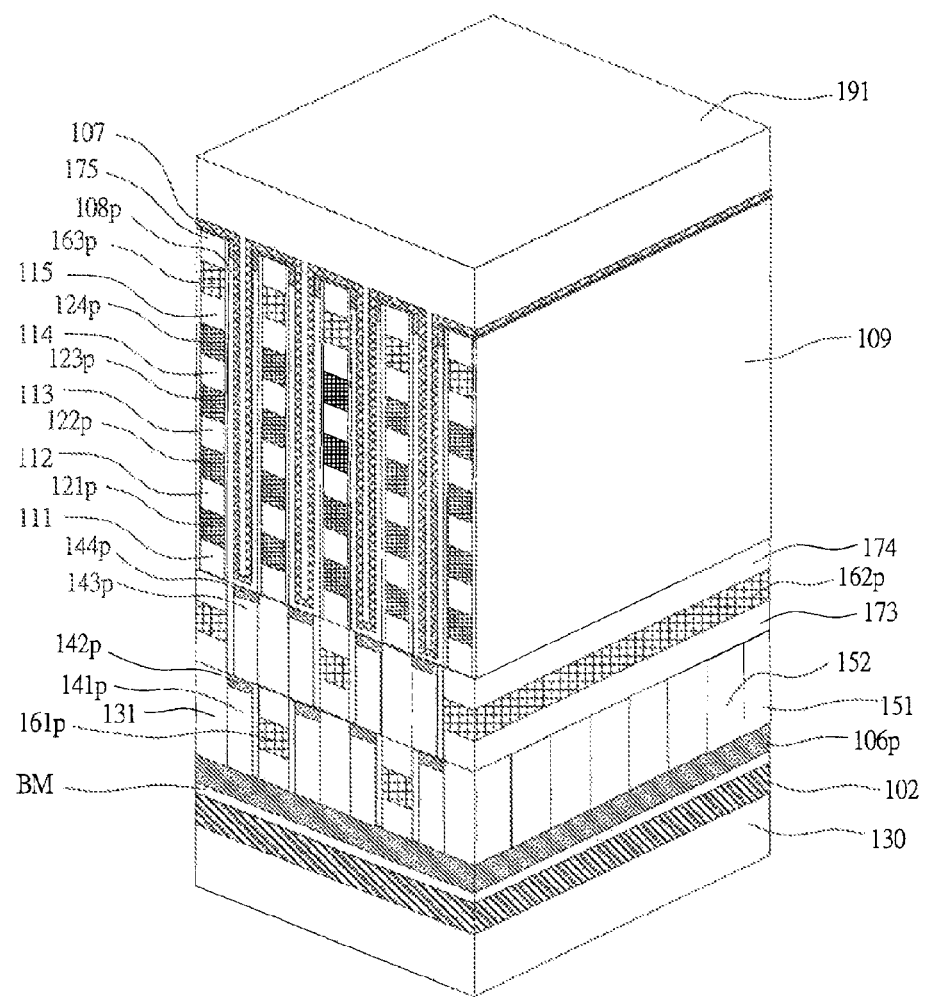
FIG. 18 is a bird's eye view illustrating the method of producing the vertical chain memory subsequent to FIG. 17.

Then, as illustrated in FIG. 18, after the phase change material layer 107 is so formed as not to be completely embedded in the groove through, for example, the CVD technique, the insulator film 191 is so formed as to be completely embedded in the grooves.

Figure 19:
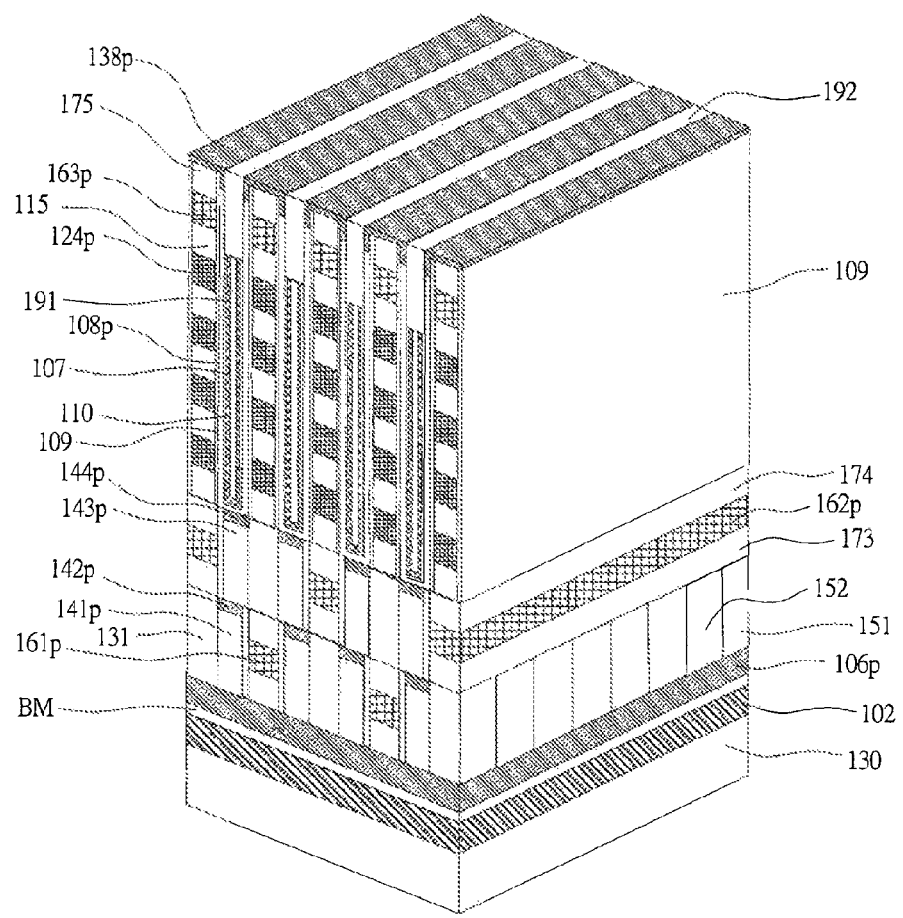
FIG. 19 is a bird's eye view illustrating the method of producing the vertical chain memory subsequent to FIG. 18.

Then, as illustrated in FIG. 19, the phase change material layer 107 and the insulator film 191 are removed to the same height as that of the insulator film 115 by etch-back, the heights of the respective upper surfaces of the phase change material layer 107 and the insulator film 191 are retreated to positions higher than the bottom surface of the insulator film 115 and lower than the upper surface of the insulator film 115. Subsequently, the insulator film 192 is formed on the phase change material layer 107, the insulator film 191, and the insulator film 115 to bury the grooves. Thereafter, the insulator film 192 is etched back to remove the upper portion of the insulator film 192, and the upper surface of the polysilicon layer 138*p* is exposed.

Thereafter, although not shown in FIG. 19, the contact plug BLC illustrated in FIG. 1, that is, a connection member for connecting the bit line 103 and the peripheral circuits formed on the semiconductor substrate 1 is formed.

Figure 20:
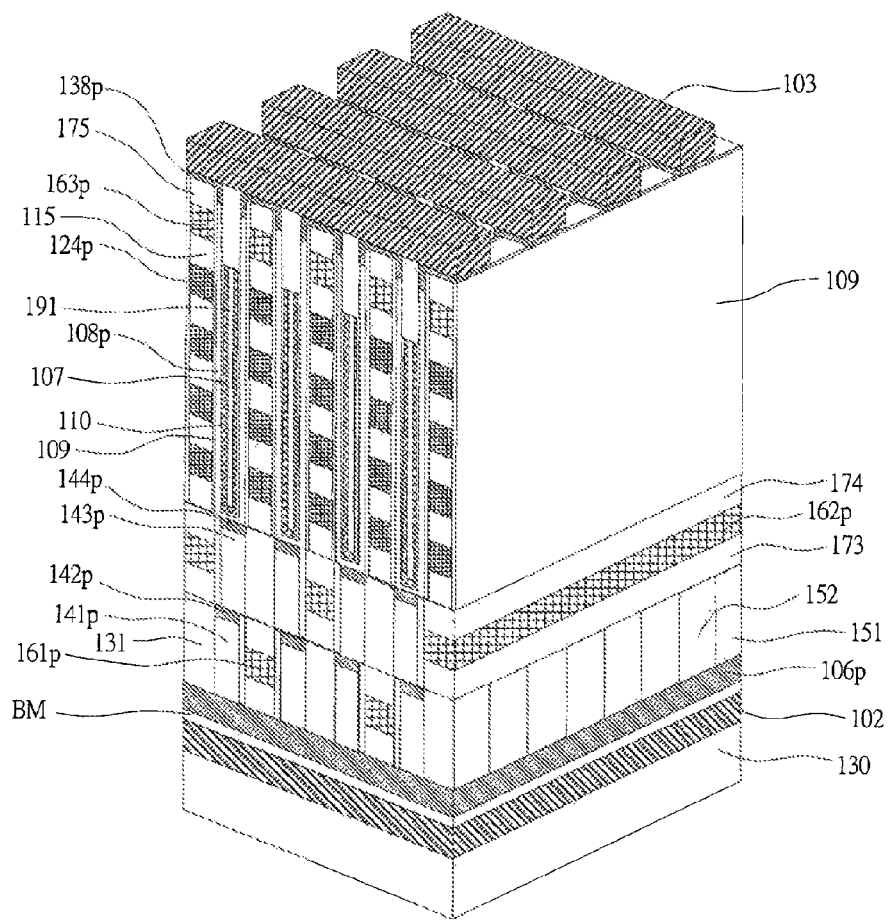
FIG. 20 is a bird's eye view illustrating the method of producing the vertical chain memory subsequent to FIG. 19.

Then, as illustrated in FIG. 20, a conductive material layer is formed on the polysilicon layer 138*p* and the insulator film 192 formed in the previous processes including the process of FIG. 19. Thereafter, the conductive material layer is processed into stripes extending in the first direction, and the bit lines 103 made of the conductive material layer are formed. Thereafter, the polysilicon layer 138*p*, the insulator film 192, the polysilicon layer 108*p*, the insulator film 110, the phase change material layer 107, and the insulator film 191 immediately below the regions between the respective adjacent bit lines 103 are removed.

In the above process, the stacked film of the polysilicon layers 121*p*, 122*p*, 123*p*, 124*p*, 163*p*, and the insulator films 111, 112, 113, 114, 115, 175, and the insulator film 109 immediately below the regions between the adjacent bit lines 103, which are portions processed into the stripes remain without being processed. On the other hand, the polysilicon layer 108*p*, the polysilicon layer 138*p*, the phase change material layer 107, and the insulator film 110 are removed.

Thereafter, the overall memory cell array formed in the above process is embedded in an interpoly dielectric film. In this case, the interpoly dielectric film to be embedded is formed of the insulator film 133 illustrated in FIG. 5(*b*), the spaces between the phase change material layers 107 adjacent to each other in the first direction, which are regions immediately below the regions between the stripe bit lines 103 illustrated in FIG. 20, are embedded in the insulator film 133.

Subsequently, contact plugs (not shown) connected to the polysilicon layers 121*p*, 122*p*, 123*p*, and 124*p* illustrated in FIG. 2, a contact plug (not shown) connected to the polysilicon layer 163*p*, and contact plugs (not shown) connected to the polysilicon layers 161*p* and 162*p* are formed. Also, the lines GL1, GL2, GL3, GL4, Stan, STbn, STcO, and STcE are formed, and contact plugs (not shown) that connect those lines and the peripheral circuit are formed. Further, the contact plug GBLC and the global bit line GBL are formed to complete the non-volatile storage device according to this embodiment illustrated in FIG. 1.

Then, the operation of the two-layer select transistors according to this embodiment will be described with reference to FIG. 2. In the two-layer select transistors according to this embodiment, the gate of the first select transistor and the gate of the second select transistor are formed at positions displaced in the second direction. The polysilicon layer 161*p* is formed on one sidewall of the channel semiconductor layer of the two-layer select transistors including the polysilicon layers 141*p*, 143*p*, and the polysilicon layers 142*p*, 144*p*, and the polysilicon layer 162*p* is formed on the opposite sidewall.

In FIG. 2, channels of an on-state are indicated by the same down arrows as a direction of current, and channels of an off-state are indicated by a mark X. The two-layer select transistors become on only when both channels of the first select transistor and the second select transistor become on. In a notation method of FIG. 2, the two-layer select transistors become on at only portions where the arrows are indicated in both of the two-layer channels connected in series.

Accordingly, when an on-voltage is applied to both of the polysilicon layers 161*p* and 162*p* arranged on both sides of the channel to be turned on, and an off-voltage is applied to the other gates, the channel of the two-layer select transistors can be turned on at only one portion of one bit line 103. That is, in the non-volatile storage device according to this embodiment, because two select transistors (two-layer select transistors) are connected to one memory cell, when the respective gates of a part of the first select transistor and the second select transistor are turned on to select the channel semiconductor between those gates, thereby being capable of allowing the current to flow in the memory cell on top of the channel semiconductor. In this situation, for example, when the gate of the first select transistor turns on, the other first select transistors adjacent to each other between which the gate of the channel of the first select transistor to be turned on is interposed also turn on. However, when the second select transistor on top of the other first select transistors is turned off, thereby being capable of preventing a current from flowing in the memory cells connected to the other first select transistors.

If the select transistors are formed in not two layers but only one layer, when the select transistor is to be turned on, two channels adjacent to both sides of the select transistor become on, and current is allowed to flow in two memory cells. As a result, the respective memory cells can be selected, separately. In this case, because two memory cells cannot be controlled, separately, the storage capacity of the semiconductor storage device is remarkably reduced for the number of memory cells. On the contrary, in this embodiment, as in the semiconductor storage device disclosed in PTL 4, one gate line is turned on, thereby being capable of avoiding a reduction in the capacity caused by multi-selecting both of two channels adjacent to both sides of the gate line, and the memory cells connected to those channels.

Also, when the polysilicon layer 163p is arranged immediately above the polysilicon layer 161p, if the select transistors having those polysilicon layers as gates are to be turned on, the channels adjacent to both sides of those polysilicon layers are turned on, and only one channel semiconductor cannot be selected. On the contrary, in this embodiment, the polysilicon layer 163p is not arranged immediately above the polysilicon layer 161p, to thereby prevent a current from flowing into both of the channel semiconductors of the adjacent two-layer select transistors.

Therefore, in the non-volatile storage device according to this embodiment, in the memory cell array in which a plurality of vertical unit cells each having the plurality of memory cells is arranged in a matrix, because the respective unit cells can be selected and operated by the two-layer select transistors, individually, the capacity of the memory can be increased, and the performance of the non-volatile storage device can be improved.

Figure 21:
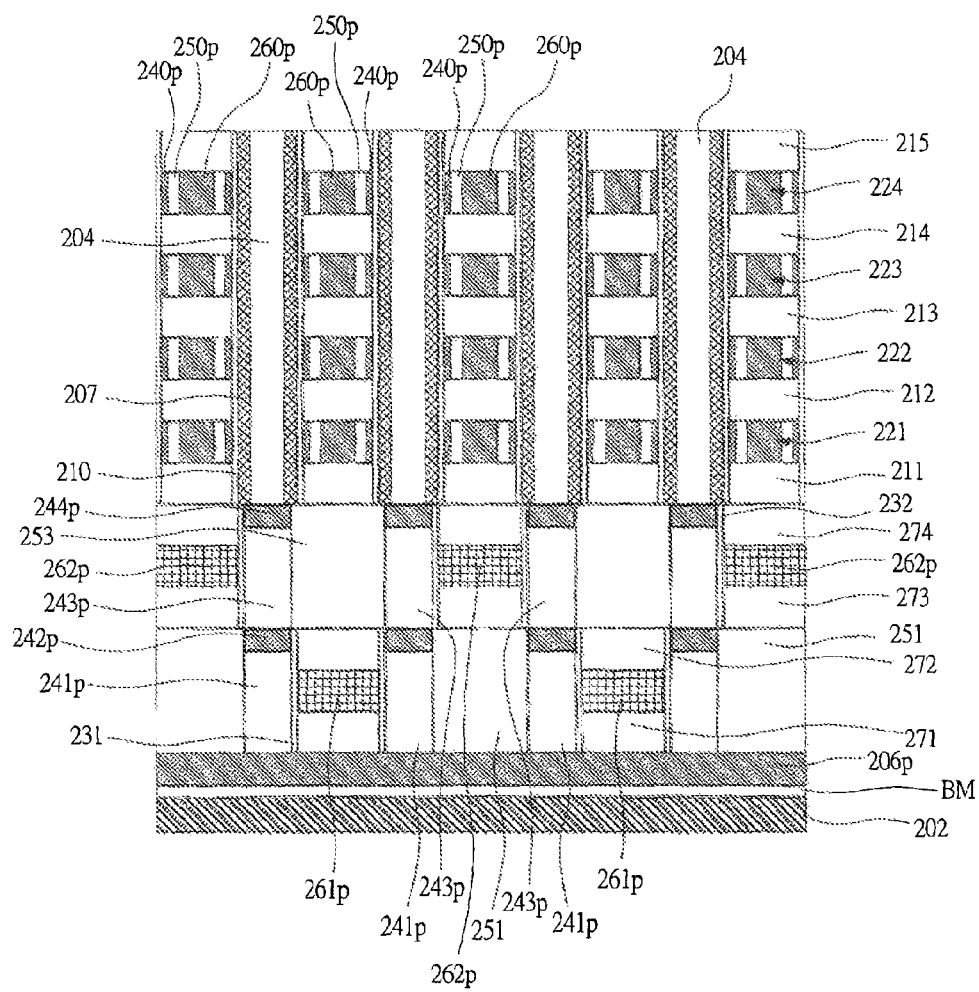
FIG. 21 is a cross-sectional view of a vertical cross-point memory according to a modified example of the first embodiment of this invention.
Figure 22:
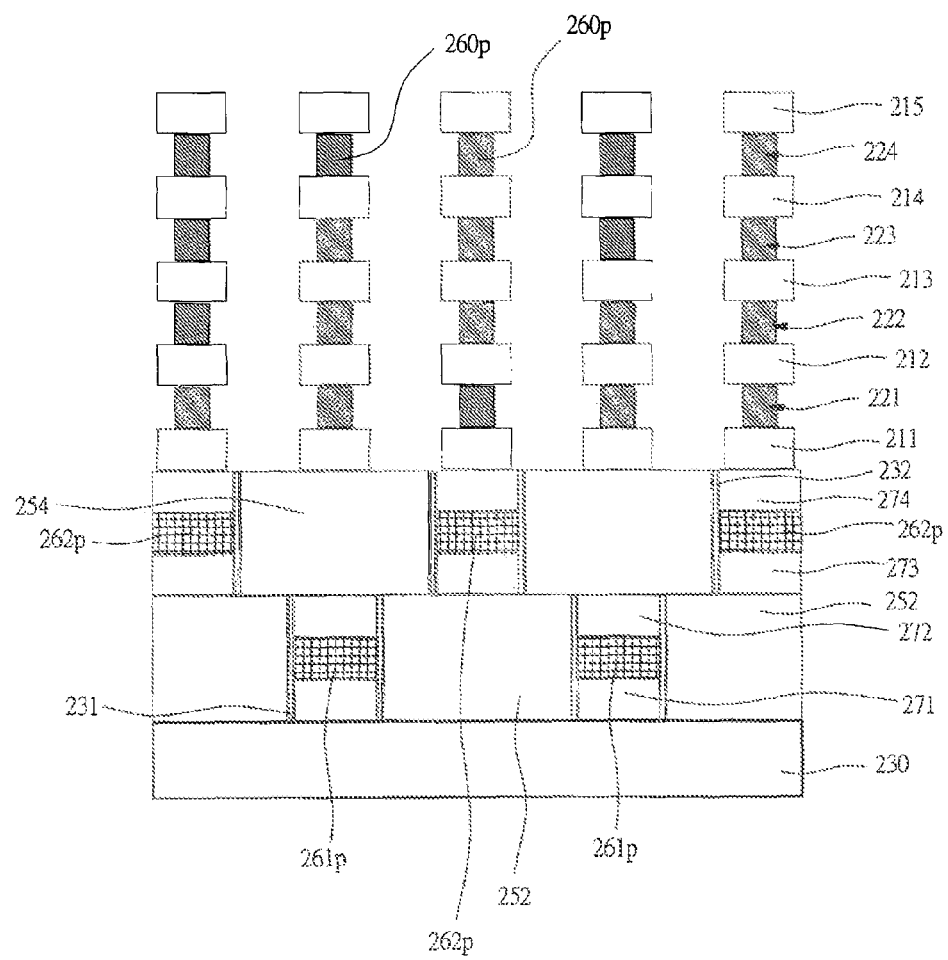
FIG. 22 is a cross-sectional view of the vertical cross-point memory according to the modified example of the first embodiment of this invention.

In FIGS. 1 to 20 described above, the operation of the vertical chain memory and the production method thereof are described. However, the two-layer select transistors according to this embodiment can be applied to memories of other types. A case in which this invention is applied to a vertical cross-point memory will be described. FIGS. 21 and 22 are cross-sectional views illustrating the memory cell array which is a part of the non-volatile storage device of the vertical cross-point memory which is another type different from that of the vertical chain memory in a modified example of this embodiment.

FIGS. 21 and 22 are cross-sectional views illustrating a portion of the memory cell array of the vertical cross-point memory in the non-volatile storage device according to this embodiment. FIG. 21 is a cross-sectional view along the second direction orthogonal to the first direction along the main surface of the semiconductor substrate (not shown), including source electrodes 202 which are a plurality of word lines formed in stripes. FIG. 22 is a cross-sectional view along the second direction, including the space portions between the source electrodes 202 formed in the stripes. The vertical cross-point memory illustrated in FIGS. 21 and 22 has a structure similar to the vertical chain memory described with reference to FIGS. 1 to 20. A configuration of the memory cells on the two-layer select transistors is different from that in the vertical chain memory. Also, the source electrode 202, the barrier metal layer BM, and a polysilicon layer 206p illustrated in FIG. 21 are formed into stripes along the second direction. Also, no bit line is formed on top of the memory cell array of the vertical cross-point memory illustrated in FIGS. 21 and 22.

However, the two-layer select transistors which are the features of this invention have completely the identical configuration with that of the above-mentioned vertical chain memory. That is, the stripe pattern extending in the first direction, and formed of the stacked film of an insulator film 271, a polysilicon layer 261p, and an insulator film 272 is formed on a polysilicon layer 206p. A plurality of columnar polysilicon layers 241p is formed through an insulator film 231 on each of both sidewalls of the pattern in the second direction so as to be aligned in the first direction. A polysilicon layer 242p doped with impurities with a concentration higher than that of the polysilicon layers 241p is formed on top of the polysilicon layers 241p, and an insulator film 251 is formed on a sidewall opposite to the sidewall of the polysilicon layers 241p on which the insulator film 231 is formed.

Also, a second select transistor having the same structure as that of the first select transistor is arranged on the first select transistor having the polysilicon layers 241p, the polysilicon layer 242p, and the polysilicon layer 261p. Like the vertical chain memory, the polysilicon layer 262p is not arranged immediately above the polysilicon layer 261p, but the polysilicon layer 262p is formed immediately above the insulator film 251, and extends in the first direction. That is, the stripe pattern extending in the first direction, and formed of the stacked film of an insulator film 273, a polysilicon layer 262p, and an insulator film 274 is formed on the insulator film 251. A plurality of columnar polysilicon layers 243p is formed through an insulator film 232 on each of both sidewalls of the pattern in the second direction so as to be aligned in the first direction. A polysilicon layer 244p doped with impurities with a concentration higher than that of the polysilicon layers 243p is formed on top of the polysilicon layers 243p, and an insulator film 253 is formed on a sidewall opposite to the sidewall of the polysilicon layers 243p on which the insulator film 232 is formed.

Also, as is understood from FIG. 22, the polysilicon layers 241p and 243p are not formed immediately above the regions between the source electrodes 202 in the first direction, and the two-layer select transistors is divided in the first direction into a plurality of pieces. In the first direction, an insulator film 230 is formed between the respective patterns including the source electrode 202, the barrier metal layer BM, and the polysilicon layer 206p. Insulator films 252 and 254 are formed between the respective polysilicon layers 261p formed in the stripes, and between the respective polysilicon layers 262p, respectively.

As illustrated in FIG. 21, each of electrode layers 221 to 224 is of a structure in which a plurality of films are stacked together in the second direction. For example, the electrode layer 221 includes, above the source electrode 202, a polysilicon layer 260p having an n-type conductivity type in a center thereof, polysilicon layers 250p doped with impurities with a low concentration which are formed on both sidewalls of the polysilicon layer 260p in the second direction, and polysilicon layers 240p having a p-type conductivity type which are formed on the sidewalls through the polysilicon layers 250p. The impurity concentration of the polysilicon layers 250p is lower than the impurity concentrations of the polysilicon layer 260p and the polysilicon layers 240p. As illustrated in FIG. 22, the polysilicon layers 240p and 250p are removed immediately above the regions between the respective source electrodes 202 (refer to FIG. 21). Each of the electrode layers 222, 223, and 224 has the same structure as that of the above electrode layer 221.

The stacked film of an insulator film 211, the electrode layer 221, an insulator film 212, the electrode layer 222, an insulator film 213, the electrode layer 223, an insulting film 214, the electrode layer 224, and an insulator film 215, which are stacked in order from the source electrode 202 side illustrated in FIG. 21 is patterned in stripes in the first direction.

An insulator film 210 and a phase change material layer 207 are formed in order on both sidewalls of the pattern in the second direction in the space portions between the respective patterns and immediately above the source electrode 202. A metal electrode 204 formed between the respective phase change material layers 207 formed on facing sidewalls of the pattern is embedded in the grooves between the respective patterns. A bottom of the metal electrode 204 is electrically connected with the polysilicon layer 244p doped with n-type impurities (for example, As (arsenic)). The insulator film 110 is a layer for preventing diffusion between the phase change material layer 207 and the polysilicon layer 240p of each outermost layer which is the electrode line.

Each memory cell of the cross-point memory includes a diode including the polysilicon layers 240p, 250p and 260p, and phase change material layers 207p. A plurality of memory cells formed on both sides of the metal electrode 204 along the stacked film in the second direction is connected directly to the respective metal electrodes 204 extending in the direction perpendicular to the main surface of the semiconductor substrate, and electrically connected to the metal electrodes 204. Also, the source electrode 202 and the metal electrode 204 are electrically connected to each other through the first select transistor and the second select transistor which are connected in series with each other.

As illustrated in FIG. 22, the metal electrode 204, the phase change material layer 207, the insulator film 210, and the polysilicon layers 240p, 250p are removed in the regions between the respective patterns and immediately above the space portions between the respective source electrodes 202 (refer to FIG. 21). Insulator films 233 (refer to FIG. 24(b)) are actually formed in each region between the respective stripe patterns extending in the first direction, which are patterns including the insulator films 211 to 215 and the polysilicon layer 260p illustrated in FIG. 22. The insulator film 233 is omitted in FIG. 22.

In a region outside of the memory cell array illustrated in FIGS. 21 and 22, although not shown, the respective gate lines and the metal electrodes within the memory cell array are connected to the peripheral circuits as with the vertical chain memory. That is, the contact plug that connects the source electrode 202 and the field effect transistor formed on the semiconductor substrate 1 (not shown) is formed at the bottom of the source electrode 202. The source electrode 202 is a plurality of metal lines extending in stripes in the second direction, and the gate line for feeding a current to the polysilicon layers 261p and 262p of the two-layer select transistors extends in the first direction on an upper layer of the memory cell array.

Also, the respective gate lines are connected to the peripheral circuits formed on the semiconductor substrate 1 (not shown) through the contact plug. Because each of the electrode layers 221 to 224 is formed so that the stripe patterns arranged alternately are integrally joined together in the respective layers, the electrode layers adjacent to each other in the second direction are isolated from each other.

Also, the polysilicon layers 261p and 262p which are the gates of the first select transistor and the second select transistor are alternately connected to different gate lines through the gate contact plugs so that respective independent voltages can be applied thereto.

Figure 23:
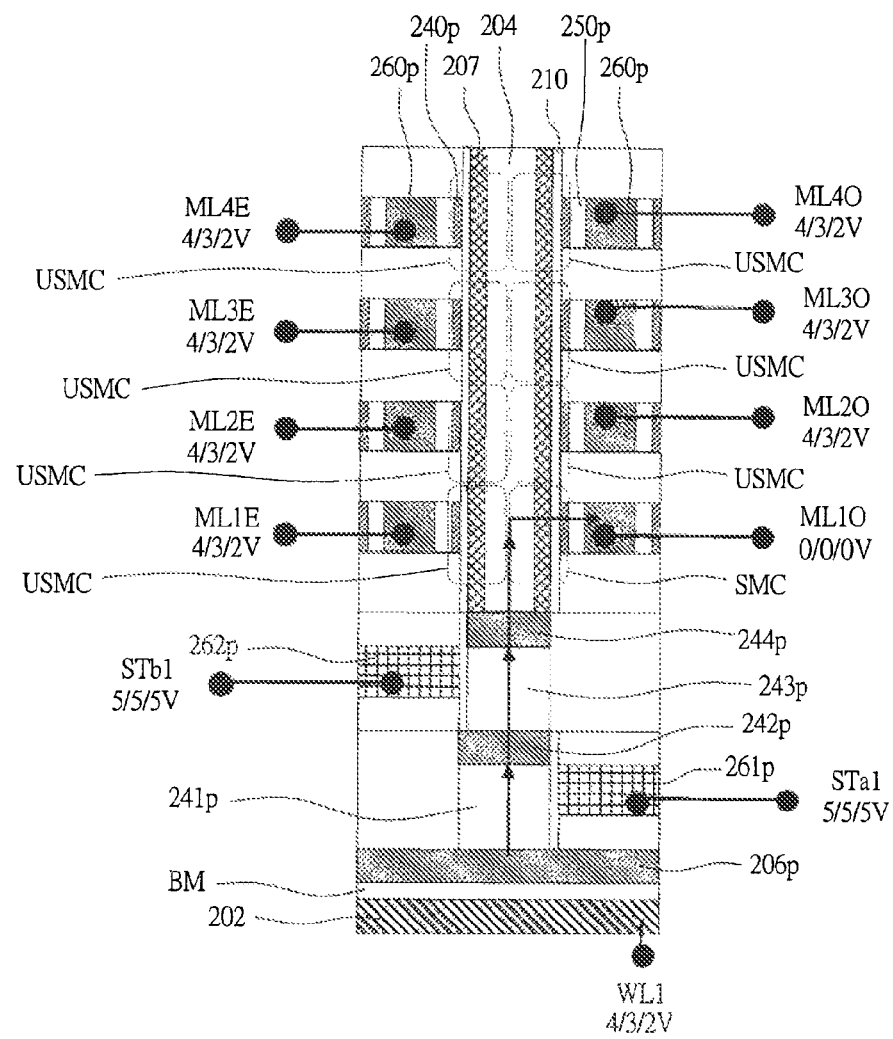
FIG. 23 is a cross-sectional view illustrating the operation of the vertical cross-point memory according to the modified example of the first embodiment of this invention.
Figure 24A:
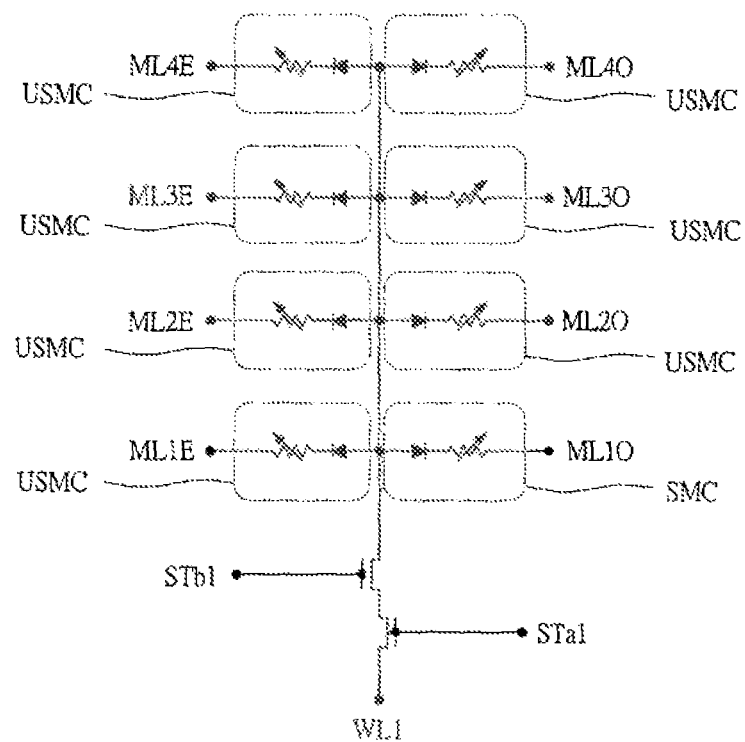
FIG. 24(a) is an equivalent circuit diagram illustrating the operation of the vertical cross-point memory illustrated in FIG. 23.
Figure 24B:
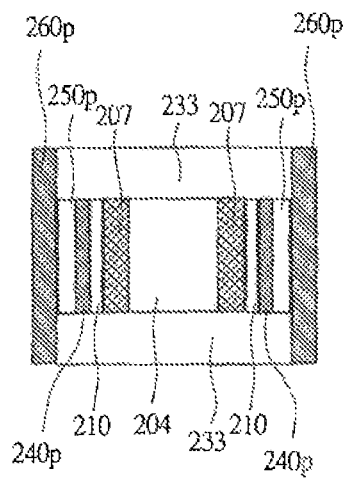
FIG. 24(b) is a broken top view illustrating the vertical cross-point memory illustrated in FIG. 23.

FIG. 23 illustrates the memory cells configuring the memory cell array illustrated in FIG. 21. Also, FIG. 24(a) illustrates an equivalent circuit diagram of the memory cell in FIG. 23, and FIG. 24(b) illustrates a partially broken top view of the vertical chain memory which is a cross-section including the electrode layer 221. As illustrated in FIG. 24(b), between the respective polysilicon layers 260p extending in the first direction, there are a region in which the polysilicon layers 250p, 240p, the insulator film 210, the phase change material layer 207, and the metal electrode 204 are formed in order from each of the facing sidewalls of the polysilicon layer 260p, and regions in which only each insulator film 233 is formed.

In the cells where diodes including the polysilicon layers 240p, 250p, and 260p formed in each memory cell, and memory layers including the phase change material layer 207 are connected at intersections of the metal electrode 204 which is the vertical line, and the electrode layers 221 to 224 which are the lateral lines as illustrated in FIG. 23, that is, the vertical cross-point memory, for example, the following operation is conducted. In the following description, when "0V" is merely said, it is meant that 0 V is applied in any cases of the reset operation, the set operation, and the read operation.

4, 3, and 2 V are applied to a word line WL1 connected with the select cell SMC in the reset operation, the set operation, and the read operation, respectively. 0V is applied to a line ML1O connected with the select cell SMC, and 4, 3, and 2 V are applied to lines ML2O, ML3O, LM4O, ML1E, ML2E, ML3E, and ML4E not connected with the select cell SMC in the reset operation, the set operation, and the read operation, respectively. 5V is applied to the polysilicon layer 261p and the polysilicon layer 262p, and the channel turns on.

The lines ML2O, ML3O, LM4O, ML1E, ML2E, ML3E, and ML4E are lines connected to the polysilicon layer 260p. The polysilicon layer 260p arranged immediately above or below the polysilicon layer 260p for applying a voltage to the select cell SMC is connected to the line ML2O, ML3O, or LM4O, and the other polysilicon layer 260p is connected to the line ML1E, ML2E, ML3E, or ML4E.

In an unselected cell USMC, since a word line voltage is equal to the respective voltages of the lines ML2O, ML3O, LM4O, ML1E, ML2E, ML3E, and ML4E, a current does not flow into the diodes of the respective electrode layers, and a current flows into only the select cell SMC from the source electrode 202 to the line ML1O. In the reset operation and the set operation, a magnitude of the current flowing in the phase change material layer 207 in the select cell SMC is changed to change a resistivity of the phase change material layer 207. In the read operation, a current value flowing in the phase change material layer 207 of the select cell SMC is determined.

Subsequently, a description will be given of a voltage applying method of the respective lines when conducting the reset operation the set operation, and the read operation in the memory array in which a set of memory cells illustrated in FIG. 24(a) is arranged in a matrix as with the plurality of memory cells illustrated in FIG. 6 although not shown. A voltage can be applied to each of the polysilicon layers 261p and 262*p* of the first select transistor and the second select transistor illustrated in FIG. 23, independently.

Although not shown, as in FIG. 23, the voltage of the word line WL1 is set to 4/3/2 V in the reset operation, the set operation, and the read operation, respectively. 5V is applied to the line STa1 which is the gate line of the first select transistor in all of the set operation, the set operation, and the read operation, and 0V is applied to the other first select transistor gates. Also, 5V is applied to the line STb1 which is the gate line of the second select transistor, and 0V is applied to the other second select transistor gates. When the voltage is thus applied, only the two-layer select transistors in which both of the first select transistor and the second select transistor are on in only one portion in the direction along the word line WL1 can turn on.

In this example, the voltage (4/3/2V in this example) necessary for the reset/set/read operation is applied to the word line WL1, and the cell connected to the line (line ML1O) further selected in the portion where the two-layer select transistors turn on operates because a current flows through the cell between the word line WL1 and the above line.

The operation of the other cells will be described. That is, the voltage (4/3/2V in this example) necessary for the reset/set/read operation is applied to the word line WL1, and no current flows in the cell in which the same voltage as that of the word line WL1 is further applied to the line (for example, the line ML2O in FIG. 23) in the portion where the two-layer select transistors turn on, because the voltage is equal between the word line WL1 and the above line.

Also, 0V is applied to the word line in all of the reset/set/read operation, and no current flows in the cell in which 0V is also applied to the line in the portion where the two-layer select transistors turn on, because the voltage is equal between the word line and the above line.

Also, 0V is applied to the word line in all of the reset/set/read operation, and no current flows in the cell in which the voltage (4/3/2V in this example) necessary for the reset/set/read operation is further applied to the line in the portion where the two-layer select transistors turn on, because a reverse bias is applied to a diode including the polysilicon layers 240*p*, 250*p*, and 260*p* illustrated in FIG. 24 (*b*), and therefore the voltage is equal between the word line and the above line.

Also, in the portion where the two-layer select transistors turn off, no current flows because the portion is isolated from the word line. Also, between the cell in which the voltage (4/3/2V in this example) necessary for the reset/set/read operation is applied to the line and the cell to which 0V is applied, the reverse bias is applied to a diode including the polysilicon layers 240*p*, 250*p*, and 260*p* (refer to FIG. 24(*b*)) in the portion of the cell in which voltage necessary for the reset/set/read operation is applied to the line. Therefore, no current flows even between the lines.

Thus, even in the memory array in which a set of memory cells illustrated in FIG. 24 (*a*) is arranged in a matrix as with the plurality of memory cells illustrated in FIG. 6, a current flows only in the select cell SMC, and the cells can operate.

Figure 32:
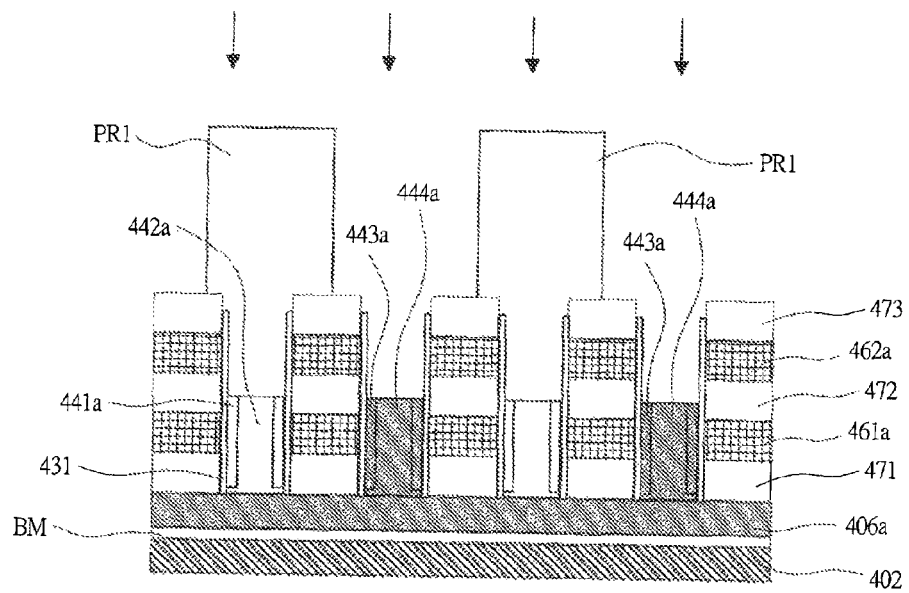
FIG. 32 is a cross-sectional view illustrating the method of producing the vertical chain memory subsequent to FIG. 31.

The vertical chain memory is described in FIGS. 1 and 2, and the vertical cross-point memory is described in FIGS. 32 to 24. The two-layer select transistors according to this embodiment can be further applied to memories of other types. Hereinafter, a description will be given of a case in which this invention is applied to a vertical flash memory according to a modified example of this embodiment.

Figure 25:
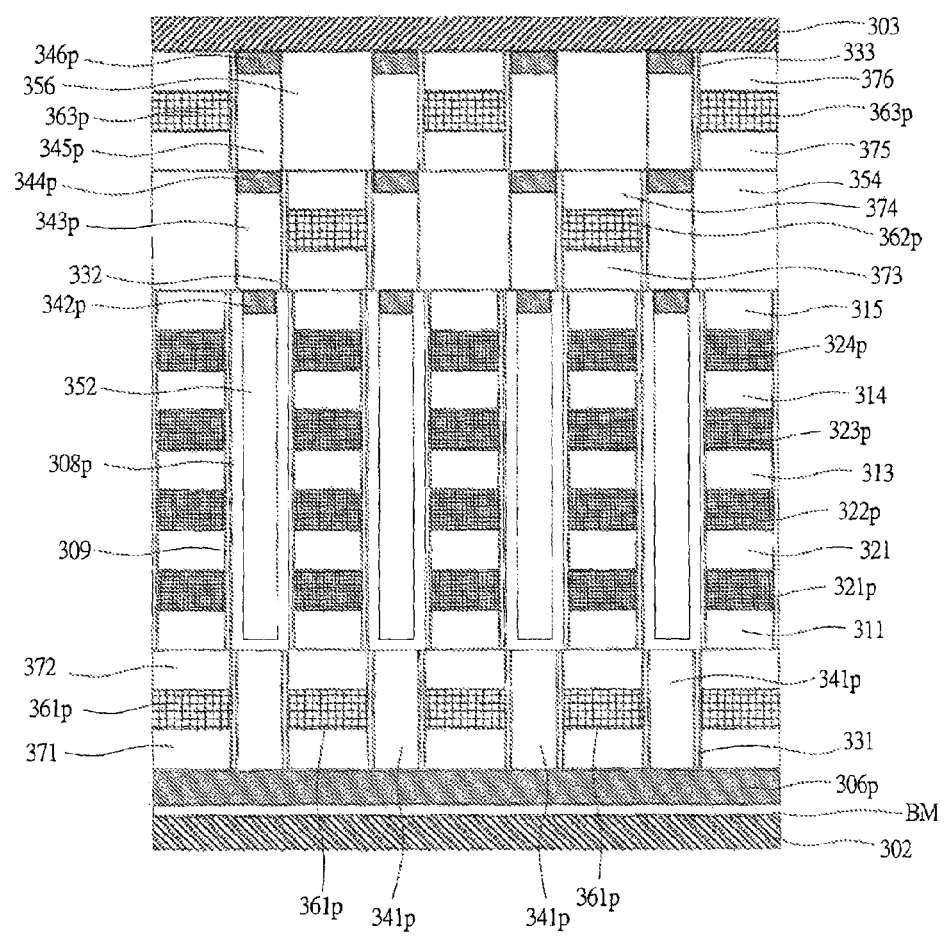
FIG. 25 is a cross-sectional view illustrating a vertical flash memory according to a modified example of the first embodiment of this invention.
Figure 26:
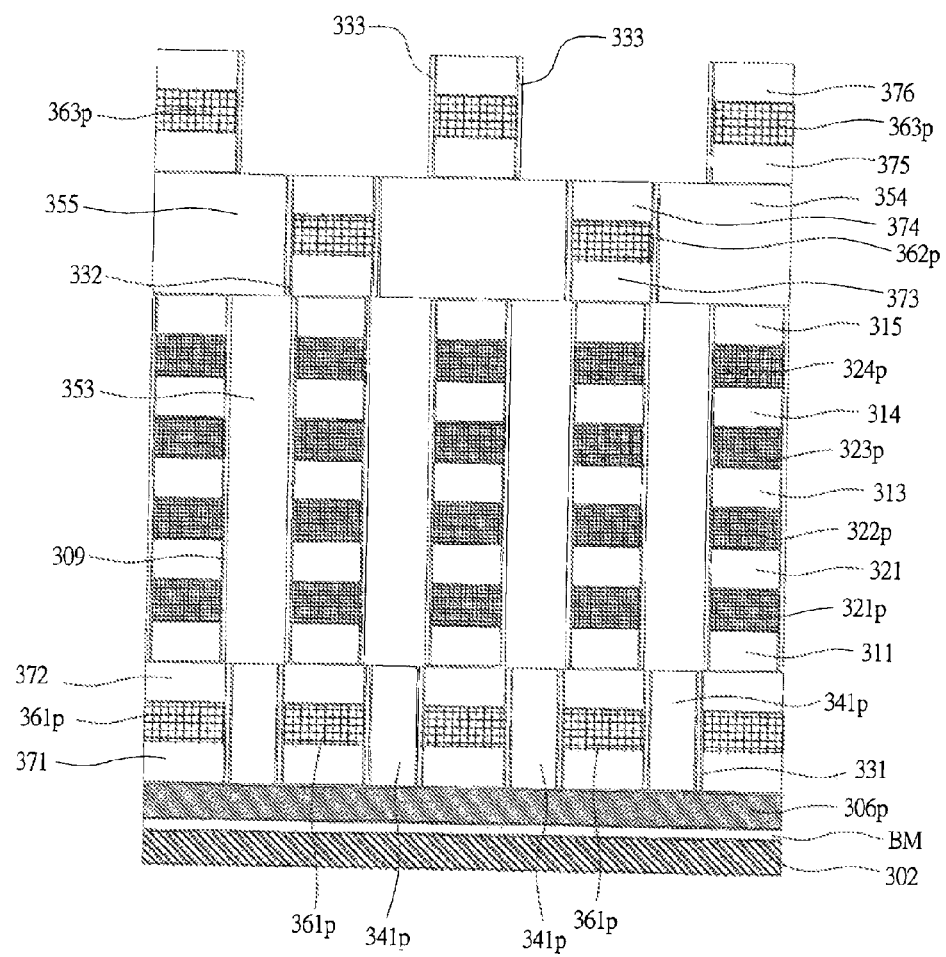
FIG. 26 is a cross-sectional view illustrating the vertical flash memory according to the modified example of the first embodiment of this invention.

FIGS. 25 and 26 are cross-sectional views illustrating a portion of the memory cell array of the vertical flash memory according to the modified example. As in the vertical chain memory, the vertical flash memory includes a plate-like source electrode 302, and a bit line 303 which is a stripe pattern extending in the second direction, and a memory cell array is arranged between the bit line 303 and the source electrode 302. FIG. 25 is a cross-sectional view illustrating the memory cell array including the bit line 303 along the second direction, and FIG. 26 is a cross-sectional view illustrating the memory cell array including space portions between the respective bit lines 303 along the second direction.

The vertical flash memory illustrated in FIGS. 25 and 26 is different from the vertical chain memory described with reference to FIGS. 1 to 20 in that the two-layer select transistors are formed on top of the memory cell, and the select transistor is further disposed at the bottom of the memory cell. Also, the structure of the vertical chain memory described with reference to FIGS. 1 to 20 is different from the vertical chain memory described with reference to FIGS. 1 to 20.

As illustrated in FIG. 25, a plate-like barrier metal layer BM and a plate-like polysilicon layer 306*p* are stacked together in order on the plate-like source electrode 302, and a stacked film including an insulator film 371, a polysilicon layer 361*p* which is a gate line, and an insulator film 372 is formed into stripes extending in the first direction on the polysilicon layer 306*p*. A polysilicon layer 341*p* is embedded between the stacked films adjacent to each other in the second direction through gate insulator films 331 formed on both sidewalls of the stacked films.

A plurality of memory cells is formed on the respective tops of the stacked film, the gate insulator films 331, and the polysilicon layer 341*p*, and the two-layer select transistors are formed on the plurality of memory cells. The two-layer select transistors of the vertical flash memory have the same structure as that of the two-layer select transistors of the vertical chain memory. That is, the first select transistor includes a stripe pattern of the stacked film having an insulator film 373 extending in the first direction, a polysilicon layer 362*p*, and an insulator film 374, and a columnar polysilicon layer 343*p* formed on both sidewalls of the stacked film in the second direction through gate insulator films 332. A plurality of the polysilicon layers 343*p* is intermittently aligned in the first direction in contact with the gate insulator films 332, and arranged in a matrix two-dimensionally. A polysilicon layer 344*p* higher in the impurity concentration than the polysilicon layer 343*p* is formed on top of the polysilicon layer 343*p*, and an insulator film 354 is embedded in one sidewall of the polysilicon layer 343*p* where the polysilicon layer 362*p* is not formed.

Also, the second select transistor formed on the first select transistor also has the same structure as that of the first select transistor. That is, the second select transistor includes a stripe pattern of the stacked film having an insulator film 375 extending in the first direction, a polysilicon layer 363*p*, and an insulator film 376, and a columnar polysilicon layer 345*p* formed on both sidewalls of the stacked film in the second direction through gate insulator films 333. A plurality of the polysilicon layers 345*p* is intermittently aligned in the first direction in contact with the gate insulator films 333, and arranged in a matrix two-dimensionally. A polysilicon layer 346*p* higher in the impurity concentration than the polysilicon layer 345*p* is formed on top of the polysilicon layer 345*p*, and an insulator film 356 is embedded in one sidewall of the polysilicon layer 345*p* where the polysilicon layer 363*p* is not formed.

The pattern of the polysilicon layer 363*p* is present not immediately above the polysilicon layer 362*p*, but immediately above a region in which the polysilicon layer 362*p* is patterned and removed. A lower portion of the polysilicon layer 343p is electrically connected to an n-type polysilicon layer 342p configuring a conductive path of the memory cell. An upper portion of the polysilicon layer 343p is electrically connected with the polysilicon layer 344p doped with the n-type impurities with a high concentration. A lower portion of the polysilicon layer 345p is electrically connected to the n-type polysilicon layer 344p, and an upper portion of the polysilicon layer 345p is electrically connected with the polysilicon layer 346p doped with the n-type impurities (for example, As (arsenic)) with a high concentration.

Because the polysilicon layers 362p and 363p extend in the first direction, as illustrated in FIG. 2, the polysilicon layers 362p and 363p are formed even immediately below the regions between the respective bit line 303 (refer to FIG. 25). On the contrary, the polysilicon layers 343p, 345p, and the polysilicon layers 344p, 346p illustrated in FIG. 25 are present only immediately below the bit line 303, but are not formed immediately below the regions between the respective bit lines 303 (refer to FIG. 25) as illustrated in FIG. 26, and are isolated from each other in the first direction.

As illustrated in FIG. 25, the stripe pattern extending in the first direction and formed of the stacked film of an insulator film 311, a polysilicon layer 321p, an insulator film 312, a polysilicon layer 322p, an insulator film 313, a polysilicon layer 323p, an insulator film 314, a polysilicon layer 324p, and an insulator film 315 stacked on the insulator film 372 in order is formed in a region where the plurality of memory cells is formed.

Line portions (pattern portions) of the stripe pattern of the stacked film including the polysilicon layers 321p, 322p, 323p, 324p, and the insulator films 311, 312, 313, 314, 315 are arranged immediately below the respective polysilicon layers 362p and 363p. Space portions of the stripes between the stacked films are arranged immediately below the respective polysilicon layers 343p and 345p. The bit line 303 is a conductive film formed on the insulator film 376 and the polysilicon layer 345p and having a strip shape extending in the second direction.

A gate insulator film 309 having a stacked structure of a silicon oxide/silicon nitride film/silicon oxide, and a polysilicon layer 308p are formed in order on each sidewall of the stacked film including the polysilicon layers 321p, 322p, 323p, 324p, and the insulator films 311, 312, 313, 314, 315. The gate insulator film 309 is illustrated as a single layer of insulator film in FIG. 25. However, in fact, the gate insulator film 309 is an ONO (oxide-nitride-oxide) film having two silicon oxides, and a silicon nitride film which is a charge storage film formed therebetween.

As illustrated in FIG. 26, the polysilicon layer 308p is removed in the space portions of the stacked film and immediately below the space portions of the bit line 303. Also, the polysilicon layers 343p, 344p, 345p, and 346p forming channels and diffusion layers of the first select transistor and the second select transistor on top of the polysilicon layer 308p are removed. Also, the polysilicon layers 341p and 342p forming a channel and a diffusion layer of the select transistor arranged on the source electrode side, that is, at the bottom of the plurality of memory cells are removed.

As illustrated in FIG. 25, a semiconductor layer that is a part of the polysilicon layer 308p, and functions as the channel region is formed on each of the facing sidewalls of the adjacent stacked films. The polysilicon layer 308p is a semiconductor layer continuously formed on the inner walls and the bottom surface of the groove between the adjacent stacked films, and is U-shaped in a cross-section along the extending direction (the second direction) of the bit line 303. Therefore, the polysilicon layer 308p includes the respective semiconductor layers formed on the facing sidewalls of the adjacent stacked films, and the respective semiconductor layers are connected in parallel to each other between the polysilicon layer 323p and the source electrode 302. The polysilicon layer 306p and the polysilicon layer 341p are interposed between the semiconductor layer and the source electrode 302.

That is, the first select transistor and the source electrode 302 are electrically connected to each other by parallel connection layers (polysilicon layer 308p) including the above respective semiconductor layers formed on the facing sidewalls of the adjacent stacked films.

That is, the source electrode 302 and the bit line 303 are electrically connected to each other by the polysilicon layers 341p and 343p connected in series with each other, and the semiconductor layer formed on one of the facing sidewalls of the adjacent stacked films, and also electrically connected to each other through the polysilicon layers 341p and 343p connected in series with each other and the semiconductor layer formed on the other of the facing sidewalls of the adjacent stacked films.

Subsequently, a description will be given of the configuration of a region outside of the memory cell array not illustrated in FIGS. 25 and 26. A contact plug that connects the source electrode 302 and the field effect transistor formed on the semiconductor substrate 1 (not shown) is formed at the bottom of the source electrode 302. Also, a contact plug that connects the bit line 303 and the field effect transistor formed on the semiconductor substrate 1 (not shown) is formed at the bottom of the bit line 303.

The gate line for feeding a current to the polysilicon layers 361p, 362p, and 363p, which are the gate lines of the respective select transistors extends in the first direction on an upper layer of the memory cell array. The other plural gate lines extending in the first direction are formed in the same layer of the above gate line. The bit line 303 is a metal wire for selecting the vertical flash memory.

The above gate line and the other plural gate lines are connected to the peripheral circuits formed on the semiconductor substrate 1 (not shown) through the contact plug. In the respective stripe patterns of the polysilicon layers 321p to 324p, the respective patterns arranged alternately in the second direction are electrically connected integrally in the respective layers. That is, for example, the respective polysilicon layers 321p adjacent to each other in the second direction are not electrically connected to each other. The respective polysilicon layers 321p to 324p are electrically connected to the above-mentioned other plural gate lines through the contact plugs. On the other hand, each of the plurality of polysilicon layers 361p, 362p, and 363p is connected to a different line so that an independent voltage can be applied to each polysilicon layer.

Subsequently, a description will be given of a relationship of voltages of the respective lines when conducting the program operation, the erase operation, and the read operation of the vertical flash memory according to a modified example of this embodiment with reference to FIG. 27. As described above, an independent voltage is applied to each of the polysilicon layers 161p and 162p of the first select transistor and the second select transistor so that the first select transistor and the second select transistor can be controlled, separately.

0/0/1V written close to the terminal of the bit line BL1 represents voltages to be applied to the bit line BL1 in the program operation, the erase operation, and the read operation, respectively. Likewise, the notations of the voltages of the other terminals in FIG. 27 also represent the voltages to be applied in the program operation, the erase operation, and the read operation in order with the separators of "/".

Figure 27:
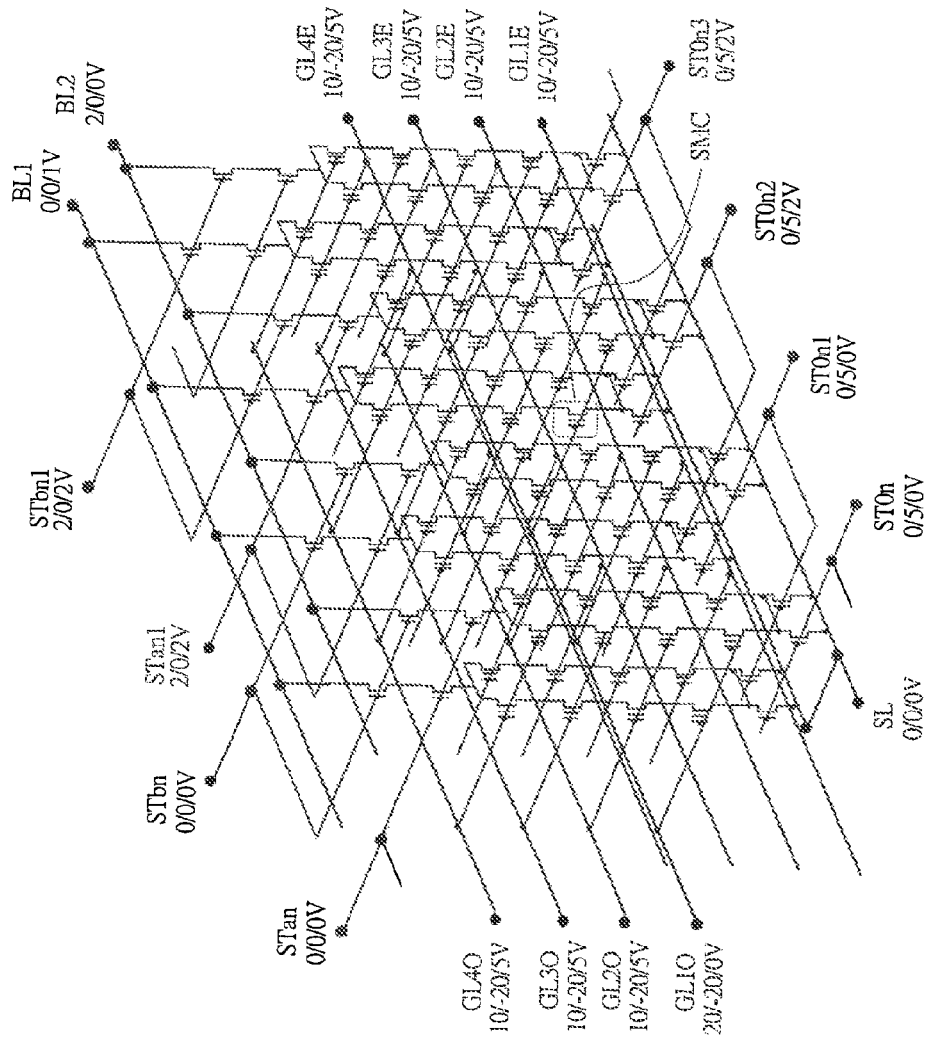
FIG. 27 is an equivalent circuit diagram illustrating the operation of the vertical flash memory according to the modified example of the first embodiment of this invention.

As illustrated in FIG. 27, in the program operation of the vertical flash memory, 2V is applied to the line STan1 which is a gate line of the first select transistor connected to the select cell SMC indicated by a dashed line, and 0V is applied to the lines STan of the other first select transistors. Also, 2V is applied to the line STbn1 of the second select transistor connected to the select cell SMC, and 0V is applied to the lines STbn of the other second select transistors. When the voltage is thus applied, only one portion of the plurality of two-layer select transistors aligned in the direction along the bit line, which are the two-layer select transistors having the polysilicon layers 362p and 363p illustrated in FIG. 25 as the gates, can be turned on. In the program operation, 0V is applied to the line ST0n which is the gate line of the select transistor on the source side illustrated in FIG. 27 to turn off the channel. Also, in the read operation, 2V is applied to the lines ST0n2 and ST0n3 so that the two-layer select transistors on the bit line side turn on, and the select transistor on the source side connected to the select cell SMC also turns on.

In the program operation, a high voltage of about 20V is applied to the line GL1O which is a gate line of the select cell, and an applied voltage of the lines GL2O to GL4O and GL1E to GL4E which are the other gate lines is set to about 10V to turn on the channel. In this situation, electrons are trapped in a silicon nitride film which is a charge storage layer within the gate insulator film 309 (refer to FIG. 25), to thereby program in the select cell SMC.

In the read operation, 0V is applied to the line GL1O which is a gate line of the select cell SMC, and an applied voltage of the other lines GL2O to GL4O and GL1E to GL4E is set to about 5V to turn on the channel. As a result, it is decided whether a threshold value of the select cell is higher than 0V, or not, to determine recorded information.

In the erase operation, a voltage of about −20V is applied to all of the gates to conduct the erase operation on all of the cells within the array in a lump. Because the erase operation is conducted in a lump, there is no need to apply a voltage different from that of the other lines to only the line connected to the select cell SMC in the erase operation. In this situation, electrons implanted into the charge storage layer of each memory cell are gone, to thereby reset the information in the respective memory cells.

In this embodiment, as described above, in the memory cell array in which a plurality of vertical unit cells each having the plurality of memory cells is arranged in a matrix, because the respective unit cells can be selected and operated by the two-layer select transistors, individually, the capacity of the memory can be increased, and the performance of the non-volatile storage device can be improved. The same is applied to each of the vertical chain memory, the vertical cross-point memory, and the vertical flash memory.

Also, in each of the vertical chain memory, the vertical cross-point memory, and the vertical flash memory, two lines each having the plurality of memory cells connected in series are disposed within the unit cell formed in each of the grooves between the stripe patterns of the stacked films of the insulator films and the gate lines. In this case, as compared with a case in which only one line of the plural memory cells connected in series is formed in each of the plurality of holes formed in the stacked film having the insulator films and the gate line in a matrix as in the non-volatile semiconductor device disclosed in, for example, PTL 2, the storage capacity per a unit area of the non-volatile storage device can be increased twice to threefold.

That is, in any memory cell according to this embodiment, the plurality of stacked films is disposed in the second direction, but each memory cell has no stacked structure in the first direction, and the width in the first direction can be easily reduced. On the contrary, in the memory having only one line of the memory cells within each unit cell, it is conceivable that an annular stacked film is configured within each hole in a plane configuration as disclosed in PTL 2. In this case, it is relatively difficult to reduce the respective memory cells in each of the first direction along the main surface of the semiconductor substrate and the second direction orthogonal to the first direction. Therefore, it is conceivable that the non-volatile storage device approaches the limit of the miniaturization, and an increase in the storage capacity is difficult in the near future. Also, in the non-volatile storage device according to this embodiment, two lines of the memory cells are formed within the unit cell so that the storage capacity can be increased more than that when only one line of the memory cells is formed.

Also, in the non-volatile storage device according to this embodiment, there is a possibility that the number of stacks is increased as compared with the memory in which only one line of the memory cells is formed within each unit cell in a manufacture process. However, because there is a possibility that the number of memory cells formed per a unit area can be increased as compared with the memory in which only one line of the memory cells is formed within each unit cell, a fabrication process per a unit memory cell can be decreased. Accordingly, because the number of processes in the vertical chain memory, the vertical cross-point memory, or the vertical flash memory can be reduced, a recording density can be further improved to reduce the bit costs.

Second Embodiment

This embodiment exemplifies a configuration and a production method of the two-layer select transistors having another structure different from that of the non-volatile storage device according to the above embodiment.

Hereinafter, a description will be given of a method of producing the non-volatile storage device in which the two-layer select transistors according to this embodiment are applied to the vertical chain memory with reference to FIGS. 28 to 38. The two-layer select transistors described in this embodiment can be applied to the vertical cross-point memory or the vertical flash memory as in the above first embodiment.

Figure 28:
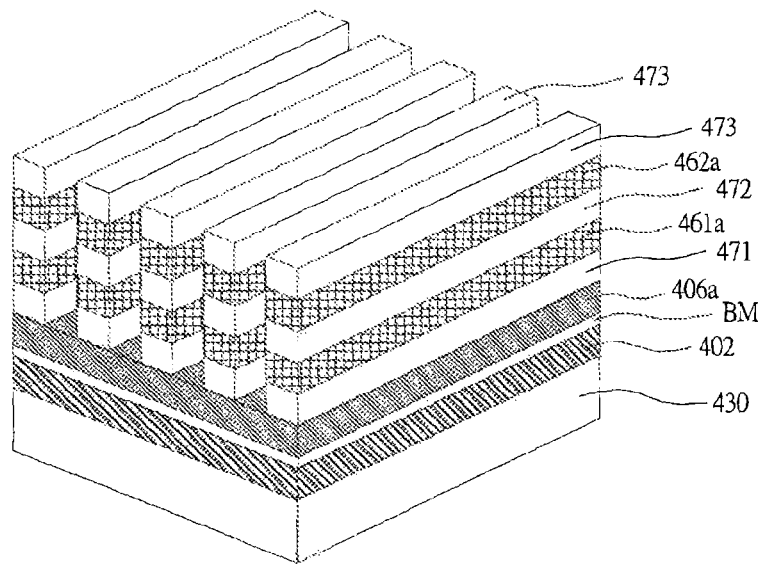
FIG. 28 is a bird's eye view illustrating a method of producing a vertical chain memory according to a second embodiment of this invention.
Figure 35:
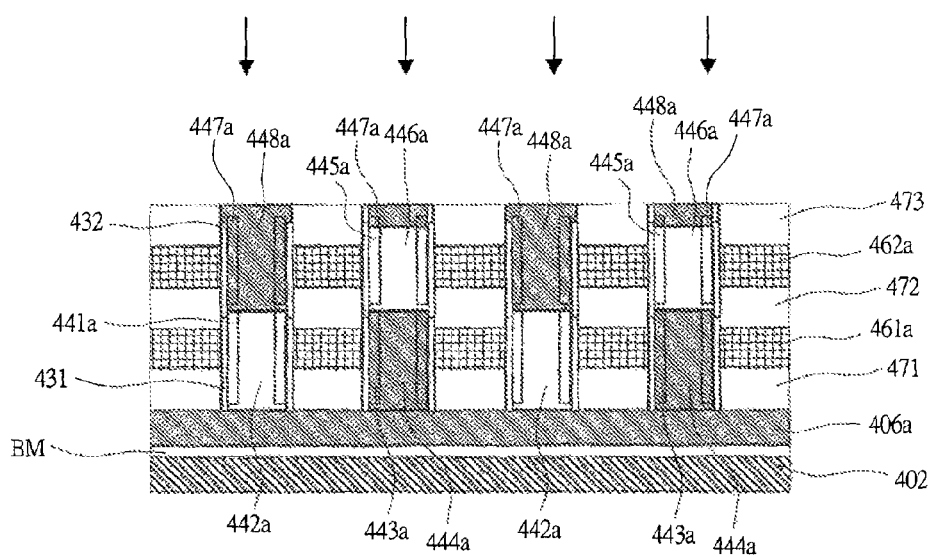
FIG. 35 is a cross-sectional view illustrating the method of producing the vertical chain memory subsequent to FIG. 34.
Figure 36:
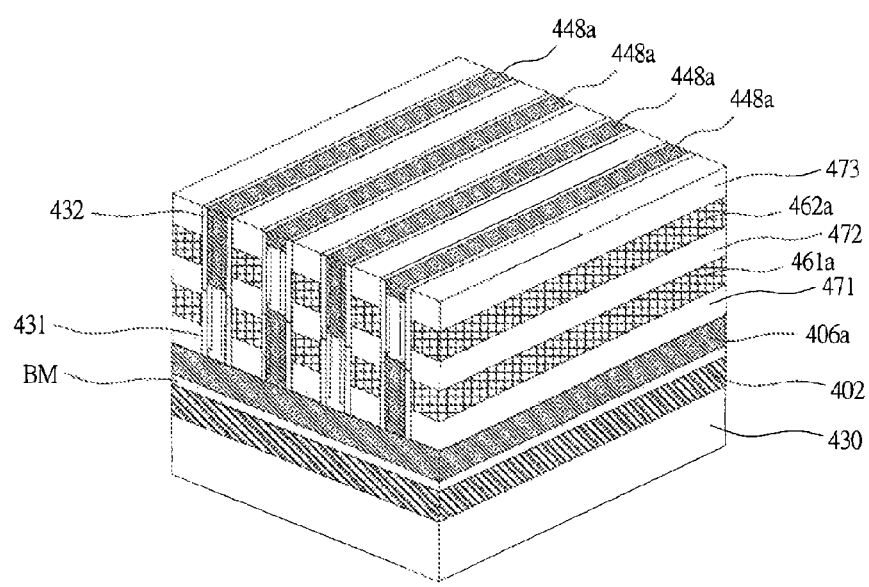
FIG. 36 is a bird's eye view illustrating the method of producing the vertical chain memory subsequent to FIG. 35.
Figure 37:
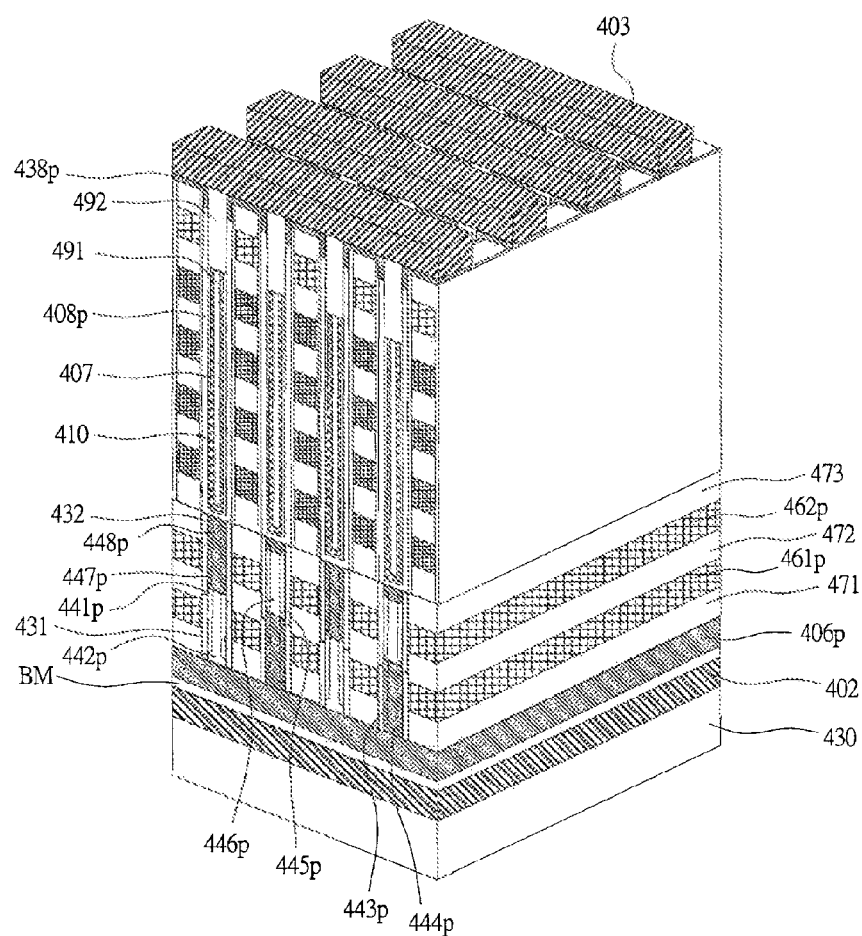
FIG. 37 is a bird's eye view illustrating the method of producing the vertical chain memory subsequent to FIG. 36.

FIGS. 28, 36, and 37 are bird's eye views illustrating a non-volatile storage device according to this embodiment in a manufacture process. Also, FIGS. 29 to 35 are cross-sectional views of the non-volatile storage device according to this embodiment in the manufacture process.

First, as illustrated in FIG. 28, an interpoly dielectric film 430, a source electrode 402 formed of a tungsten film, a barrier metal layer BM made of TiN (titanium nitride), an amorphous silicon layer 406a doped with n-type impurities (for example, As (arsenic)), an insulator film 471, an amorphous silicon layer 461a, an insulator film 472, an amorphous silicon layer 462a, and an insulator film 473 are formed in turn through a CVD technique, on the semiconductor substrate 1 (not shown) in which the peripheral circuits and the contact plug of the source electrode are formed.

Thereafter, a stacked film including the insulator film 471, the amorphous silicon layer 461a, the insulator film 472, the amorphous silicon layer 462a, and the insulator film 473 is processing into a stripe pattern extending in the first direction through a photolithography or an etching technique.

The amorphous silicon layers 461a and 462a form the gates of the first select transistor and the second select transistor. However, unlike the first embodiment in which the respective gates of the first select transistor and the second select transistor are formed in different processes, the gates of two layers of select transistors are process in a self-aligning manner in a lump. Accordingly, the amorphous silicon layers 461a and 462a are formed at an overlap position two-dimensionally. That is, the amorphous silicon layer 462a is arranged immediately above the amorphous silicon layer 461a.

Figure 29:
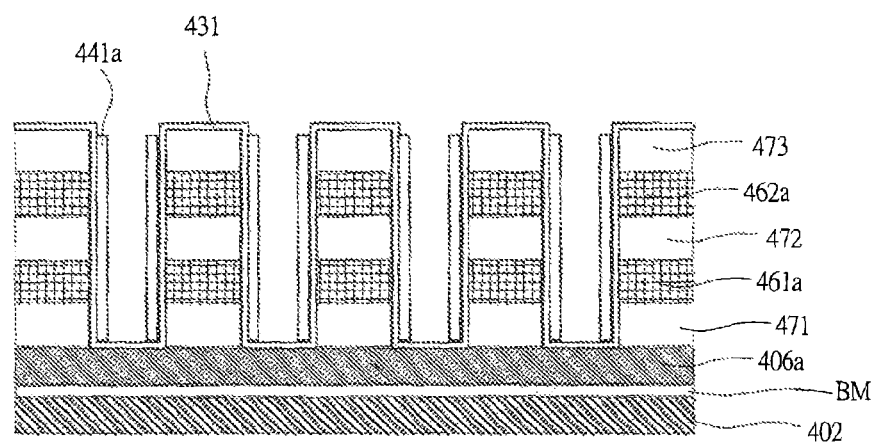
FIG. 29 is a cross-sectional view illustrating a method of producing the vertical chain memory subsequent to FIG. 28.

Then, as illustrated in FIG. 29, the insulator film 431 and an amorphous silicon layer 441a are so formed as not to completely be embedded in the grooves between the stripe patterns of the stacked films having the insulator film 471, the amorphous silicon layer 461a, the insulator film 472, the amorphous silicon layer 462a, and the insulator film 473, in order through the CVD technique. The insulator film 431 forms the gate insulator film of the first select transistor, and the amorphous silicon layer 441a forms a part of the first select transistor.

Thereafter, the amorphous silicon layer 441a on an upper surface of the insulator film 473, and the amorphous silicon layer 441a present on an upper surface of the amorphous silicon layer 406a are removed by etch-back. As a result, the amorphous silicon layer 441a remains only on the sidewall of the stacked film through the insulator film 431. In this situation, because the insulator film 431 formed on the sidewall of the stacked film is covered with the amorphous silicon layer 441a, the insulator film 431 can be prevented from being damaged when etching back for partially removing the amorphous silicon layer 441a. The same process can be applied to the two-layer select transistors of the first embodiment.

Figure 30:
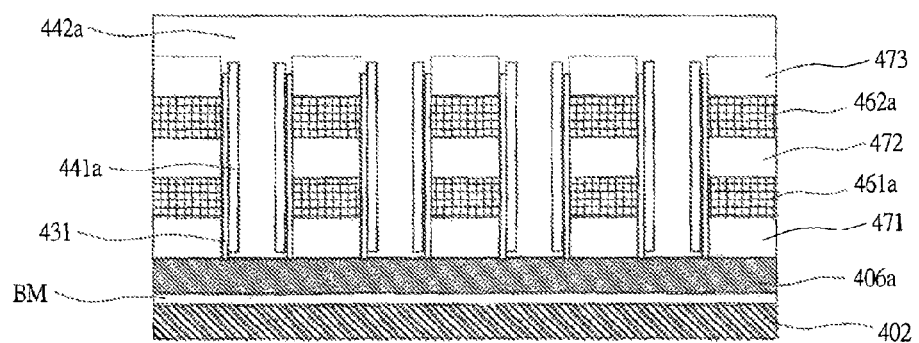
FIG. 30 is a cross-sectional view illustrating the method of producing the vertical chain memory subsequent to FIG. 29.

Then, as illustrated in FIG. 30, an exposed portion of the insulator film 431 is removed by wet etching to expose an upper surface of the amorphous silicon layer 406a. Thereafter, an amorphous silicon layer 442a is so formed as to be completely embedded in the respective stripe patterns formed of the stacked film through, for example, the CVD technique.

Figure 31:
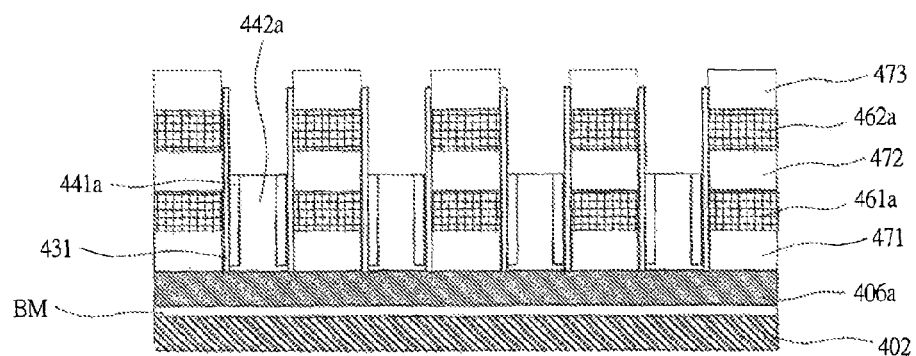
FIG. 31 is a cross-sectional view illustrating the method of producing the vertical chain memory subsequent to FIG. 30.

Then, as illustrated in FIG. 31, the amorphous silicon layers 441a and 442a are allowed to recede by etch-back, and the respective upper surfaces match a height of the insulator film 473. That is, the respective upper surface heights of the amorphous silicon layers 441a and 442a are located at a position higher than a lower surface of the insulator film 473 and lower than an upper surface of the insulator film 473 by etch-back.

Subsequently, as illustrated in FIG. 32, n-type impurities (for example, As (arsenic)) are implanted into the amorphous silicon layers 441a and 442a through an ion implanting technique using a photoresist film PR1. The ion implantation is alternately conducted on the patterns of the amorphous silicon layers 441a and 442a aligned in the second direction. That is, photo resist films PR1 are each formed on top of the amorphous silicon layers 441a and 442a at both sides of the amorphous silicon layer 441a and the amorphous silicon layer 442a adjacent to that layer, which are to be subjected to ion implantation, and the ion implantation is conducted in a state where the amorphous silicon layers 441a and 442a at both sides of the amorphous silicon layer 441a and 442a having upper surfaces covered with the photo resist films PR1 are exposed. The amorphous silicon layers 441a and 442a that have been subjected to the ion implantation become amorphous silicon layers 443a and 444a, respectively.

Figure 33:
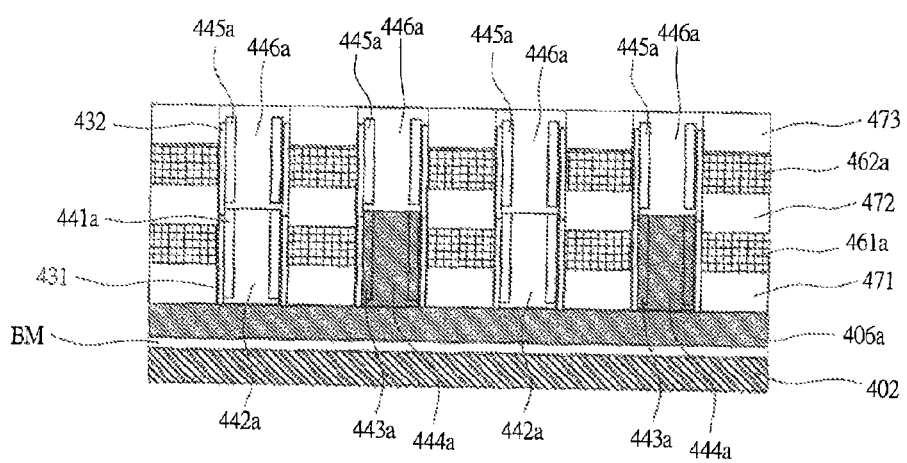
FIG. 33 is a cross-sectional view illustrating the method of producing the vertical chain memory subsequent to FIG. 32.

Then, as illustrated in FIG. 33, after the photo resist films PR1 have been removed, a pattern formed of amorphous silicon layers 445a and 446a is formed on each of the amorphous silicon layers 441a to 444a between the respective stripe patterns formed of the above stacked film in the same processes as those in FIGS. 29 to 58. In this situation, the upper surface of the insulator film 473 is exposed to form the pattern formed of the amorphous silicon layers 445a and 446a as the stripe pattern extending in the first direction, and isolate the respective patterns.

Figure 34:
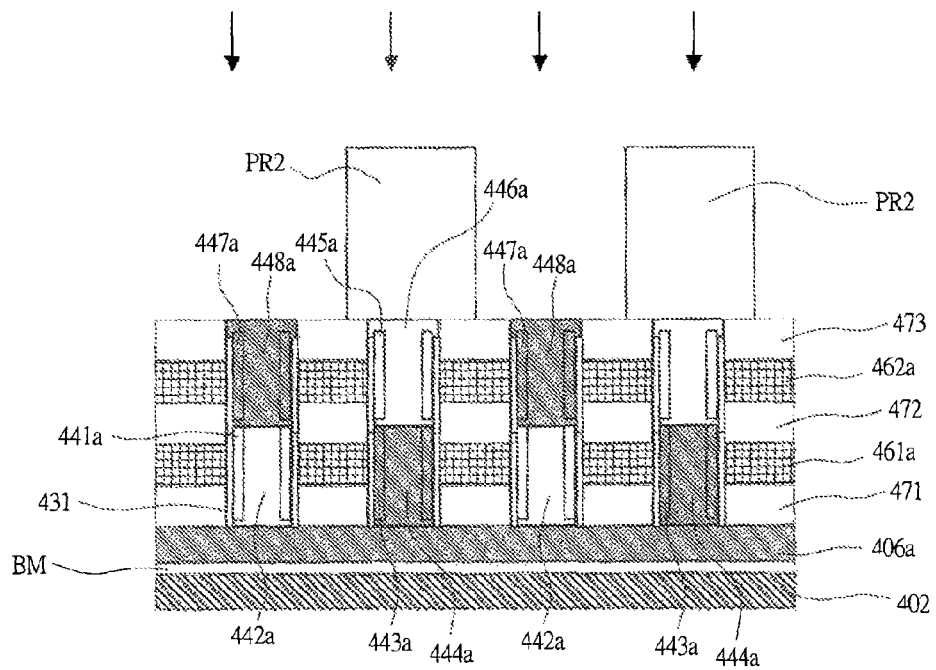
FIG. 34 is a cross-sectional view illustrating the method of producing the vertical chain memory subsequent to FIG. 33.

Then, as illustrated in FIG. 34, n-type impurities (for example, (arsenic)) are implanted on the amorphous silicon layers 445a and 446a through the ion implanting technique using photoresist films PR2. This ion implantation is alternately conducted on the patterns formed of the amorphous silicon layers 445a and 446a which are aligned in the stripes in the second direction, in the same manner as the method described with reference to FIG. 32. The implantation is conducted on the amorphous silicon layers 445a and 446a immediately above the amorphous silicon layers 441a and 442a which have not been subjected to the ion implantation in the process of FIG. 32. The amorphous silicon layers 445a and 446a that have been subjected to the ion implantation become amorphous silicon layers 447a and 448a, respectively.

Therefore, in comparison between the pattern formed of the amorphous silicon layers 441a and 442a, and the pattern formed of the amorphous silicon layers 443a and 444a, which are adjacent to each other in the second direction, the pattern formed of the amorphous silicon layers 443a and 444a is higher in the impurity concentration. Also, in comparison between the amorphous silicon layers 447a and 448a immediately above the pattern formed of the amorphous silicon layers 441a and 442a, and the amorphous silicon layers 445a and 446a immediately above the pattern formed of the amorphous silicon layers 443a and 444a, the amorphous silicon layers 447a and 448a are higher in the impurity concentration.

Subsequently, as illustrated in FIG. 35, after the photoresist film PR2 has been removed, the ion implantation is conducted without use of a mask, and n-type impurities (for example, As (arsenic)) are implanted into upper surfaces of the amorphous silicon layers 445a, 446a, 447a, and 448a. As a result, the amorphous silicon layers 447a and 448a, which are semiconductor regions higher in the impurity concentration than the amorphous silicon layers 445a and 446a, are also formed on top of the amorphous silicon layers 445a and 446a, respectively. In this case, a height of the bottom surface of the amorphous silicon layers 447a and 448a formed on top of the amorphous silicon layers 445a and 446a in the process described with reference to FIG. 35 is positioned in a region higher than a height of an upper surface of the amorphous silicon layer 462a.

FIG. 36 illustrates a bird's eye view of the non-volatile storage device during a manufacturing process after the ion implantation described in FIG. 35.

Then, through the same process as the process described in FIGS. 15 to 20 in the first embodiment, a plurality of memory cells illustrated in FIG. 37 is formed on top of a structure illustrated in FIG. 35. That is, the vertical chain memory is formed on the two-layer select transistors, and a metal film that forms bit lines 403 is formed into a plate on top thereof. Through annealing during the process, the amorphous silicon layers 441a, 442a, 443a, 444a, 445a, 446a, 447a, and 448a illustrated in FIG. 35 become polysilicon layers 441p, 442p, 443p, 444p, 445p, 446p, 447p, and 448p illustrated in FIG. 37, respectively. In this state, those polysilicon patterns extend in the first direction which is the extending direction of the polysilicon layers 461p and 462p.

Thereafter, the plate-like metal film is processed into stripes extending in the second direction with the use of a mask, to process films including an n-type polysilicon layer 438p, an insulator film 492, a polysilicon layer 408p, an insulator film 410, a phase change material layer 407, and an insulator film 491, and polysilicon layer polysilicon layers 441p, 442p, 443p, 444p, 445p, 446p, 447p, and 448p immediately below the respective strip patterns. As a result, a part of an upper surface of the polysilicon layer 406p is exposed to form the bit lines 403 of a strip shape which are formed of the plate-like metal film, to form the two-layer select transistors which are the feature of this embodiment. That is, the n-type polysilicon layer 438p, the insulator film 492, the polysilicon layer 408p, the insulator film 410, the phase change material layer 407, the insulator film 491, and the polysilicon layer polysilicon layers 441p to 448p immediately below the regions between the respective bit lines formed into the strips extending in the second direction are removed.

That is, the polysilicon layers 421p, 422p, 423p, 424p, 463p, the insulator films 411, 412, 413, 414, 415, and the insulator film 109, and the insulator film 109 immediately below the pattern of the bit lines 403 remain without being processed. On the other hand, the polysilicon layer 408p, the polysilicon layers 438p, the phase change material 407, the insulator film 410, and the polysilicon layers 441p to 448p immediately below between the respective bit lines 403 are removed. As a result, the polysilicon layers 441p to 448p are intermittently aligned in the first direction in plural number.

In the above removing process, the channel polysilicon of the two-layer select transistors which is a lower layer of the memory cell portion is processed with the use of the mask in a lump at the time of processing the channel polysilicon in the memory cell portion and the phase change material layer. As a result, the number of masks and the number of processes are reduced, thereby being capable of realizing a reduction in the manufacture costs. This method can be applied to the two-layer select transistors of the first embodiment. Also, this embodiment can be applied to the vertical cross-point memory and the vertical flash memory.

Thereafter, polysilicon on memory cell array ends is processed to form contacts with the respective layers as in the first embodiment, and in the process described in FIG. 37, the entire device including the memory cell array processed in the stripes in the process described in FIG. 37 is embedded with the interpoly dielectric film. That is, a contact plug extended to the polysilicon layers 421p to 424p, a contact plug extended to the polysilicon layer 463p, and a contact plug extended to the polysilicon layers 461p and 462p are formed. Also, a contact plug that connects the plurality of gate lines and the plurality of gate lines to the peripheral circuits is formed to complete the non-volatile storage device illustrated in FIG. 38.

Figure 38:
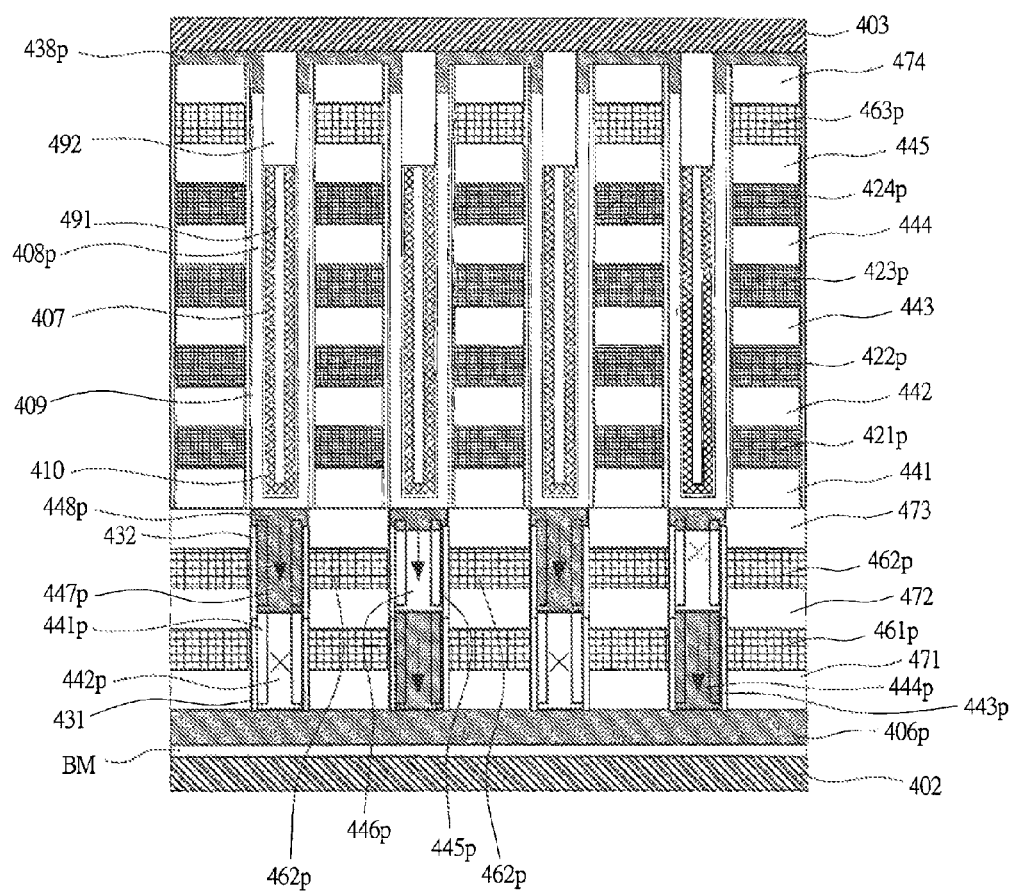
FIG. 38 is a cross-sectional view of the vertical chain memory according to the second embodiment of this invention.

As illustrated in FIG. 38, the polysilicon layer 462p is formed immediately above the polysilicon layer 461p, and the polysilicon layer 461p and the polysilicon layer 462p are formed at an overlap position two-dimensionally. One sidewall of the polysilicon layer 461p that functions as the gate electrode in the second direction is formed with the polysilicon layers 441p and 442p through the insulator films 431. The other sidewall is formed with the polysilicon layers 443p and 444p through the insulator films 431. Likewise, one sidewall of the polysilicon layer 462p that functions as the gate electrode in the second direction is formed with the polysilicon layers 445p and 446p through the insulator films 432. The other sidewall is formed with the polysilicon layers 447p and 448p through the insulator films 432.

That is, the respective both sidewalls of a semiconductor layer formed of the polysilicon layers 441p and 442p, and a semiconductor layer formed of the polysilicon layers 443p and 444p are formed with the polysilicon layers 461p through the insulator films 431. Also, the respective both sidewalls of a semiconductor layer formed of the polysilicon layers 445p and 446p, and a semiconductor layer formed of the polysilicon layers 447p and 448p are formed with the polysilicon layers 462p through the insulator films 432.

The adjacent polysilicon layers 461p and 441p configure the first select transistor, and the adjacent polysilicon layers 462p and 442p configure the second select transistor.

The polysilicon layer 444p on one sidewall of the polysilicon layer 461p in the second direction is higher in the impurity concentration than the polysilicon layer 442p on the other sidewall of the polysilicon layer 446p and the polysilicon layer 461p immediately above the polysilicon layer 461p in the second direction. Also, the polysilicon layer 448p on one sidewall of the polysilicon layer 462p in the second direction is higher in the impurity concentration than the polysilicon layer 446p on the other sidewall of the polysilicon layer 442p and the polysilicon layer 462p immediately below the polysilicon layer 462p in the second direction.

That is, the polysilicon layers 447p and 448p relatively low in the impurity concentration are formed immediately above the semiconductor layer formed of the polysilicon layers 443p and 444p relatively high in the impurity concentration. The polysilicon layers 441p and 442p relatively low in the impurity concentration are formed immediately below the semiconductor layer formed of the polysilicon layers 447p and 448p relatively high in the impurity concentration.

For example, in the plurality of channel layers in the first select transistor, when odd-numbered channel layers starting from an end of the memory array in the second direction have a relatively low impurity concentration, even-numbered channel layers starting from the end in the second direction have a relatively high impurity concentration.

Subsequently, a description will be given of the operation of the vertical chain memory having the two-layer select transistors according to this embodiment with reference to FIG. 38. In this embodiment, the first select transistor includes a pattern formed of the polysilicon layers 441p to 444p, and the polysilicon layer 461p adjacent to a sidewall of that pattern through the insulator film 431. Also, in this embodiment, the second select transistor includes a pattern formed of the amorphous silicon layers 445p to 448p, and the polysilicon layer 461p adjacent to a sidewall of that pattern through the insulator film 432. The two-layer select transistors are of a stacked structure of the first select transistor and the second select transistor.

In the two-layer select transistors according to this embodiment, one of the respective channels of the first select transistor and the second select transistor, which are adjacent to each other in the second direction, is doped with the n-type impurities with a high concentration, and therefore is always kept on regardless of the gate voltage. In FIG. 38, the channels of an on-state are indicated by the same down arrows as a direction of current, and channels of an off-state are indicated by a mark X. Therefore, the channels doped with the n-type impurities with a relatively high concentration are indicated by the arrows regardless of the gate voltage, and are in a current conductive state.

The two-layer select transistors become on only when both channels of the first select transistor and the second select transistor immediately above the first select transistor become on. In the two-layer select transistors illustrated in FIG. 38, the two-layer select transistors become on at only a portion in which both of the two layer channels connected in series are indicated by the arrows. In this example, an on-voltage is applied to the gates (polysilicon layers 462p on both sides of the polysilicon layers 445p and 445p illustrated in FIG. 38) arranged on both sides of the channel to be turned on, and an off-voltage is applied to the other gates, thereby being capable of turning on the channel of the two-layer select transistors at only one portion in one bit line. Therefore, the same advantages as those in the first embodiment are obtained, a reduction in the capacity due to multi-selection in PTL 4 can be avoided, and the storage capacity of the non-volatile storage device can be increased.

Also, in this embodiment, as in the first embodiment, the two-layer select transistors can be applied to the vertical chain memory, the vertical cross-point memory, and the vertical flash memory, thereby being capable of further improving an in-plane recording density, and also effectively reducing the bit costs.

Also, in this embodiment, as illustrated in FIG. 29, the amorphous silicon layer 441a is formed on the surface of the insulator film 431 that functions as the gate insulator film of the first select transistor. Even if the amorphous silicon layer 441a is not formed, the channel region can be formed within the grooves by the amorphous silicon layer 442a formed in FIG. 30. With the formation of the amorphous silicon layer 441a, the insulator film 431 can be prevented from being damaged in the etching process of the amorphous silicon layer 441a in FIG. 29, and the reliability of the non-volatile storage device can be improved.

Third Embodiment

This embodiment exemplifies a configuration and a production method of the two-layer select transistors different from those in the first embodiment and the second embodiment. In this example, the production method when the two-layer select transistors are applied to the vertical chain memory will be described with reference to FIGS. 39 to 49. However, as in the first embodiment and the second embodiment, the two-layer select transistors can be applied to the vertical cross-point memory and the vertical flash memory.

FIGS. 39 to 47 are cross-sectional views of the non-volatile storage device according to this embodiment during the manufacturing process. Also, FIG. 48 is a bird's eye view of the non-volatile storage device according to this embodiment during the manufacturing process.

Figure 39:
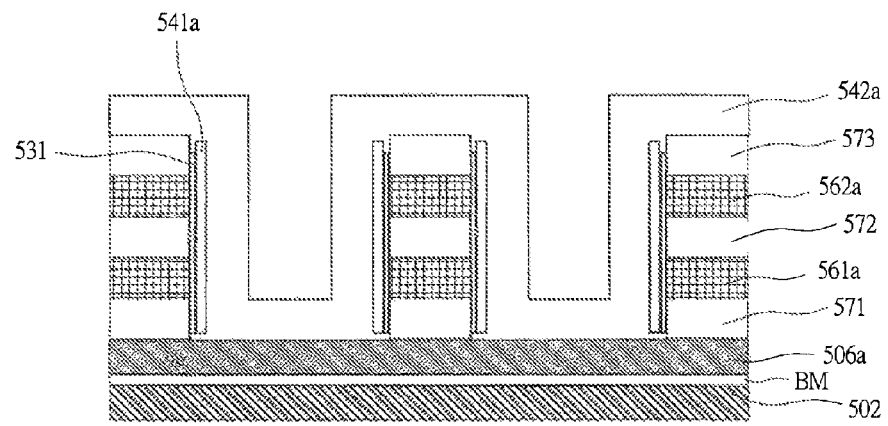
FIG. 39 is a cross-sectional view illustrating a method of producing a vertical chain memory according to a third embodiment of this invention.

First, the processes till the process of FIG. 29 described in the second embodiment are conducted in the same manner as that in the second embodiment. Thereafter, as illustrated in FIG. 39, the insulator film 531 (corresponding to the insulator film 431 in FIG. 29) exposed from the amorphous silicon layer 541 (corresponding to the amorphous silicon layer 441a in FIG. 29) is removed through an etching technique. Thereafter, an amorphous silicon layer 542a is formed (deposited) on the overall main surface of the semiconductor substrate 1 (not shown) through, for example, the CVD technique. In this case, the amorphous silicon layer 542a is a stacked film formed of an insulator film 571, an amorphous silicon layer 561a, an insulator film 572, an amorphous silicon layer 562a, and an insulator film 573, which are stacked on the amorphous silicon layer 506a in order, and is so formed as not to be completely embedded in the grooves between the respective stripe patterns extending in the first direction.

Figure 40:
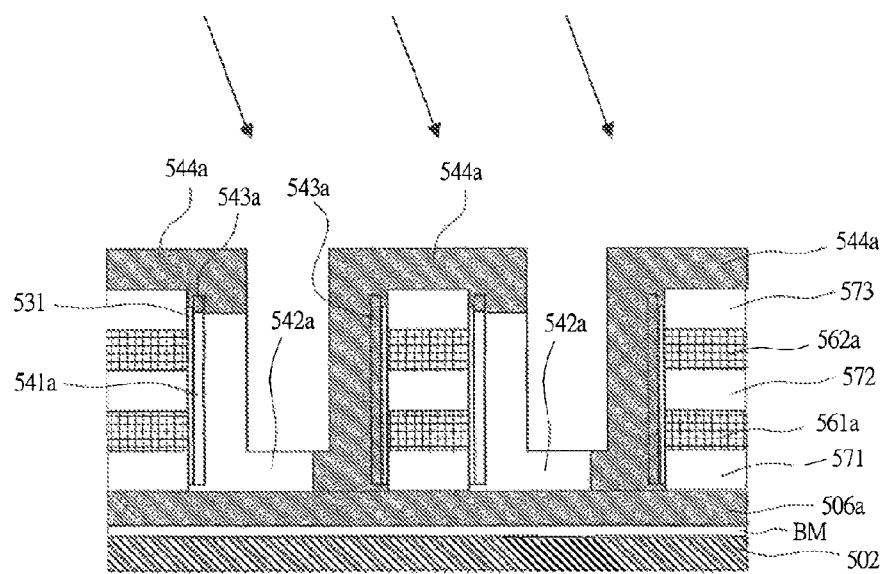
FIG. 40 is a cross-sectional view illustrating the method of producing the vertical chain memory subsequent to FIG. 39.

Then, as illustrated in FIG. 40, the implantation of the n-type impurities (for example, As (arsenic)) is conducted on the amorphous silicon layers 541a and 542a through an oblique ion implanting technique. In this situation, in the amorphous silicon layers 541a and 542a formed through the insulator films 531 on both sidewalls of the pattern of the stacked film formed of the insulator films 571 to 573, and the amorphous silicon layers 561a, 562a, the overall amorphous silicon layers 541a and 542a formed on one sidewall thereof are doped. The amorphous silicon layers 541a and 542a into which ions have been implanted become amorphous silicon layers 543a and 544a, respectively.

The amorphous silicon layers 543a and 544a are higher in the impurity concentration than the amorphous silicon layers 541a and 542a that are formed on the opposite sides of the amorphous silicon layers 543a and 544a with the stacked film interposed therebetween and have hardly been doped with the impurities by the oblique ion implantation. In this case, a device enabling the oblique ion implantation is required. Unlike the ion implanting technique in FIGS. 32 and 35 in the second embodiment, since there is no need to conduct the ion implantation with the use of a photoresist film as a mask, the number of masks and the number of processes can be reduced.

It is desirable that the impurities are not introduced by the oblique ion implantation into the amorphous silicon layers 541a and 542a formed on one sidewall opposite to the other sidewall on which the amorphous silicon layer 543a is formed, which are the sidewalls of the amorphous silicon layers 561a and 562a. The amorphous silicon layer 544a in which the impurities are introduced in a region lower than an upper surface of the insulator film 573 and higher than an upper surface of the amorphous silicon layer 562a, and the impurities having a relatively high concentration are introduced, is formed on top of the amorphous silicon layers 541a and 542a.

Figure 41:
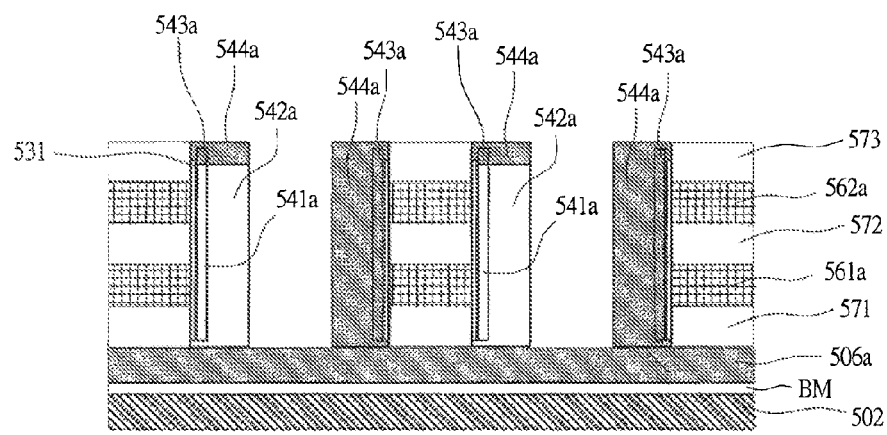
FIG. 41 is a cross-sectional view illustrating the method of producing the vertical chain memory subsequent to FIG. 40.

Then, as illustrated in FIG. 41, the amorphous silicon layer 544a on the insulator film 573 and the amorphous silicon layer 544a on the amorphous silicon layer 506a are removed by etch-back to expose the respective upper surfaces of the insulator film 573 and the amorphous silicon layer 506a.

Figure 42:
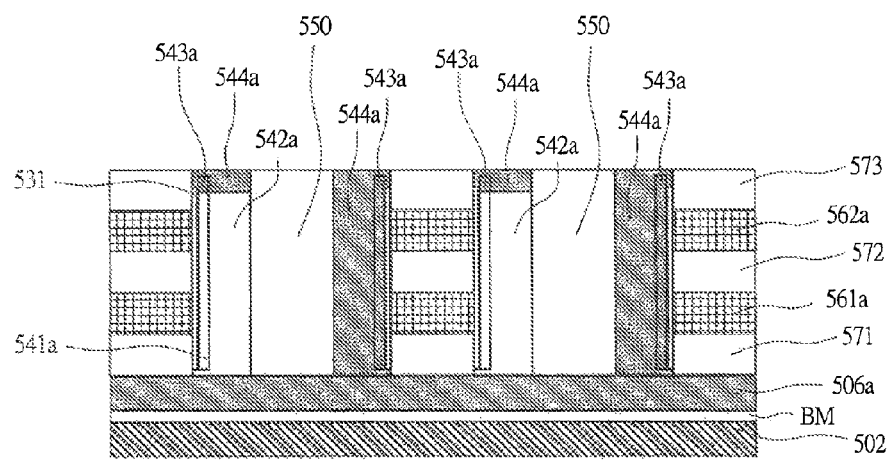
FIG. 42 is a cross-sectional view illustrating the method of producing the vertical chain memory subsequent to FIG. 41.
Figure 43:
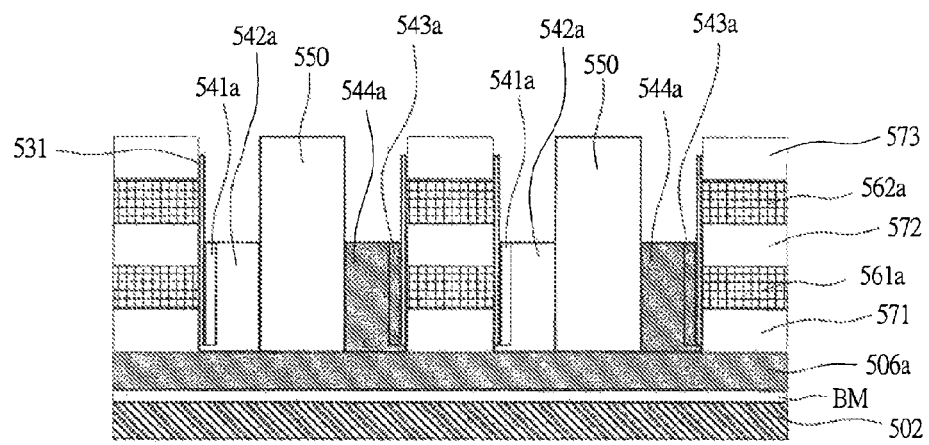
FIG. 43 is a cross-sectional view illustrating the method of producing the vertical chain memory subsequent to FIG. 42.

Then, as illustrated in FIG. 42, after an insulator film 550 has been so formed as to be completely embedded in the grooves through, for example, the CVD technique, an upper portion of the insulator film 550 is removed by etch-back to expose an upper surface of the amorphous silicon layer 544a.

Then, as illustrated in FIG. 42, the amorphous silicon layers 543a, 544a, 542a, and 541a recede due to etching, and a height of the respective upper surfaces of the amorphous silicon layers 541a to 544a becomes made identical with a height of the insulator film 572. That is, the height of the respective upper surfaces of the amorphous silicon layers 541a to 544a are substantially identical with each other, and formed at a position lower than the lower surface of the amorphous silicon layer 562a but higher than the upper surface of the amorphous silicon layer 561a.

Figure 44:
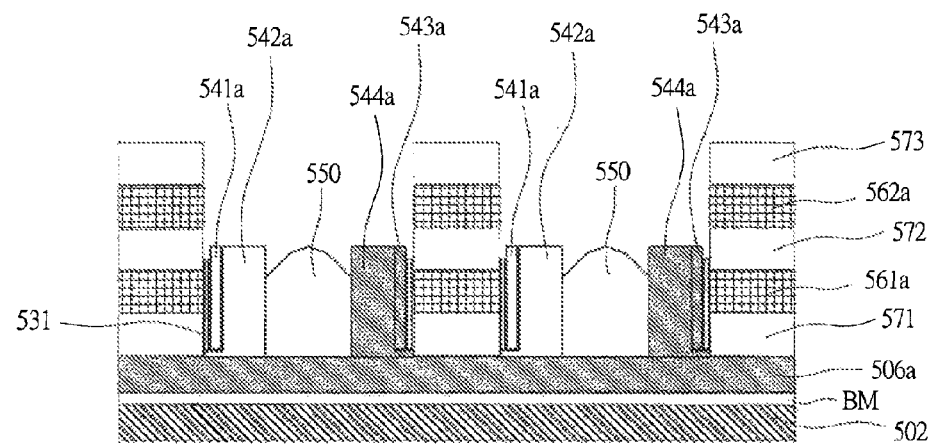
FIG. 44 is a cross-sectional view illustrating the method of producing the vertical chain memory subsequent to FIG. 43.

Then, as illustrated in FIG. 44, the upper surfaces of the insulator films 531 and 550 recede due to the wet etching. In this situation, a height of the respective upper surfaces of the insulator films 531 and 550 becomes made substantially identical with a height of the respective upper surfaces of the amorphous silicon layers 541a to 544a. It is conceivable that the upper surface of the insulator film 550 becomes parabolic, that is, a center portion of the upper surface is higher in level than end portions thereof in the second direction.

Figure 45:
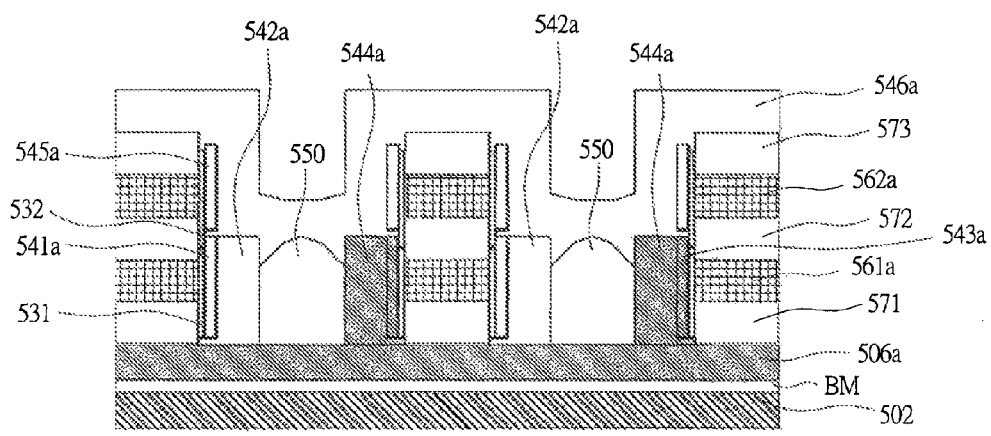
FIG. 45 is a cross-sectional view illustrating the method of producing the vertical chain memory subsequent to FIG. 44.

Then, as illustrated in FIG. 45, the same process as the process described with reference to FIG. 39 is conducted to form amorphous silicon layers 545a on the sidewalls of the stacked film through the insulator film 532. That is, after the insulator films 532 and the amorphous silicon layers 545a have been so formed as not to completely be embedded in the groves, the amorphous silicon layers 545a on the upper surface of the insulator films 532 are formed, and the amorphous silicon layers 545a remain on only the sidewalls of the stacked films. Subsequently, the insulator films 532 exposed from the amorphous silicon layers 545a are removed by the wet etching so that the insulator films 532 remain on only sidewalls of the stacked films. In this situation, as in the second embodiment, because the insulator films 532 are covered with the amorphous silicon layers 545a, the insulator films 532 can be prevented from being damaged when partially removing the amorphous silicon layers 545a.

The insulator film 532 forms a gate insulator film of the second select transistor, and the amorphous silicon layer 545a forms apart of the channel of the first select transistor.

Thereafter, the amorphous silicon layer 546a is formed on the overall main surface of the semiconductor substrate 1 (not shown) so as not to be completely embedded in the grooves through, for example, the CVD technique.

Figure 46:
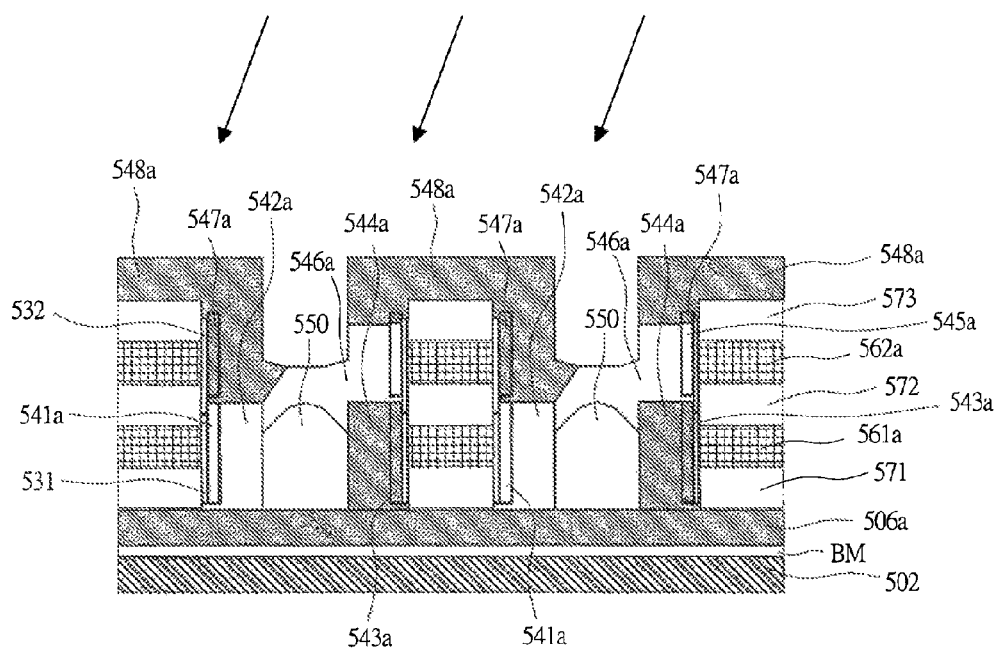
FIG. 46 is a cross-sectional view illustrating the method of producing the vertical chain memory subsequent to FIG. 45.

Subsequently, as illustrated in FIG. 46, the implantation of the n-type impurities (for example, As (arsenic)) is conducted on the amorphous silicon layers 545a and 546a through the oblique ion implanting technique. In the amorphous silicon layers 545a and 546a formed through the insulator films 532 on both sidewalls of the pattern of the stacked film formed of the insulator films 571 to 573, and the amorphous silicon layers 561a, 562a, the overall the amorphous silicon layers 545a and 546a formed on one sidewall are doped. In this situation, the ion implantation is conducted obliquely in a direction opposite to that in FIG. 40. That is, the ion implantation is conducted in a direction having a symmetrical relationship to a direction of the ion implantation described in FIG. 40 with respect to a surface perpendicular to the main surface of the semiconductor substrate 1 (not shown) which is a surface along the first direction.

The amorphous silicon layers 545a and 546a in the region where ions are implanted become respective amorphous silicon layers 547a and 548a. As in the process of FIG. 40, a device enabling the oblique ion implantation is required. Unlike the ion implantation in FIGS. 32 and 35 in the second embodiment, since there is no need to conduct the ion implantation with the formation of a photoresist film, the number of masks and the number of processes can be reduced.

In this example, in the amorphous silicon layers 545a and 546a immediately above the amorphous silicon layers 543a and 544a into which the impurities are introduced in the process described with reference to FIG. 40, the n-type impurities are not introduced into the amorphous silicon layers 545a and 546a having the same height as that of the amorphous silicon layer 562a. Also, in the amorphous silicon layers 545a and 546a on top of the amorphous silicon layers 541a and 542a into which the impurities are not introduced in the process described with reference to FIG. 40, the n-type impurities are introduced into the amorphous silicon layers 545a and 546a having the same height as that of the amorphous silicon layer 562a to form the respective amorphous silicon layers 547a and 548a formed of the amorphous silicon layers 545a and 546a.

That is, the amorphous silicon layers 545a and 546a are formed on the amorphous silicon layers 543a and 544a higher in the n-type impurity concentration than the amorphous silicon layers 541a and 542a, respectively. The amorphous silicon layers 547a and 548a higher in the n-type impurity concentration than the amorphous silicon layers 545a and 546a are formed on the amorphous silicon layers 541a and 542a, respectively. The amorphous silicon layers 541a and 542a are formed through the insulator film 531 on one sidewall of the amorphous silicon layer 561a, and the amorphous silicon layers 543a and 544a are formed through the insulator film 531 on the other sidewall of the amorphous silicon layer 561a. Also, the amorphous silicon layers 545a and 546a are formed through the insulator film 532 on one sidewall of the amorphous silicon layer 562a, and the amorphous silicon layers 547a and 548a are formed through the insulator film 532 on the other sidewall of the amorphous silicon layer 562a.

It is desirable that the upper portions of the amorphous silicon layers 545a and 546a immediately above the amorphous silicon layers 543a and 544a, which are the uppermost portion within a region higher than the upper surface of the amorphous silicon layer 562a, but lower than the upper surface of the insulator film 573, are doped with the impurities by the oblique ion implantation to form the amorphous silicon layers 547a and 548a.

Figure 47:
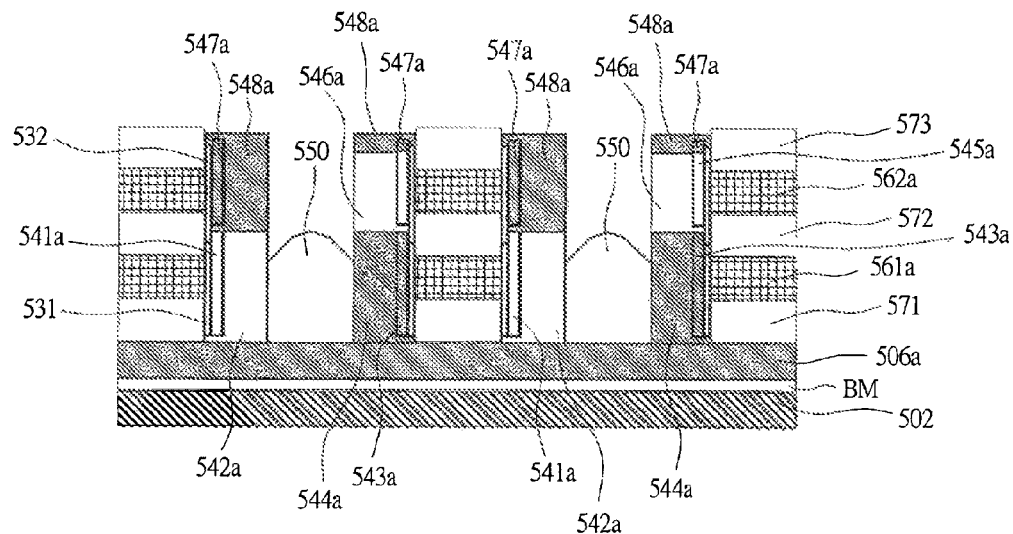
FIG. 47 is a cross-sectional view illustrating the method of producing the vertical chain memory subsequent to FIG. 46.
Figure 48:
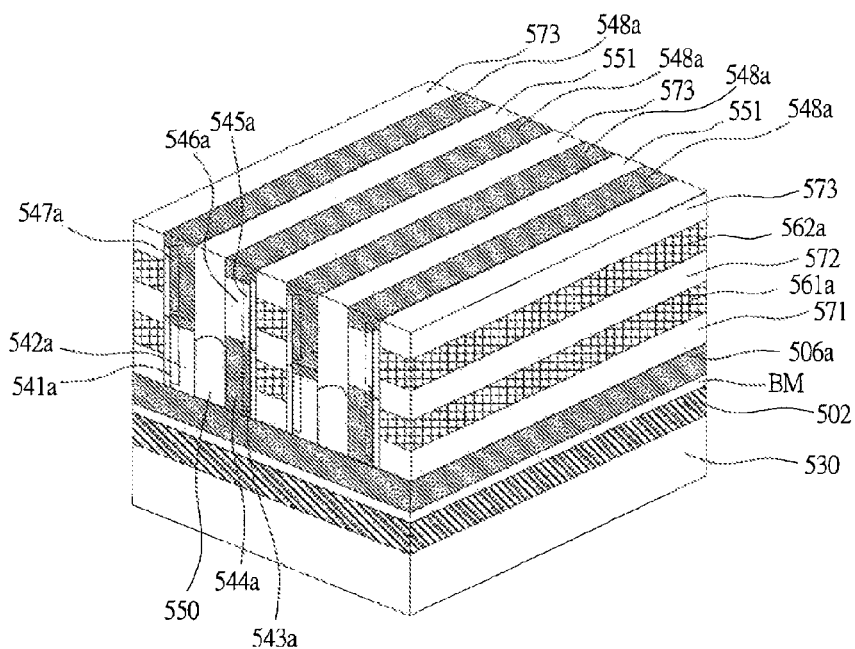
FIG. 48 is a bird's eye view illustrating the method of producing the vertical chain memory subsequent to FIG. 47.

Then, as illustrated in FIG. 47, the amorphous silicon layer 548a on the insulator film 573 and the amorphous silicon layer 546a on the insulator film 550 are removed by etchback.

Then, as illustrated in FIG. 48, an insulator film 551 is so formed as to be completely embedded in the grooves through, for example, the CVD technique. Then, the upper portion of the insulator film 551 is removed by the CMP technique or the etch-back to expose the respective upper surfaces of the amorphous silicon layer 548a and the insulator film 573.

Figure 49:
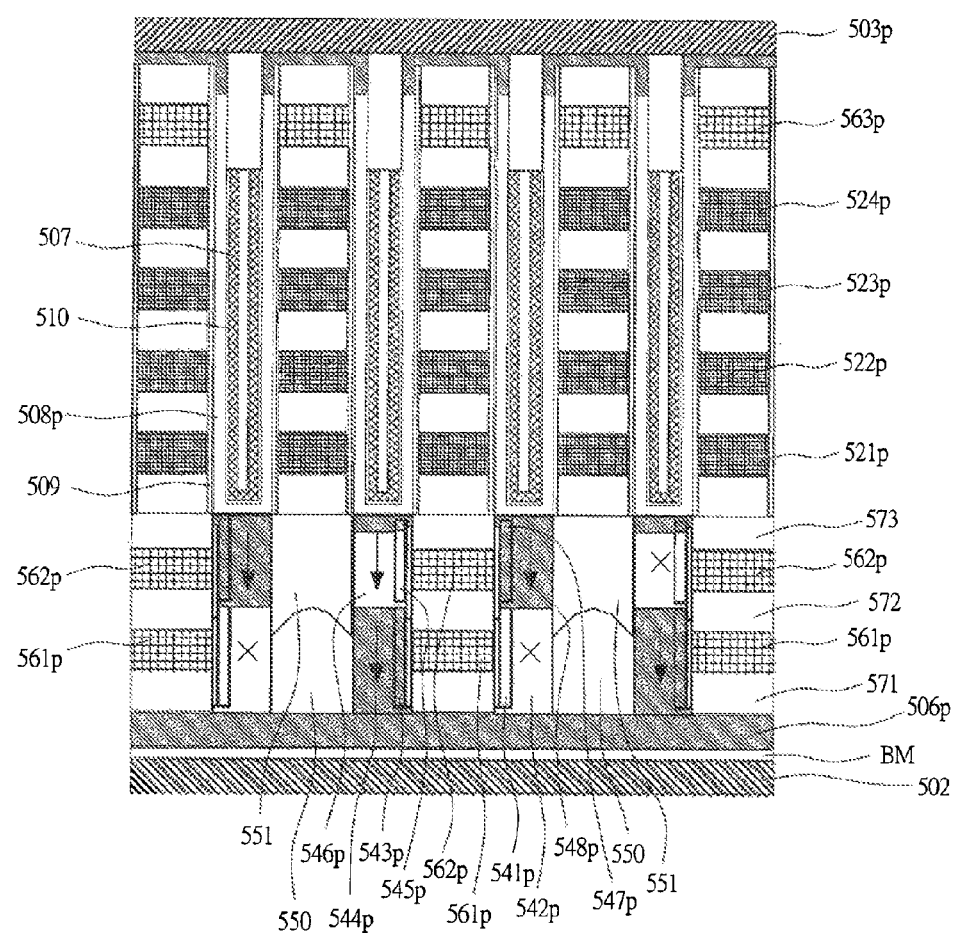
FIG. 49 is a cross-sectional view illustrating the vertical chain memory according to the third embodiment of this invention.

Thereafter, through the same process as that in FIG. 37 in the second embodiment, the vertical chain memory using the two-layer select transistors illustrated in FIG. 49 as a select element is completed.

As in the second embodiment, in the two-layer select transistors according to this embodiment, the channels of the two-layer select transistors are processed together with the bit line process, and the number of masks and the number of processes are reduced.

As illustrated in FIG. 49, the polysilicon layer 562p is formed immediately above the polysilicon layer 561p, and the polysilicon layer 561p and the polysilicon layer 562p are formed at an overlap position two-dimensionally. The polysilicon layers 541p and 542p are formed through the insulator film 531 on one sidewall of the polysilicon layer 561p functioning as the gate electrode in the second direction, and the polysilicon layers 543p and 544p are formed through the insulator film 531 on the other sidewall thereof. Likewise, the polysilicon layers 545p and 546p are formed through the insulator film 532 on one sidewall of the polysilicon layer 562p functioning as the gate electrode in the second direction, and the polysilicon layers 547p and 548p are formed through the insulator film 532 on the other sidewall thereof.

The polysilicon layer 561p is not formed on both sides of the semiconductor layer formed of the polysilicon layers 541p and 542p, but the polysilicon layer 561p is formed through the insulator film 531 on one sidewall of the semiconductor layer formed of the polysilicon layers 541p and 542p in the second direction, which is a sidewall on which the polysilicon layer 541p is formed. The insulator film 550 is formed on the other sidewall of the semiconductor layer. Likewise, the polysilicon layer 561p is formed through the insulator film 531 on one sidewall of the semiconductor layer formed of the polysilicon layers 543p and 544p in the second direction, which is a sidewall on which the polysilicon layer 543p is formed. The insulator film 550 is formed on the other sidewall of the semiconductor layer.

Likewise, the polysilicon layer 562p is formed through the insulator film 532 on one sidewall of the semiconductor layer formed of the polysilicon layers 545p and 546p in the second direction, which is a sidewall on which the polysilicon layer 545p is formed. The insulator film 551 is formed on the other sidewall of the semiconductor layer. Also, the polysilicon layer 562p is formed through the insulator film 532 on one sidewall of the semiconductor layer formed of the polysilicon layers 547p and 548p in the second direction, which is a sidewall on which the polysilicon layer 547p is formed. The insulator film 551 is formed on the other sidewall of the semiconductor layer.

That is, two columnar semiconductor layers isolated from each other are formed between the adjacent polysilicon layers 561p in the second direction, or between the adjacent polysilicon layers 562p, and only an insulator film is formed between those two semiconductor layers.

The adjacent polysilicon layers 561p and 541p configure the first select transistor, and the adjacent polysilicon layers 562p and 546p configure the second select transistor.

The polysilicon layer 544p on one sidewall of the polysilicon layer 561p in the second direction is higher in the impurity concentration than the polysilicon layer 542p on the other side of the polysilicon layer 546p and the polysilicon layer 561p immediately above the polysilicon layer 544p in the second direction. Also, the polysilicon layer 548p on one sidewall of the polysilicon layer 562p in the second direction is higher in the impurity concentration than the polysilicon layer 546p on the other side of the polysilicon layer 542p and the polysilicon layer 562p immediately above the polysilicon layer 548p in the second direction.

That is, the polysilicon layers 547p and 548p having the relatively low impurity concentration are formed immediately above the semiconductor layer formed of the polysilicon layers 543p and 544p having the relatively high impurity concentration, and the polysilicon layers 541p and 542p having the relatively low impurity concentration are formed immediately below the semiconductor layer formed of the polysilicon layers 547p and 548p having the relatively high impurity concentration.

For example, in the plurality of channel layers in the first select transistor, when odd-numbered channel layers starting from an end of the memory array in the second direction have a relatively low impurity concentration, even-numbered channel layers starting from the end in the second direction have a relatively high impurity concentration.

Subsequently, a description will be given of the operation of the vertical chain memory having the two-layer select transistors according to this embodiment with reference to FIG. 49. The operation of the two-layer select transistors according to this embodiment is substantially identical with that of the two-layer select transistors in the second embodiment. In this embodiment, the first select transistor includes a pattern formed of the polysilicon layers 541p to 544p, and the polysilicon layer 561p adjacent to a sidewall of that pattern through the insulator film 531. Also, in this embodiment, the second select transistor includes a pattern formed of the amorphous silicon layers 545p to 548p, and the polysilicon layer 561p adjacent to a sidewall of that pattern through the insulator film 532. The two-layer select transistors are of a stacked structure of the first select transistor and the second select transistor.

In the channels of the plurality of first select transistors aligned in the second direction, one of the adjacent channels is doped with the n-type impurities with a relatively high concentration, and therefore is always kept on regardless of the gate voltage. In FIG. 49, the channels of an on-state are indicated by the same down arrows as a direction of current, and channels of an off-state are indicated by a mark X. That is, the channel doped with the n-type impurities is indicated by the arrow regardless of the gate voltage, and allows a current to flow therein. The two-layer select transistors become on only when both channels of the first select transistor and the second select transistor by the arrow become on. In FIG. 49, the two-layer select transistors become on at only a portion in which both of the channels of two upper and lower layers connected in series are indicated by the arrows.

An on-voltage is applied to the gates (polysilicon layers 562p adjacent to the polysilicon layers 545a and 546a indicated by the arrow in FIG. 49) adjacent through the gate insulator film to the channel to be turned on (the polysilicon layers 545a and 546a indicated by the arrows in FIG. 49), and an off-voltage is applied to the other gates, thereby being capable of turning on the channel of the two-layer select transistors at only one portion for one bit line 503. Therefore, the same advantages as those in the first embodiment are obtained, a reduction in the capacity due to multi-selection in PTL 4 can be avoided, and the storage capacity of the non-volatile storage device can be increased.

Also, in this embodiment, as in the first embodiment and the second embodiment, the two-layer select transistors can be applied to the vertical chain memory, the vertical cross-point memory, and the vertical flash memory, thereby being capable of further improving an in-plane recording density, and also effectively reducing the bit costs.

Also, in this embodiment, as in the second embodiment, as illustrated in FIG. 39, the amorphous silicon layer 541a is formed on the surface of the insulator film 531 that functions as the gate insulator film of the first select transistor. As a result, the insulator film 531 can be prevented from being damaged in the etching process of the amorphous silicon layer 541a, and the reliability of the non-volatile storage device can be improved.

The invention made by the present inventors has been described above in detail on the basis of the embodiments, however, this invention is not limited to the embodiment, and can be variously changed without departing from the spirit of the invention.

For example, in the first to third embodiments, the description has been made assuming that the polysilicon layer that conducts the gate operation and the channels forming source/drain paths are made of polysilicon. However, the material of the polysilicon layer is not restricted, but this invention can be realized by application of the semiconductor material that can conduct the gate operation. Also, the material of the conductive layer functioning as the gate may be, for example, a metal film.

Further, in the first to third embodiments, for facilitation of the description, expressions such as the word lines and the bit lines are used. Those lines are select lines used for selecting one vertical chain memory. Therefore, a positional relationship may be vertically inverted. Also, it is needless to say that there is no need to connect a read circuit such as a sense amplifier to the bit line side.

INDUSTRIAL APPLICABILITY

The method of producing the non-volatile storage device according to this invention is extensively used for the non-volatile storage device having the vertical transistor that selects the memory cells.

LIST OF REFERENCE SIGNS 1, semiconductor substrate
102, source electrode
103, bit line
106a, amorphous silicon layer
106p, polysilicon layer
107, phase change material layer
108p, channel polysilicon layer
109 to 115, insulator film 121p to 124p, polysilicon layer
122p to 124p, polysilicon layer
130, interpoly dielectric film
131 to 133, insulator film
138p, polysilicon layer
141a to 144a, amorphous silicon layer
141p to 144p, polysilicon layer
151 to 154, insulator film
161a, amorphous silicon layer
161p, polysilicon layer
162a, amorphous silicon layer
162p, polysilicon layer
163a, amorphous silicon layer
163p, polysilicon layer
171 to 175, insulator film
191, insulator film
192, insulator film
202, source electrode
204, metal electrode
206p, polysilicon layer
207, phase change material layer
210, insulator film
211 to 215, insulator film
221 to 224, electrode layer
230 to 233, insulator film
240p to 244p, polysilicon layer
250p, polysilicon layer
251 to 253, insulator film
260p to 262p, polysilicon layer
271 to 274, insulator film
302, source electrode
303, bit line
306p, polysilicon layer
308p, channel polysilicon layer
309, gate insulator film
311 to 315, insulator film
321p to 324p, polysilicon layer
331 to 333, gate insulator film
341p to 346p, polysilicon layer
354, insulator film
356, insulator film
360p to 363p, polysilicon layer
371 to 376, insulator film
403, bit line
406a, amorphous silicon layer
406p, polysilicon layer
407, phase change material layer
408p, channel polysilicon layer
410, insulator film
411, insulator film
421p to 424p, polysilicon layer
430, interpoly dielectric film
431, insulator film
432, insulator film
438p, polysilicon layer
441a to 448a, amorphous silicon layer
441p to 448p, polysilicon layer
461a, amorphous silicon layer
461p, polysilicon layer
462a, amorphous silicon layer
462b, polysilicon layer
463p, polysilicon layer
471 to 473, insulator film
491, insulator film
492, insulator film
503, bit line
506a, amorphous silicon layer
531, insulator film
532, insulator film
541a to 548a, amorphous silicon layer
541p to 544p, polysilicon layer
550, insulator film
551, insulator film
561a, amorphous silicon layer
561p, polysilicon layer
562a, amorphous silicon layer
571 to 573, insulator film
BL1 to BL4, bit line
BLC, contact plug
BM, barrier metal layer
C1, contact plug
C2, contact plug
DIF, diffusion layer
GATE, gate electrode
GBL, global bit line
GBLC, contact plug
CL1 to CL4, line
GL10, line
GL20 to GL40, line
GOX, gate insulator film
ILD3 to ILD6, interpoly dielectric film
M1, line layer
M2, line layer
MA, memory cell array
ML1E, line
ML1O, line
ML2O, line
ML4E, line
PR1, photoresist film
PR2, photoresist film
SMC, select cell
ST0n, select transistor
ST0n2, line
STa1 to ST1n, line
STa2, line
STa3, line
STb1, line
STan, line
STan1, line
STb1, line
STbn, line
STbn1, line
STcE, line
STcO, line
STI, element isolation layer
USMC, unselected cell
USMC1 to USMC3, unselected cell
WL1, word line

The invention claimed is:

1. A method of producing a non-volatile storage device, comprising the steps of:
   (a) forming, on a first conductive layer formed on a semiconductor substrate, a first select transistor including a first channel layer electrically connected to the first conductive layer, and a first gate line formed on a sidewall of the first channel layer through a first insulator film, and extended in a first direction along a main surface of the semiconductor substrate;
   (b) forming, on the first channel layer, a second select transistor including a second channel layer electrically connected to the first channel layer, and a second gate line formed on a sidewall of the second channel layer through a second insulator film, and extended in the first direction;

(c) forming a first stacked film on the second select transistor by alternately stacking (N+1) (N is an integer of N≧1) third insulator films and the N first semiconductor layers;

(d) forming a plurality of first patterns aligned in a second direction orthogonal to the first direction and extended in the first direction by processing the first stacked film;

(e) forming a third channel layer and a memory material layer which are electrically connected to the second channel layer through a fourth insulting film on the respective sidewalls of the plurality of first patterns;

(f) exposing an upper surface of the third channel layer after a fifth insulator film is embedded between the plurality of adjacent first patterns; and (g) after the (f) step, forming, on the third channel layer, a plurality of lines electrically connected to the third channel layer, aligned in the first direction, and extending in the second direction, and then removing the third channel layer immediately below a region between the plurality of adjacent lines.

2. The method of producing a non-volatile storage device according to claim 1, wherein, in the step (a), the first channel layer is formed on both sidewalls of the first gate line in the second direction; and in the step (b), the second gate line is formed immediately above a region between the adjacent first gate lines, and the second channel layer is formed on both sidewalls of the second gate line in the second direction.

3. The method of producing a non-volatile storage device according to claim 1, wherein the step (a) comprises the steps of:

(a1) forming the first channel layer on both sidewalls of the first gate line in the second direction; and (a2) introducing impurities into the first channel layer on one sidewall of the first gate line by using the oblique ion implantation technique, and wherein the step (b) comprises the steps of:

(b1) forming the second channel layer on both sidewalls of the second gate line in the second direction; and (b2) introducing the impurities into the second channel layer adjacent to the second channel layer formed immediately above the first channel layer into which the impurities are introduced in the step (a2) by using the oblique ion implantation technique.

4. The method of producing a non-volatile storage device according to claim 1, wherein the step (a) comprises the steps of:

(a3) forming the first gate lines and the first channel layers alternately aligned in the second direction in plural number; and (a4) after covering an upper surface of the first channel layer formed on one sidewall of the first gate line in the second direction with a first mask, introducing impurities in the other first channel layer, and then removing the first mask, wherein the step (b) comprises the steps of:

(b3) alternately forming the second gate lines and the second channel layers in the second direction in plural number; and (b4) after covering an upper surface of the second channel layer formed immediately above the first channel layer into which the impurities are introduced in the step (a4) with a second mask, introducing impurities into the second channel layer not covered with the second mask, and then removing the second mask.

5. The method of producing a non-volatile storage device according to claim 1, wherein the memory material layer includes a phase change material.

6. The method of producing a non-volatile storage device according to claim 1, wherein the step (a) comprises the steps of:

(a5) forming a plurality of second patterns extended in the first direction, including the first gate line on the first conductive layer, to be aligned in the second direction; and (a6) after forming the second insulator film on the semiconductor substrate so as not be completely embedded in regions between the plurality of adjacent third patterns in the second direction, forming a fifth channel layer on the respective sidewalls of the plurality of third patterns through the second insulator film; and (b7) removing the second insulator film exposed from the fifth channel layer to expose an upper surface of the first channel layer.

7. The method of producing a non-volatile storage device according to claim 1, (c1) after the step (b) and before the step (c), further comprising the step of intermittently aligning a plurality of the first channel layers and a plurality of the second channel layers in the first direction.

8. The method of producing a non-volatile storage device according to claim 1, (g1) after the step (g), further comprising the step of removing the first channel layer and the second channel layer immediately below the regions between the plurality of adjacent lines to intermittently forming the first channel layers and the second channel layers in the first direction in plural number.

* * * * *